United States Patent
Kim et al.

(10) Patent No.: US 9,564,601 B2
(45) Date of Patent: Feb. 7, 2017

(54) CONDENSED-CYCLIC COMPOUND AND ORGANIC LIGHT-EMITTING DEVICE INCLUDING THE SAME

(71) Applicant: SAMSUNG DISPLAY CO., LTD., Yongin, Gyeonggi-Do (KR)

(72) Inventors: Soo-Yon Kim, Yongin (KR); Seok-Hwan Hwang, Yongin (KR); Young-Kook Kim, Yongin (KR); Hye-Jin Jung, Yongin (KR); Jun-Ha Park, Yongin (KR); Eun-Young Lee, Yongin (KR); Jong-Woo Kim, Yongin (KR); Jin-O Lim, Yongin (KR); Sang-Hyun Han, Yongin (KR); Kwang-Hyun Kim, Yongin (KR); Eun-Jae Jeong, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 353 days.

(21) Appl. No.: 14/258,297

(22) Filed: Apr. 22, 2014

(65) Prior Publication Data
US 2015/0048323 A1    Feb. 19, 2015

(30) Foreign Application Priority Data
Aug. 13, 2013  (KR) .................. 10-2013-0096187

(51) Int. Cl.
*H01L 51/00* (2006.01)
*H01L 51/50* (2006.01)
*C09K 11/06* (2006.01)

(52) U.S. Cl.
CPC ........... *H01L 51/0067* (2013.01); *C09K 11/06* (2013.01); *H01L 51/006* (2013.01);
(Continued)

(58) Field of Classification Search
CPC .............. H01L 51/006; H01L 51/0061; H01L 51/0067; H01L 51/0068; H01L 51/0072; H01L 51/0073; H01L 51/0094; H01L 51/5016; H01L 51/5088; C09K 11/06
See application file for complete search history.

(56) References Cited

U.S. PATENT DOCUMENTS

| 7,053,255 B2 | 5/2006 | Ikeda et al. |
| 7,233,019 B2 | 6/2007 | Ionkin et al. |
| 2005/0156164 A1 | 7/2005 | Sotoyama |

FOREIGN PATENT DOCUMENTS

| CN | 103589420 A | * | 2/2014 |
| CN | 103589421 A | * | 2/2014 |

(Continued)

*Primary Examiner* — Dawn Garrett
(74) *Attorney, Agent, or Firm* — Lee & Morse, P.C.

(57) ABSTRACT

A condensed-cyclic compound and an organic light-emitting device including the same, the compound being represented by Formula 1, below:

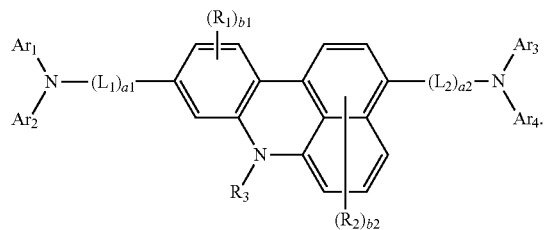

20 Claims, 1 Drawing Sheet

(52) U.S. Cl.
CPC ...... *H01L 51/0061* (2013.01); *H01L 51/0068* (2013.01); *H01L 51/0072* (2013.01); *H01L 51/0073* (2013.01); *H01L 51/0094* (2013.01); *H01L 51/5016* (2013.01); *H01L 51/5088* (2013.01)

(56) References Cited

FOREIGN PATENT DOCUMENTS

| | | | |
|---|---|---|---|
| CN | 103614133 A | * | 3/2014 |
| CN | 103614134 A | * | 3/2014 |
| CN | 103951694 A | * | 7/2014 |
| JP | 2006-151930 A | | 6/2006 |
| JP | 2007-119454 A | | 5/2007 |
| JP | 2007-123863 A | | 5/2007 |
| KR | 10-2006-0006760 A | | 1/2006 |
| KR | 10-2012-0081539 A | | 7/2012 |

* cited by examiner

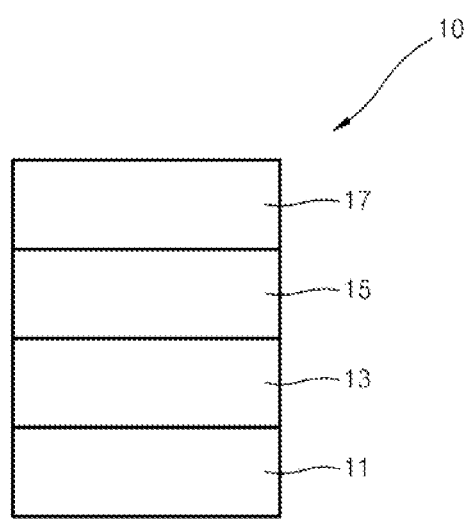

CONDENSED-CYCLIC COMPOUND AND ORGANIC LIGHT-EMITTING DEVICE INCLUDING THE SAME

CROSS-REFERENCE TO RELATED APPLICATION

Korean Patent Application No. 10-2013-0096187, filed on Aug. 13, 2013, in the Korean Intellectual Property Office, and entitled: "Condensed-Cyclic Compound and Organic Light-Emitting Device Including The Same," is incorporated by reference herein in its entirety.

BACKGROUND

1. Field

Embodiments relate to a condensed-cyclic compound for an organic light-emitting device and an organic light-emitting device including the same.

2. Description of the Related Art

Organic light-emitting devices (OLEDs), which are self-emitting devices, have advantages such as wide viewing angles, excellent contrast, quick response, high brightness, and excellent driving voltage characteristics, and may provide multicolored images.

SUMMARY

Embodiments are directed to a condensed-cyclic compound for an organic light-emitting device and an organic light-emitting device including the same.

According to one or more embodiments, a condensed-cyclic compound may be represented by Formula 1:

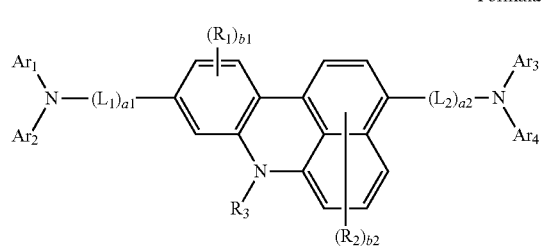

<Formula 1> wherein $L_1$ and $L_2$ are each independently selected from a substituted or unsubstituted $C_3$-$C_{10}$ cycloalkylene group, a substituted or unsubstituted $C_2$-$C_{10}$ heterocycloalkylene group, a substituted or unsubstituted $C_3$-$C_{10}$ cycloalkenylene group, a substituted or unsubstituted $C_2$-$C_{10}$ heterocycloalkenylene group, a substituted or unsubstituted $C_6$-$C_{60}$ arylene group, and a substituted or unsubstituted $C_2$-$C_{60}$ heteroarylene group;

a1 and a2 are each independently an integer of 0 to 3;

$Ar_1$ to $Ar_4$ are each independently selected from a substituted or unsubstituted $C_3$-$C_{10}$ cycloalkyl group, a substituted or unsubstituted $C_2$-$C_{10}$ heterocycloalkyl group, a substituted or unsubstituted $C_1$-$C_{10}$ cycloalkenyl group, a substituted or unsubstituted $C_2$-$C_{10}$ heterocycloalkenyl group, a substituted or unsubstituted $C_6$-$C_{60}$ aryl group, and a substituted or unsubstituted $C_2$-$C_{60}$ heteroaryl group;

$R_1$ to $R_3$ are each independently selected from a hydrogen atom, a deuterium atom, a halogen atom, a hydroxyl group, a cyano group, a nitro group, an amino group, an amidino group, a hydrazine group, a hydrazone group, a carboxylic acid group or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ heterocycloalkyl group, a substituted or unsubstituted $C_3$-$C_{10}$ cycloalkenyl group, a substituted or unsubstituted $C_3$-$C_{10}$ heterocycloalkenyl group, a substituted or unsubstituted $C_6$-$C_{10}$ aryl group, a substituted or unsubstituted $C_6$-$C_{60}$ aryloxy group, a substituted or unsubstituted $C_6$-$C_{60}$ arylthio group, and a substituted or unsubstituted $C_2$-$C_{60}$ heteroaryl group, —Si($Q_1$)($Q_2$)($Q_3$), and —N($Q_4$)($Q_5$), wherein $Q_1$ to $Q_5$ are each independently selected from a hydrogen atom, a $C_1$-$C_{60}$ alkyl group, a $C_1$-$C_{60}$ alkoxy group, a $C_6$-$C_{60}$ aryl group, and a $C_2$-$C_{60}$ heteroaryl group;

b1 is an integer of 1 to 3;

b2 is an integer of 1 to 5;

at least one substituent of the substituted $C_3$-$C_{10}$ cycloalkylene group, substituted $C_2$-$C_{10}$ heterocycloalkylene group, substituted $C_3$-$C_{10}$ cycloalkenylene group, substituted $C_2$-$C_{10}$ heterocycloalkenylene group, substituted $C_6$-$C_{60}$ arylene group, substituted $C_2$-$C_{60}$ heteroarylene group, substituted $C_3$-$C_{10}$ cycloalkyl group, substituted $C_2$-$C_{10}$ heterocycloalkyl group, substituted $C_3$-$C_{10}$ cycloalkenyl group, substituted $C_2$-$C_{10}$ heterocycloalkenyl group, substituted $C_6$-$C_{60}$ aryl group, substituted $C_2$-$C_{60}$ heteroaryl group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_6$-$C_{60}$ aryloxy group, and substituted $C_6$-$C_{60}$ arylthio group is selected from;

a deuterium atom, a halogen atom, a hydroxyl group, a cyano group, a nitro group, an amino group, an amidino group, a hydrazine group, a hydrazone group, a carboxylic acid group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one of a deuterium atom, a halogen atom, a hydroxyl group, a cyano group, a nitro group, an amino group, an amidino group, a hydrazine group, a hydrazone group, a carboxylic acid group or a salt thereof, a sulfonic acid or a salt thereof, and a phosphoric acid or a salt thereof;

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group;

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group, each substituted with at least one of a deuterium atom, a halogen atom, a hydroxyl group, a cyano group, a nitro group, an amino group, an amidino group, a hydrazine group, a hydrazone group, a carboxylic acid group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group; and —Si($Q_{11}$)($Q_{12}$)($Q_{13}$) and —N($Q_{14}$)($Q_{15}$), wherein $Q_{11}$ to $Q_{15}$ are each independently selected from a hydrogen atom, a $C_1$-$C_{60}$ alkyl group, a $C_1$-$C_{60}$ alkoxy group, a $C_6$-$C_{60}$ aryl group, and a $C_2$-$C_{60}$ heteroaryl group.

According to one or more embodiments, an organic light-emitting device includes a first electrode; a second electrode facing the first electrode; and an organic layer that comprises an emission layer and is disposed between the first electrode and the second electrode, wherein the organic layer comprises a hole transporting region between the first electrode and the emission layer and an electron transporting region between the emission layer and the second electrode, wherein the organic layer comprises at least one of the condensed-cyclic compound represented by Formula 1.

BRIEF DESCRIPTION OF THE DRAWING

Features will be apparent to those of skill in the art by describing in detail exemplary embodiments with reference to the attached drawing in which:

FIG. 1 illustrates a cross-sectional view of the structure of an organic light-emitting device according to an embodiment.

DETAILED DESCRIPTION

Example embodiments will now be described more fully hereinafter with reference to the accompanying drawing; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing FIGURE, the dimensions of layers and regions may be exaggerated for clarity of illustration. Like reference numerals refer to like elements throughout.

As used herein, the term "and/or" includes any and all combinations of one or more of the associated listed items. Expressions such as "at least one of," when preceding a list of elements, modify the entire list of elements and do not modify the individual elements of the list.

A condensed-cyclic compound may be represented by Formula 1 below.

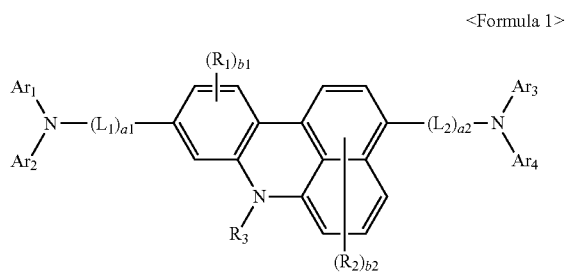

<Formula 1>

In Formula 1, $L_1$ and $L_2$ may be each independently selected from a substituted or unsubstituted $C_3$-$C_{10}$ cycloalkylene group, a substituted or unsubstituted $C_2$-$C_{10}$ heterocycloalkylene group, a substituted or unsubstituted $C_3$-$C_{10}$ cycloalkenylene group, a substituted or unsubstituted $C_2$-$C_{10}$ (heterocycloalkenylene group, a substituted or unsubstituted $C_6$-$C_{60}$ arylene group, and a substituted or unsubstituted $C_2$-$C_{60}$ heteroarylene group.

In an implementation, in Formula 1, $L_1$ and $L_2$ may be each independently selected from a substituted or unsubstituted phenylene group, a substituted or unsubstituted pentalenylene group, a substituted or unsubstituted indenylene group, a substituted or unsubstituted naphthylene group, a substituted or unsubstituted azulenylene group, a substituted or unsubstituted heptalenylene group, a substituted or unsubstituted indacenylene group, a substituted or unsubstituted acenaphthylene group, a substituted or unsubstituted fluorenylene group, a substituted or unsubstituted spiro-fluorenylene group, a substituted or unsubstituted phenalenylene group, a substituted or unsubstituted phenanthrenylene group, a substituted or unsubstituted anthracenylene group, a substituted or unsubstituted fluoranthenylene group, a substituted or unsubstituted triphenylenylene group, a substituted or unsubstituted pyrenylene group, a substituted or unsubstituted chrysenylene group, a substituted or unsubstituted naphthacenylene group, a substituted or unsubstituted picenylene group, a substituted or unsubstituted perylenylene group, a substituted or unsubstituted pentaphenylene group, a substituted or unsubstituted hexacenylene group, a substituted or unsubstituted pyrrolylene group, a substituted or unsubstituted imidazolylene group, a substituted or unsubstituted pyrazolylene group, a substituted or unsubstituted pyridinylene group, a substituted or unsubstituted pyrazinylene group, a substituted or unsubstituted pyrimidinylene group, a substituted or unsubstituted pyridazinylene group, a substituted or unsubstituted isoindolylene group, a substituted or unsubstituted indolylene group, a substituted or unsubstituted indazolylene group, a substituted or unsubstituted purinylene group, a substituted or unsubstituted quinolinylene group, a substituted or unsubstituted benzoquinolinylene group, a substituted or unsubstituted phthalazinylene group, a substituted or unsubstituted naphthyridinylene group, a substituted or unsubstituted quinoxalinylene group, a substituted or unsubstituted quinazolinylene group, a substituted or unsubstituted cinnolinylene group, a substituted or unsubstituted carbazolylene group, a substituted or unsubstituted phenanthridinylene group, a substituted or unsubstituted acridinylene group, a substituted or unsubstituted phenanthrolinylene group, a substituted or unsubstituted phenazinylene group, a substituted or unsubstituted benzooxazolylene group, a substituted or unsubstituted benzoimidazolylene group, a substituted or unsubstituted furanylene group, a substituted or unsubstituted benzofuranylene group, a substituted or unsubstituted thiophenylene group, a substituted or unsubstituted benzothiophenylene group, a substituted or unsubstituted thiazolylene group, a substituted or unsubstituted isothiazolylene group, a substituted or unsubstituted benzothiazolylene group, a substituted or unsubstituted isoxazolylene group, a substituted or unsubstituted oxazolylene group, a substituted or unsubstituted triazolylene group, a substituted or unsubstituted tetrazolylene group, a substituted or unsubstituted oxadiazolylene group, a substituted or unsubstituted triazinylene group, a substituted or unsubstituted benzooxazolylene group, a substituted or unsubstituted dibenzofuranylene group, a substituted or unsubstituted dibenzothiophenylene group, a substituted or unsubstituted benzocarbazolylene group, and a substituted or unsubstituted dibenzosilolylene group.

In an implementation, at least one substituent of the substituted phenylene group, substituted pentalenylene group, substituted indenylene group, substituted naphthylene group, substituted azulenylene group, substituted heptalenylene group, substituted indacenylene group, substituted acenaphthylene group, substituted fluorenylene group, substituted spiro-fluorenylene group, substituted phenalenylene group, substituted phenanthrenylene group, substituted anthracenylene group, substituted fluoranthenylene group, substituted triphenylenylene group, substituted pyrenylene group, substituted chrysenylene group, substituted naphthacenylene group, substituted picenylene group, substituted perylenylene group, substituted pentaphenylene group, substituted hexacenylene group, substituted pyrrolylene group, substituted imidazolylene group, substituted pyrazolylene group, substituted pyridinylene group, substituted pyrazinylene group, substituted pyrimidinylene group, substituted pyridazinylene group, substituted isoindolylene group, substituted indolylene group, substituted indazolylene group, substituted purinylene group, substituted quinolinylene group, substituted benzoquinolinylene group, substituted phthalazinylene group, substituted naphthyridinylene group, substituted quinoxalinylene group, substituted quinazolinylene group, substituted cinnolinylene group, substituted carbazolylene group, substituted phenanthridinylene group, substituted acridinylene group, substituted phenanthrolinylene group, substituted phenazinylene group, substituted benzooxazolylene group, substituted benzoimidazolylene group substituted furanylene group, substituted benzofuranylene group, substituted thiophenylene group, substituted benzothiophenylene group, substituted thiazolylene group, substituted isothiazolylene group, substituted benzothiazolylene group, substituted isoxazolylene group, substituted oxazolylene group, substituted triazolylene group, substituted tetrazolylene group, substituted oxadiazolylene group, substituted triazinylene group, substituted benzooxazolylene group, substituted dibenzofuranylene group, substituted dibenzothiophenylene group, substituted benzocarbazolylene group, and substituted dibenzosilolylene group may be selected from:

a deuterium atom, a halogen atom, a hydroxyl group, a cyano group, a nitro group, an amino group, an amidino group, a hydrazine group, a hydrazone group, a carboxylic acid group or a salt thereof, a sulfonic acid or a salt thereof, a phosphoric acid or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one of a deuterium atom, a halogen atom, a hydroxyl group, a cyano group, a nitro group, an amino group, an amidino group, a hydrazine group, a hydrazone group, a carboxylic acid group or a salt thereof, a sulfonic acid or a salt thereof, and a phosphoric acid or a salt thereof;

a $C_6$-$C_{20}$ aryl group and a $C_2$-$C_{20}$ heteroaryl group; and a $C_6$-$C_{20}$ aryl group and a $C_2$-$C_{20}$ heteroaryl group, each substituted with at least one of a deuterium atom, a halogen atom, a hydroxyl group, a cyano group, a nitro group, an amino group, an amidino group, a hydrazine group, a hydrazone group, a carboxylic acid group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a fluorenyl group, a dimethylfluorenyl group, a phenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group.

In an implementation, $L_1$ and $L_2$ may be each independently represented by one of Formulae 2-1 to 2-28 below.

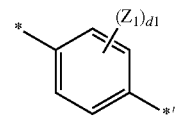

Formula 2-1

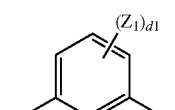

Formula 2-2

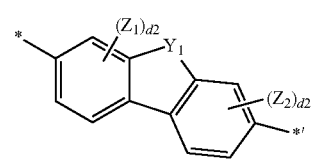

Formula 2-3

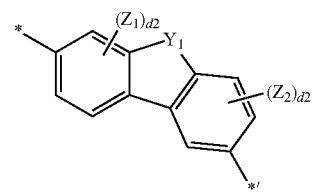

Formula 2-4

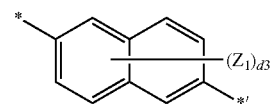

Formula 2-5

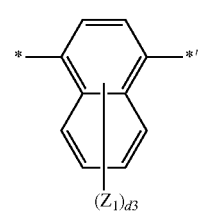

Formula 2-6

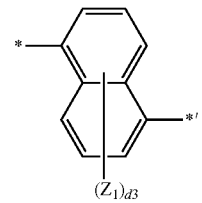

Formula 2-7

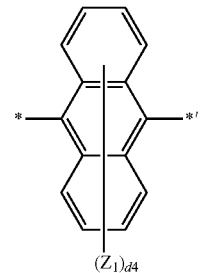

Formula 2-8

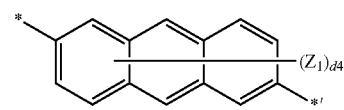

Formula 2-9

Formula 2-10
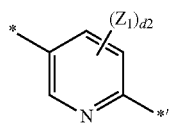

Formula 2-11
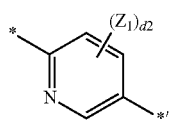

Formula 2-12
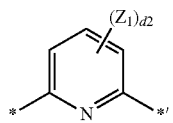

Formula 2-13
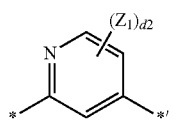

Formula 2-14
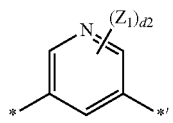

Formula 2-15
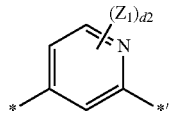

Formula 2-16
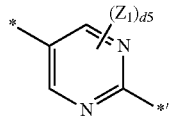

Formula 2-17
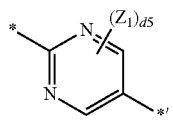

Formula 2-18
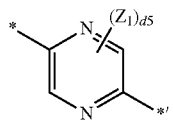

Formula 2-19
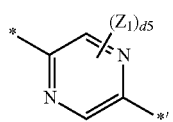

Formula 2-20
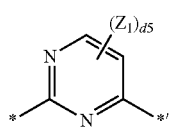

Formula 2-21
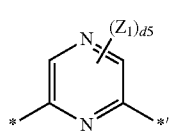

Formula 2-22
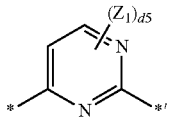

Formula 2-23
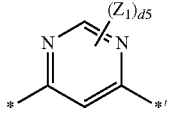

Formula 2-24
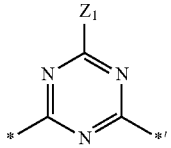

Formula 2-25
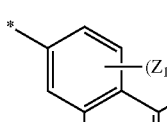

Formula 2-26
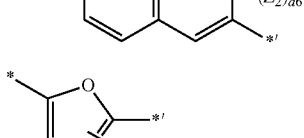

Formula 2-27
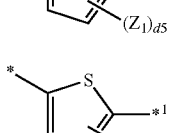

Formula 2-28

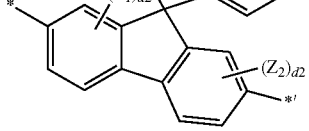

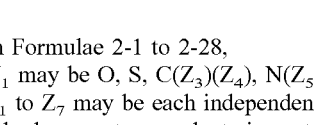

In Formulae 2-1 to 2-28, $Y_1$ may be O, S, $C(Z_3)(Z_4)$, $N(Z_5)$, or $Si(Z_6)(Z_7)$;

$Z_1$ to $Z_7$ may be each independently selected from:

a hydrogen atom, a deuterium atom, a halogen atom, a hydroxyl group, a cyano group, a nitro group, an amino group, an amidino group, a hydrazine group, a hydrazone group, a carboxylic acid group or a salt thereof, a sulfonic acid or a salt thereof, a phosphoric acid or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one of a deuterium atom, a halogen atom, a hydroxyl group, a cyano group, a nitro group, an amino group, an amidino group, a hydrazine group, a hydrazone group, a carboxylic acid group or a salt thereof, a sulfonic acid or a salt thereof, and a phosphoric acid or a salt thereof;

a $C_6$-$C_{20}$ aryl group and a $C_2$-$C_{20}$ heteroaryl group; and a $C_6$-$C_{20}$ aryl group and a $C_2$-$C_{20}$ heteroaryl group, each substituted with at least one of a deuterium atom, a halogen atom, a hydroxyl group, a cyano group, a nitro group, an amino group, an amidino group, a hydrazine group, a hydrazone group, a carboxylic acid group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a fluorenyl group, a dimethylfluorenyl group, a phenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group;

d1 may be an integer of 1 to 4; d2 may be an integer of 1 to 3; d3 may be an integer of 1 to 6; d4 may be an integer of 1 to 8; d5 may be an integer of 1 or 2; d6 may be an integer of 1 to 5; and \* and \*' may be a binding site of a neiboring atom.

For example, in Formulae 2-1 to 2-28, $Z_1$ to $Z_7$ may be each independently selected from a hydrogen atom, a deuterium atom, a halogen atom, a hydroxyl group, a cyano group, a nitro group, an amino group, an amidino group, a hydrazine group, a hydrazone group, a carboxylic acid group or a salt thereof, a sulfonic acid or a salt thereof, a phosphoric acid or a salt thereof, a methyl group, an ethyl group, a propyl group, a butyl group, a pentyl group, a hexyl group, a heptyl group, and an octyl group.

In an implementation, in Formula 1, $L_1$ and $L_2$ may be each independently represented by one of Formulae 3-1 to 3-21, below.

Formula 3-1
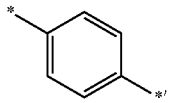

Formula 3-2
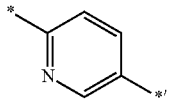

Formula 3-3
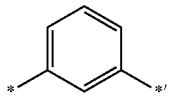

Formula 3-4
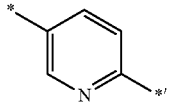

Formula 3-5
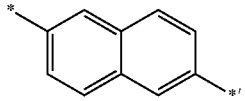

Formula 3-6
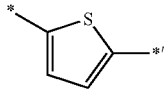

Formula 3-7
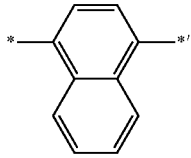

Formula 3-8
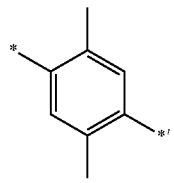

Formula 3-9
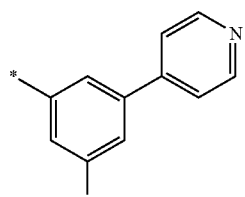

Formula 3-10
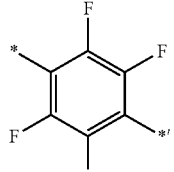

Formula 3-11
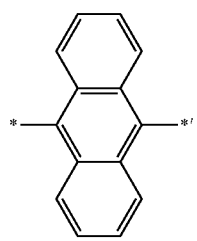

Formula 3-12
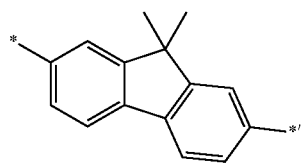

Formula 3-13
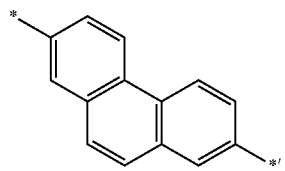

Formula 3-14
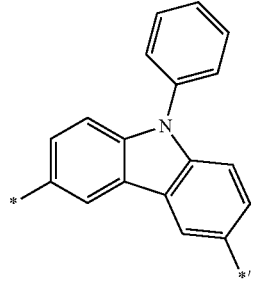

Formula 3-15
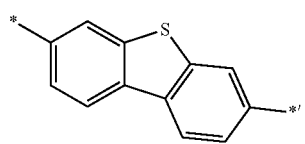

-continued

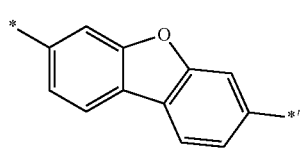

Formula 3-16

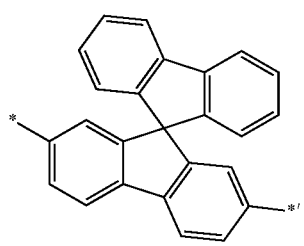

Formula 3-17

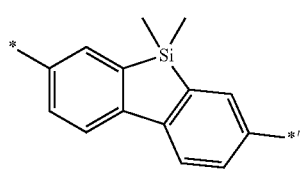

Formula 3-18

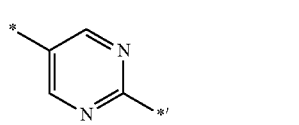

Formula 3-19

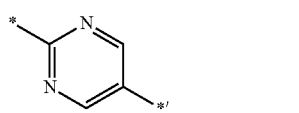

Formula 3-20

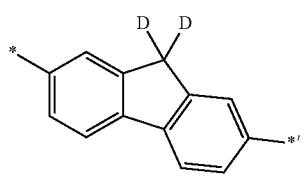

Formula 3-21

In Formulae 3-1 to 3-21, * and *' may each be a binding site with a neighboring atom.

In Formula 1, a1 denotes the number of L1. When a1 is 0, —N(Ar$_1$)(Ar$_2$) may be directly bound to a core of the compound represented by Formula 1, e.g., by a single bond. When a1 is 2 or greater, 2 or more of L1 may be identical to or different from each other. In Formula 1, a2 denotes the number of L2. When a2 is 0, —N(Ar$_3$)(Ar$_4$) may be directly bound to the core of the compound represented by Formula 1, e.g., by a single bond. When a2 is 2 or greater, 2 or more of L2 may be identical to or different from each other.

In an implementation, in Formula 1, a1 may be 0, and a2 may be 0; a1 may be 0, and a2 may be 3; a1 may be 1, and a2 may be 0; a1 may be 1, and a2 may be 1; a1 may be 1, and a2 may be 3; a1 may be 2, and a2 may be 0; a1 may be 2, and a2 may be 1; or a1 may be 2, and a2 may be 2.

For example, in Formula 1, a1 may be 0, and a2 may be 0; a may be 0, and a2 may be 1; a1 may be 0, and a2 may be 1; or a1 may be 1, and a2 may be 1.

In Formula 1, Ar$_1$ to Ar$_4$ may be each independently selected from a substituted or unsubstituted C3-C10 cycloalkyl group, a substituted or unsubstituted C2-C10 heterocycloalkyl group, a substituted or unsubstituted C3-C10 cycloalkenyl group, a substituted or unsubstituted C2-C10 heterocycloalkenyl group, a substituted or unsubstituted C6-C60 aryl group, and a substituted or unsubstituted C2-C60 heteroaryl group.

In an implementation, in Formula 1, Ar$_1$ to Ar$_4$ may be each independently selected from a substituted or unsubstituted phenyl group, a substituted or unsubstituted pentalenyl group, a substituted or unsubstituted indenyl group, a substituted or unsubstituted naphthyl group, a substituted or unsubstituted azulenyl group, a substituted or unsubstituted heptalenyl group, a substituted or unsubstituted indacenyl group, a substituted or unsubstituted acenaphthyl group, a substituted or unsubstituted fluorenyl group, a substituted or unsubstituted spiro-fluorenyl group, a substituted or unsubstituted phenalenyl group, a substituted or unsubstituted phenanthrenyl group, a substituted or unsubstituted anthracenyl group, a substituted or unsubstituted fluoranthenyl group, a substituted or unsubstituted triphenylenyl group, a substituted or unsubstituted pyrenyl group, a substituted or unsubstituted chrysenyl group, a substituted or unsubstituted naphthacenyl group, a substituted or unsubstituted picenyl group, a substituted or unsubstituted perylenyl group, a substituted or unsubstituted pentaphenyl group, a substituted or unsubstituted hexacenyl group, a substituted or unsubstituted pyrrolyl group, a substituted or unsubstituted imidazolyl group, a substituted or unsubstituted pyrazolyl group, a substituted or unsubstituted pyridinyl group, a substituted or unsubstituted pyrazinyl group, a substituted or unsubstituted pyrimidinyl group, a substituted or unsubstituted pyridazinyl group, a substituted or unsubstituted isoindolyl group, a substituted or unsubstituted indolyl group, a substituted or unsubstituted indazolyl group, a substituted or unsubstituted purinyl group, a substituted or unsubstituted quinolinyl group, a substituted or unsubstituted benzoquinolinyl group, a substituted or unsubstituted phthalazinyl group, a substituted or unsubstituted naphthyridinyl group, a substituted or unsubstituted quinoxalinyl group, a substituted or unsubstituted quinazolinyl group, a substituted or unsubstituted cinnolinyl group, a substituted or unsubstituted carbazolyl group, a substituted or unsubstituted phenanthridinyl group, a substituted or unsubstituted acridinyl group, a substituted or unsubstituted phenanthrolinyl group, a substituted or unsubstituted phenazinyl group, a substituted or unsubstituted benzooxazolyl group, a substituted or unsubstituted benzoimidazolyl group, a substituted or unsubstituted furanyl group, a substituted or unsubstituted benzofuranyl group, a substituted or unsubstituted thiophenyl group, a substituted or unsubstituted benzothiophenyl group, a substituted or unsubstituted thiazolyl group, a substituted or unsubstituted isothiazolyl group, a substituted or unsubstituted benzothiazolyl group, a substituted or unsubstituted isoxazolyl group, a substituted or unsubstituted oxazolyl group, a substituted or unsubstituted triazolyl group, a substituted or unsubstituted tetrazolyl group, a substituted or unsubstituted oxadiazolyl group, a substituted or unsubstituted triazinyl group, a substituted or unsubstituted benzooxazolyl group, a substituted or unsubstituted dibenzofuranyl group, a substituted or unsubstituted dibenzothiophenyl group, a substituted or unsubstituted benzocarbazolyl group, and a substituted or unsubstituted dibenzosilolyl group.

In an implementation, at least one substituent of the substituted phenyl group, substituted pentalenyl group, substituted indenyl group, substituted naphthyl group, substituted azulenyl group, substituted heptalenyl group, substituted indacenyl group, substituted acenaphthyl group, substituted fluorenyl group, substituted spiro-fluorenyl group, substituted phenalenyl group, substituted phenanthrenyl group, substituted anthracenyl group, substituted fluoranthenyl group, substituted triphenylenyl group, substituted pyrenyl group, substituted crysenyl group, substituted naphthacenyl group, substituted picenyl group, substituted perylenyl group, substituted pentaphenyl group, substituted hexacenyl group, substituted pyrrolyl group, substituted imidazolyl group, substituted pyrazolyl group, substituted pyridinyl group, substituted pyrazinyl group, substituted pyrimidinyl group, substituted pyridazinyl group, substituted isoindolyl group, substituted indolyl group, substituted indazolyl group, substituted purinyl group, substituted quinolinyl group, substituted benzoquinolinyl group, substituted phthalazinyl group, substituted naphthyridinyl group, substituted quinoxalinyl group, substituted quinazolinylene group, substituted cinnolinylene group, substituted carbazolylene group, substituted phenanthridinyl group, substituted acridinyl group, unsubstituted phenanthrolinyl group, substituted phenazinyl group, substituted benzooxazolyl group, substituted benzoimidazolyl group, substituted furanyl group, substituted benzofuranyl group, substituted thiophenyl group, substituted benzothiophenyl group, substituted thiazolyl group, substituted isothiazolyl group, substituted benzothiazolyl group, substituted isooxazolyl group, substituted oxazolyl group, substituted triazolyl group, substituted tetrazolyl group, substituted oxadiazolyl group, substituted triazinyl group, substituted benzooxazolyl group, substituted dibenzofuranyl group, substituted dibenzothiophenyl group, substituted benzocarbazolyl group, and substituted dibenzosilolyl group may be selected from:

a deuterium atom, a halogen atom, a hydroxyl group, a cyano group, a nitro group, an amino group, an amidino group, a hydrazine group, a hydrazone group, a carboxylic acid group or a salt thereof, a sulfonic acid or a salt thereof, a phosphoric acid or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one of a deuterium atom, a halogen atom, a hydroxyl group, a cyano group, a nitro group, an amino group, an amidino group, a hydrazine group, a hydrazone group, a carboxylic acid group or a salt thereof, a sulfonic acid or a salt thereof, and a phosphoric acid or a salt thereof;

a $C_6$-$C_{20}$ aryl group and a $C_2$-$C_{20}$ heteroaryl group; and a $C_6$-$C_{20}$ aryl group and a $C_2$-$C_{20}$ heteroaryl group, each substituted with at least one of a deuterium atom, a halogen atom, a hydroxyl group, a cyano group, a nitro group, an amino group, an amidino group, a hydrazine group, a hydrazone group, a carboxylic acid group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a fluorenyl group, a dimethylfluorenyl group, a phenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group.

For example, $Ar_1$ to $Ar_4$ may be each independently represented by one selected from Formulae 5-1 to 5-14:

Formula 5-1

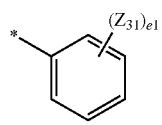

Formula 5-2

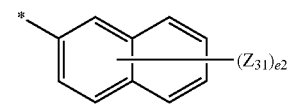

Formula 5-3

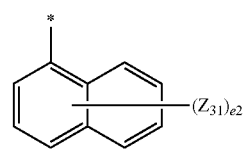

Formula 5-4

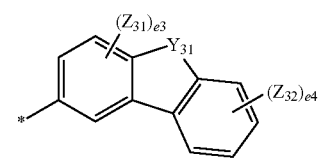

Formula 5-5

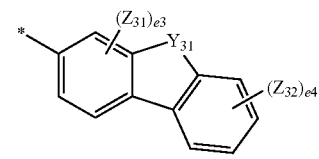

Formula 5-6

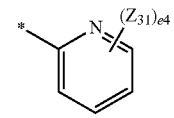

Formula 5-7

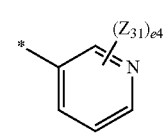

Formula 5-8

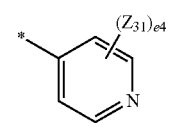

Formula 5-9

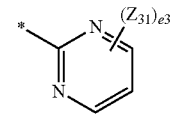

Formula 5-10

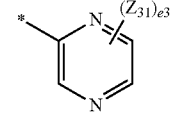

Formula 5-11

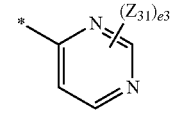

Formula 5-12

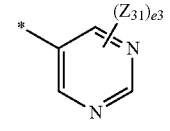

-continued

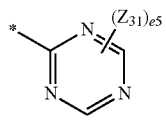
Formula 5-13

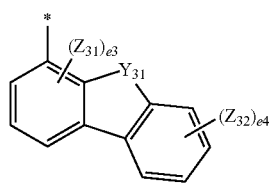
Formula 5-14

In Formulae 5-1 to 5-14, $Y_{31}$ may be O, S, $C(Z_{33})(Z_{34})$, or $N(Z_{35})$;

$Z_{31}$ to $Z_{35}$ may be each independently selected from:

a hydrogen atom, a deuterium atom, a halogen atom, a hydroxyl group, a cyano group, a nitro group, an amino group, an amidino group, a hydrazine group, a hydrazone group, a carboxylic acid group or a salt thereof, a sulfonic acid or a salt thereof, a phosphoric acid or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one of a deuterium atom, a halogen atom, a hydroxyl group, a cyano group, a nitro group, an amino group, an amidino group, a hydrazine group, a hydrazone group, a carboxylic acid group or a salt thereof, a sulfonic acid or a salt thereof, and a phosphoric acid or a salt thereof;

a $C_6$-$C_{20}$ aryl group and a $C_2$-$C_{20}$ heteroaryl group;

a $C_6$-$C_{20}$ aryl group and a $C_2$-$C_{60}$ heteroaryl group, each substituted with at least one of a deuterium atom, a halogen atom, a hydroxyl group, a cyano group, a nitro group, an amino group, an amidino group, a hydrazine group, a hydrazone group, a carboxylic acid group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a fluorenyl group, a dimethylfluorenyl group, a phenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group; and $Si(Q_{11})(Q_{12})(Q_{13})$ (in which, $Q_{11}$ to $Q_{13}$ are each independently a $C_1$-$C_{20}$ alkyl group, a phenyl group, a naphthyl group, or an anthracenyl group);

e1 may be an integer of 1 to 5; e2 may be an integer of 1 to 7; e3 may be an integer of 1 to 3; e4 may be an integer of 1 to 4; and e5 may be an integer of 1 or 2; and

* may denote a binding site with a neighboring atom.

In an implementation, in Formulae 5-1 to 5-14, $Z_{31}$ to $Z_{35}$ may be each independently selected from:

a hydrogen atom, a deuterium atom, a halogen atom, a hydroxyl group, a cyano group, a nitro group, an amino group, an amidino group, a hydrazine group, a hydrazone group, a carboxylic acid group or a salt thereof, a sulfonic acid or a salt thereof, a phosphoric acid or a salt thereof, a methyl group, an ethyl group, a propyl group, a butyl group, a pentyl group, a hexyl group, a heptyl group, an octyl group, a methoxy group, an ethoxy group, a propoxy group, a butoxy group, and a pentoxy group a methyl group, an ethyl group, a propyl group, a butyl group, a pentyl group, a hexyl group, a heptyl group, an octyl group, a methoxy group, an ethoxy group, a propoxy group, a butoxy group, and a pentoxy group, each substituted with at least one of a deuterium atom, a halogen atom, a hydroxyl group, a cyano group, a nitro group, an amino group, an amidino group, a hydrazine group, a hydrazone group, a carboxylic acid group or a salt thereof, a sulfonic acid or a salt thereof, and a phosphoric acid or a salt thereof;

a phenyl group, a naphthyl group, an anthracenyl group, a phenanthrenyl group, a pyridinyl group, a pyrimidinyl group, a pyridazinyl group, a triazinyl group, a quinolinyl group, and an isoquinolinyl group; and $Si(Q_{11})(Q_{12})(Q_{13})$ (in which, $Q_{11}$ to $Q_{13}$ are each independently a $C_1$-$C_{20}$ alkyl group, a phenyl group, a naphthyl group, or an anthracenyl group).

In an implementation, $Ar_1$ to $Ar_4$ may be each independently represented by one selected from Formulae 6-1 to 6-24 below:

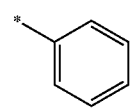
Formula 6-1

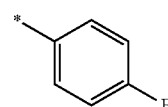
Formula 6-2

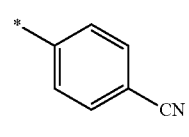
Formula 6-3

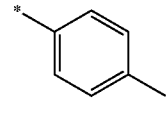
Formula 6-4

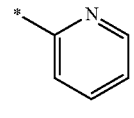
Formula 6-5

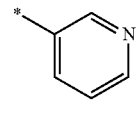
Formula 6-6

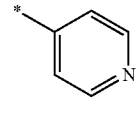
Formula 6-7

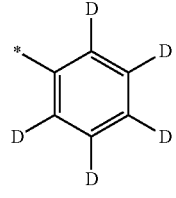
Formula 6-8

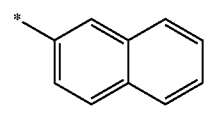
Formula 6-9

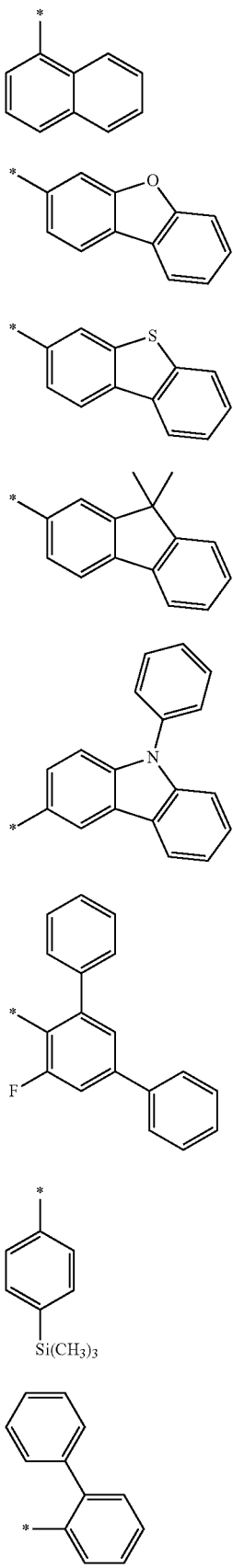

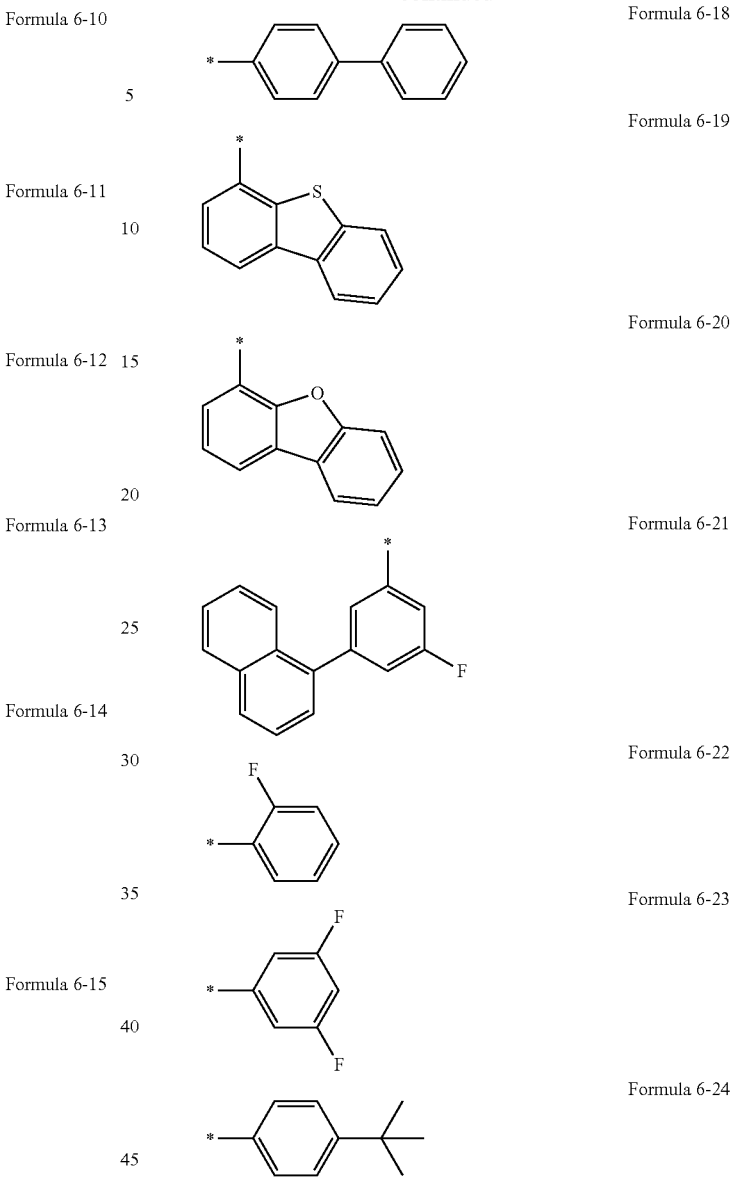

In Formulae 6-1 to 6-24, * denotes a binding site with a neiboring atom.

In an implementation, in Formula 1,
$Ar_1=Ar_2=Ar_3=Ar_4$;
$Ar_1 \neq Ar_2$, $Ar_1=Ar_3$, and $Ar_2=Ar_4$;
$Ar_1 \neq Ar_2$, $Ar_1=Ar_3$, and $Ar_2 \neq Ar_4$; or
$Ar_1 \neq Ar_2$, $Ar_1=Ar_3$, and $Ar_2 \neq Ar_4$.

In Formula 1, $R_1$ to $R_3$ may be each independently selected from a hydrogen atom, a deuterium atom, a halogen atom, a hydroxyl group, a cyano group, a nitro group, an amino group, an amidino group, a hydrazine group, a hydrazone group, a carboxylic acid group or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ heterocycloalkyl group, a substituted or unsubstituted $C_3$-$C_{10}$ cycloalkenyl group, a substituted or unsubstituted $C_3$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, and a substituted or unsubstituted $C_2$-$C_{60}$ heteroaryl group, —Si($Q_1$)($Q_2$)($Q_3$), —N($Q_4$)($Q_5$) (in which, $Q_1$ to $Q_5$ are each independently a $C_1$-$C_{60}$ alkyl group, a $C_1$-$C_{60}$ alkoxy group, a $C_6$-$C_{60}$ aryl group, or a $C_2$-$C_{60}$ heteroaryl group)

For example, in Formula 1, $R_3$ may be selected from:

a $C_1$-$C_{20}$ alkyl group and a $C_1$-$C_{20}$ alkoxy group;

a $C_1$-$C_{20}$ alkyl group and a $C_1$-$C_{20}$ alkoxy group, each substituted with at least one of a deuterium atom, a halogen atom, a hydroxyl group, a cyano group, a nitro group, an amino group, an amidino group, a hydrazine group, a hydrazone group, a carboxylic acid group or a salt thereof, a sulfonic acid or a salt thereof, and a phosphoric acid or a salt thereof;

a phenyl group, a pentalenyl group, an indenyl group, a naphthyl group, an azulenyl group, a heptalenyl group, an indacenyl group, an acenaphthyl group, a fluorenyl group, a spiro-fluorenyl group, a phenalenyl group, a phenanthrenyl group, an anthracenyl group, a fluoranthenyl group, a triphenylenylene group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzooxazolyl group, a benzoimidazolyl group, a furanyl group, a benzofuranyl group, a thiophenylene group, a benzothiophenyl group, a thiazolyl group, an isothiazolyl group, a benzothiazolyl group, an isoxazolyl group, an oxazolyl group, a triazolyl group, a tetrazolyl group, an oxadiazolylene group, a triazinylene group, a benzooxazolyl group, a dibenzofuranyl group, a dibenzothiophenyl group, and a benzocarbazolyl group; and a phenyl group, a pentalenyl group, an indenyl group, a naphthyl group, an azulenyl group, a heptalenyl group, an indacenyl group, an acenaphthyl group, a fluorenyl group, a spiro-fluorenyl group, a phenalenyl group, a phenanthrenyl group, an anthracenyl group, a fluoranthenyl group, a triphenylenyl group, a pyrenyl group, a crysenyl group, a naphthacenyl group, a picenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzooxazolyl group, a benzoimidazolyl group, a furanyl group, a benzofuranyl group, a thiophenyl group, a benzothiophenyl group, a thiazolyl group, an isothiazolyl group, a benzothiazolyl group, an isooxazolyl group, an oxazolyl group, a triazolyl group, a tetrazolyl group, an oxadiazolyl group, a triazinyl group, a benzooxazolyl group, a dibenzofuranyl group, a dibenzothiophenyl group, and a benzocarbazolyl group, each substituted with one of:

a deuterium atom, a halogen atom, a hydroxyl group, a cyano group, a nitro group, an amino group, an amidino group, a hydrazine group, a hydrazone group, a carboxylic acid group or a salt thereof, a sulfonic acid or a salt thereof, a phosphoric acid or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one of a deuterium atom, a halogen atom, a hydroxyl group, a cyano group, a nitro group, an amino group, an amidino group, a hydrazine group, a hydrazone group, a carboxylic acid group or a salt thereof, a sulfonic acid or a salt thereof, and a phosphoric acid or a salt thereof, a $C_6$-$C_{20}$ aryl group and a $C_2$-$C_{20}$ heteroaryl group; and a $C_6$-$C_{20}$ aryl group and a $C_2$-$C_{20}$ heteroaryl group, each substituted with at least one of a deuterium atom, a halogen atom, a hydroxyl group, a cyano group, a nitro group, an amino group, an amidino group, a hydrazine group, a hydrazone group, a carboxylic acid group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a fluorenyl group, a dimethylfluorenyl group, a phenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group.

In an implementation, in Formula 1, $R_3$ may be selected from:

a $C_1$-$C_{20}$ alkyl group and a $C_1$-$C_{20}$ alkoxy group;

a $C_1$-$C_{20}$ alkyl group and a $C_1$-$C_{20}$ alkoxy group, each substituted with at least one of a deuterium atom, a halogen atom, a hydroxyl group, a cyano group, a nitro group, an amino group, an amidino group, a hydrazine group, a hydrazone group, a carboxylic acid group or a salt thereof, a sulfonic acid or a salt thereof, and a phosphoric acid or a salt thereof;

a phenyl group, a naphthyl group, an anthracenyl group, a fluorenyl group, a pyridinyl group, a pyrimidinyl group, a quinolinyl group, an isoquinolinyl group, and a triazinyl group; and a phenyl group, a naphthyl group, an anthracenyl group, a fluorenyl group, a pyridinyl group, a pyrimidinyl group, a quinolinyl group, an isoquinolinyl group, and a triazinyl group, each substituted with at least one of a deuterium atom, a halogen atom, a hydroxyl group, a cyano group, a nitro group, an amino group, an amidino group, a hydrazine group, a hydrazone group, a carboxylic acid group or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an anthracenyl group, a fluorenyl group, a pyridinyl group, a pyrimidinyl group, a quinolinyl group, an isoquinolinyl group, and a triazinyl group.

In an implementation, in Formula 1, $R_1$ and $R_2$ may be each independently selected from:

a hydrogen atom, a deuterium atom, a halogen atom, a hydroxyl group, a cyano group, a nitro group, an amino group, an amidino group, a hydrazine group, a hydrazone group, a carboxylic acid group or a salt thereof, a sulfonic acid or a salt thereof, a phosphoric acid or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one of a deuterium atom, a halogen atom, a hydroxyl group, a cyano group, a nitro group, an amino group, an amidino group, a hydrazine group, a hydrazone group, a carboxylic acid group or a salt thereof, a sulfonic acid or a salt thereof, and a phosphoric acid or a salt thereof;

a phenyl group, a pentalenyl group, an indenyl group, a naphthyl group, an azulenyl group, a heptalenyl group, an indacenyl group, an acenaphthyl group, a fluorenyl group, a spiro-fluorenyl group, a phenalenyl group, a phenanthrenyl group, an anthracenyl group, a fluoranthenyl group, a triphenylenylene group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzooxazolyl group, a benzoimidazolyl group, a furanyl group, a benzofuranyl group, a thiophenyl group, a benzothiophenyl group, a thiazolyl group, an isothiazolyl group, a benzothiazolyl group, an isoxazolyl group, an oxazolyl group, a triazolyl group, a tetrazolyl group, an oxadiazolyl group, a triazinyl group, a benzooxazolyl group, a dibenzofuranyl group, a dibenzothiophenyl group, and a benzocarbazolyl group; and a phenyl group, a pentalenyl group, an indenyl group, a naphthyl group, an azulenyl group, a heptalenyl group, an indacenyl group, an acenaphthyl group, a fluorenyl group, a spiro-fluorenyl group, a phenalenyl group, a phenanthrenyl group, an anthracenyl group, a fluoranthenyl group, a triphenylenyl group, a pyrenyl group, a crysenyl group, a naphthacenyl group, a picenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzooxazolyl group, a benzoimidazolyl group, a furanyl group, a benzofuranyl group, a thiophenyl group, a benzothiophenyl group, a thiazolyl group, an isothiazolyl group, a benzothiazolyl group, an isooxazolyl group, an oxazolyl group, a triazolyl group, a tetrazolyl group, an oxadiazolyl group, a triazinyl group, a benzooxazolyl group, a dibenzofuranyl group, a dibenzothiophenyl group, and a benzocarbazolyl group, each substituted with at least one of a deuterium atom, a halogen atom, a hydroxyl group, a cyano group, a nitro group, an amino group, an amidino group, a hydrazine group, a hydrazone group, a carboxylic acid group or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an anthracenyl group, a fluorenyl group, a pyridinyl group, a pyrimidinyl group, a quinolinyl group, an isoquinolinyl group, and a triazinyl group.

For example, in Formula 1, $R_1$ and $R_2$ may be each independently selected from a hydrogen atom, a deuterium atom, a halogen atom, a hydroxyl group, a cyano group, a nitro group, an amino group, an amidino group, a hydrazine group, a hydrazone group, a carboxylic acid group or a salt thereof, a sulfonic acid or a salt thereof, a phosphoric acid or a salt thereof, a C1-C20 alkyl group, a phenyl group, a naphthyl group, and an anthracenyl group.

In an implementation, in Formula 1, both $R_1$ and $R_2$ may be a hydrogen atom.

In Formula 1, b1 denotes the number of $R_1$ and may be an integer of 1 to 3. When b1 is 2 or greater, 2 or more of $R_1$ may be identical to or different from each other. In an implementation, b1 may be an integer of 1 or 2.

In Formula 1, b2 denotes the number of $R_2$ and may be an integer of 1 to 5. When b2 is 2 or greater, 2 or more of $R_2$ may be identical to or different from each other. In an implementation, b2 may be an integer of 1 or 2.

The condensed-cyclic compound according to an embodiment may be represented by one of Formulae 1A to 1D, below.

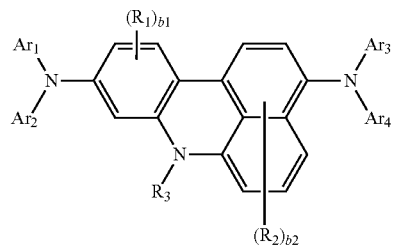

<Formula 1A>

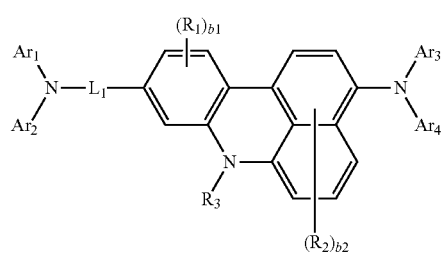

<Formula 1B>

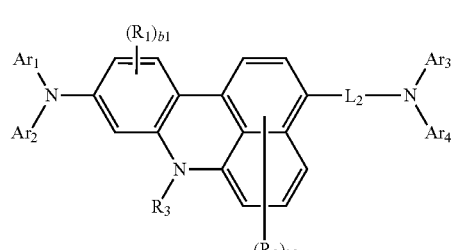

<Formula 1C>

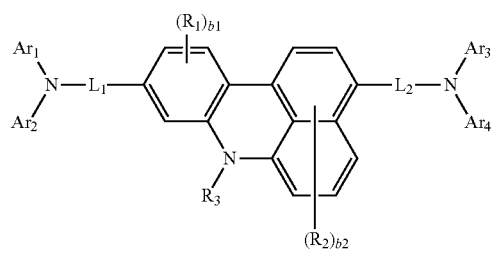

<Formula 1D>

In Formulae 1A to 1D, descriptions of $L_1$, $L_2$, Ar1 to Ar4, R1, R2, b1, and b2 may be the same as described above with respect to Formula 1.

For example, in Formulae 1A to 1 D, $L_1$ and $L_2$ may be each independently represented by one of Formulae 2-1 to 2-28 (e.g., Formulae 3-1 to 3-21);

$Ar_1$ to $Ar_4$ may be each independently represented by one of Formulae 5-1 to 5-14 (e.g., Formulae 6-1 to 6-24);

R₁ and R₂ may be each independently selected from a hydrogen atom, a deuterium atom, a halogen atom, a hydroxyl group, a cyano group, a nitro group, an amino group, an amidino group, a hydrazine group, a hydrazone group, a carboxylic acid group or a salt thereof, a sulfonic acid or a salt thereof, a phosphoric acid or a salt thereof, a $C_1$-$C_{20}$ alkyl group, a phenyl group, a naphthyl group, and an anthracenyl group;

R₃ may be selected from:

a $C_1$-$C_{20}$ alkyl group and a $C_1$-$C_{20}$ alkoxy group;

a $C_1$-$C_{20}$ alkyl group and a $C_1$-$C_{20}$ alkoxy group, each substituted with at least one of a deuterium atom, a halogen atom, a hydroxyl group, a cyano group, a nitro group, an amino group, an amidino group, a hydrazine group, a hydrazone group, a carboxylic acid group or a salt thereof, a sulfonic acid or a salt thereof, and a phosphoric acid or a salt thereof;

a phenyl group, a naphthyl group, an anthracenyl group, a fluorenyl group, a pyridinyl group, a pyrimidinyl group, a quinolinyl group, an isoquinolinyl group, and a triazinyl group; and a phenyl group, a naphthyl group, an anthracenyl group, a fluorenyl group, a pyridinyl group, a pyrimidinyl group, a quinolinyl group, an isoquinolinyl group, and a triazinyl group, each substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an anthracenyl group, a fluorenyl group, a pyridinyl group, a pyrimidinyl group, a quinolinyl group, an isoquinolinyl group, and a triazinyl group; and b1 and b2 may be each independently an integer of 1 or 2, In an implementation, at least one of substituents of the substituted $C_3$-$C_{10}$ cycloalkylene group, substituted $C_2$-$C_{10}$ heterocycloalkylene group, substituted $C_3$-$C_{10}$ cycloalkenylene group, substituted $C_2$-$C_{10}$ heterocycloalkenylene group, substituted $C_6$-$C_{60}$ arylene group, substituted $C_2$-$C_{60}$ heteroarylene group, substituted $C_3$-$C_{10}$ cycloalkyl group, substituted $C_2$-$C_{10}$ heterocycloalkyl group, substituted $C_3$-$C_{10}$ cycloalkenyl group, substituted $C_2$-$C_{10}$ heterocycloalkenyl group, substituted $C_6$-$C_{60}$ aryl group, substituted $C_2$-$C_{60}$ heteroaryl group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_6$-$C_{60}$ aryloxy group, and substituted $C_6$-$C_{60}$ arylthio group may be selected from:

a deuterium atom, a halogen atom, a hydroxyl group, a cyano group, a nitro group, an amino group, an amidino group, a hydrazine group, a hydrazone group, a carboxylic acid group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group a deuterium atom, each substituted with at least one of a deuterium atom, a halogen atom, a hydroxyl group, a cyano group, a nitro group, an amino group, an amidino group, a hydrazine group, a hydrazone group, a carboxylic acid group or a salt thereof, a sulfonic acid or a salt thereof, and a phosphoric acid or a salt thereof;

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group;

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group, each substituted with at least one of a deuterium atom, a halogen atom, a hydroxyl group, a cyano group, a nitro group, an amino group, an amidino group, a hydrazine group, a hydrazone group, a carboxylic acid group or a salt thereof, a sulfonic acid or a salt thereof, and a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{10}$ aryloxy group, a $C_6$-$C_{60}$ arylthio group, and a $C_2$-$C_{60}$ heteroaryl group; and —Si($Q_{11}$)($Q_{12}$)($Q_{13}$) and —N($Q_{14}$)($Q_{15}$) (in which, $Q_{11}$ to $Q_{15}$ is are each independently selected from a hydrogen atom, a $C_1$-$C_{60}$ alkyl group, a $C_1$-$C_{60}$ alkoxy group, a $C_6$-$C_{60}$ aryl group, and a $C_2$-$C_{60}$ heteroaryl group).

The condensed-cyclic compound may be one selected from Compound 1 to 60 below.

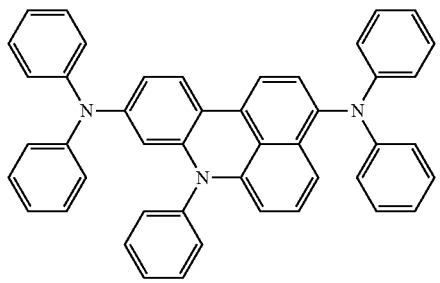

1

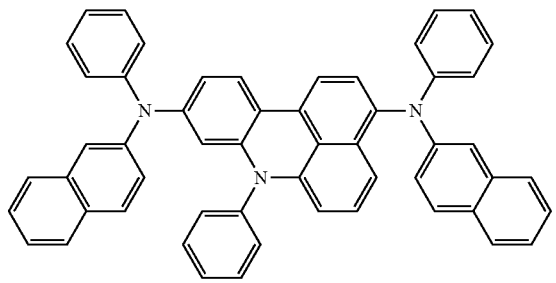

2

-continued
3
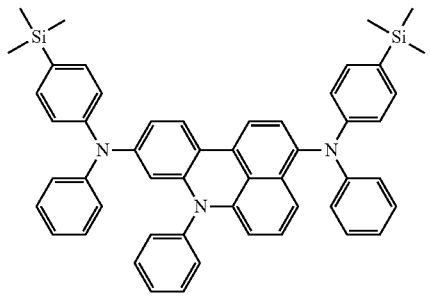
4
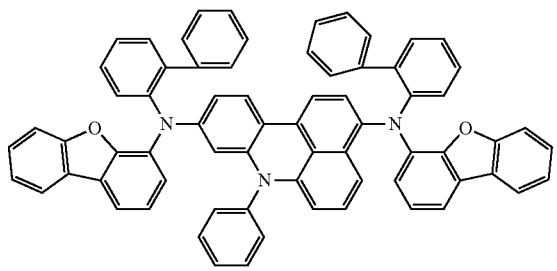
5
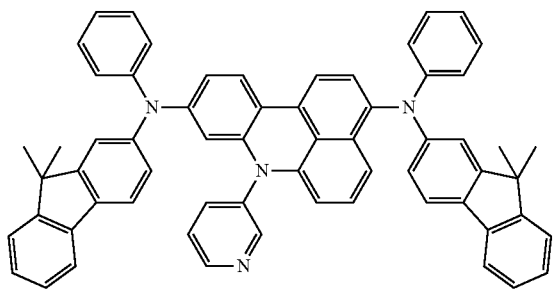
6
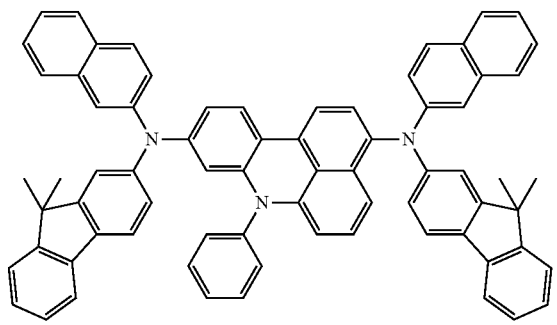
7
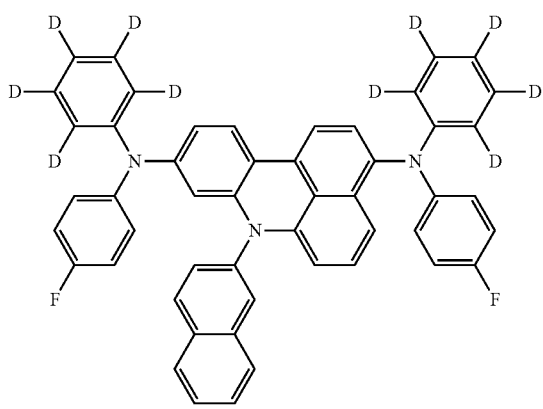
8
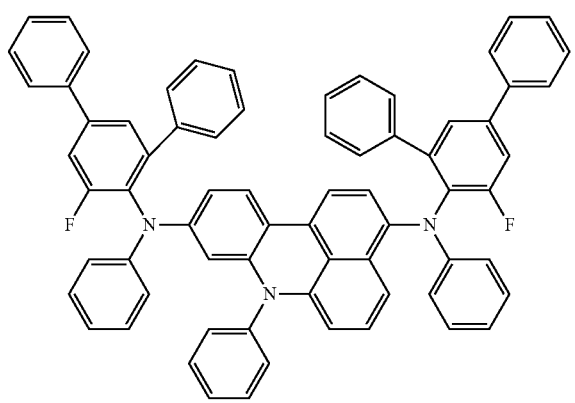
9
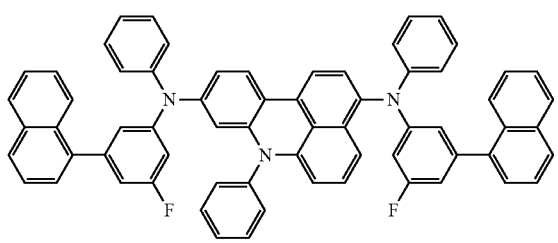
10
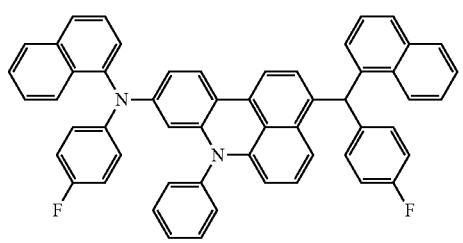

-continued
11
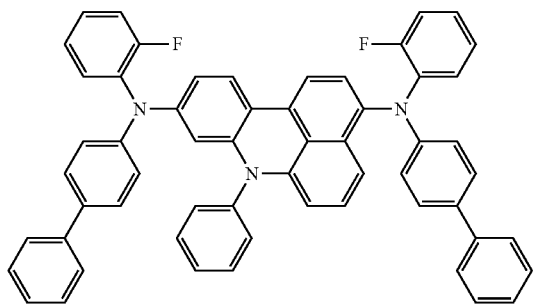
12
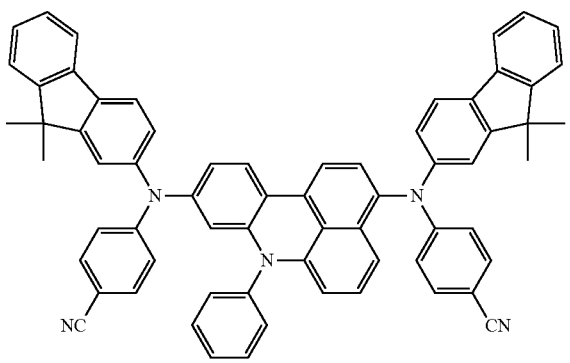
13
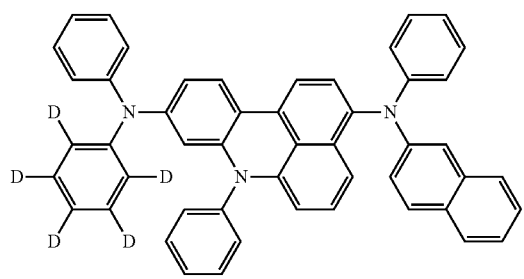
14
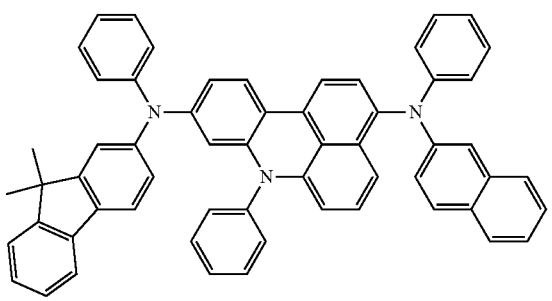
15
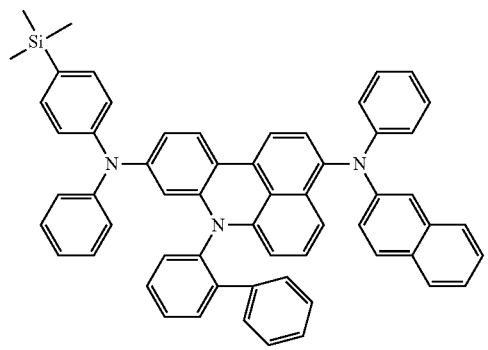
16
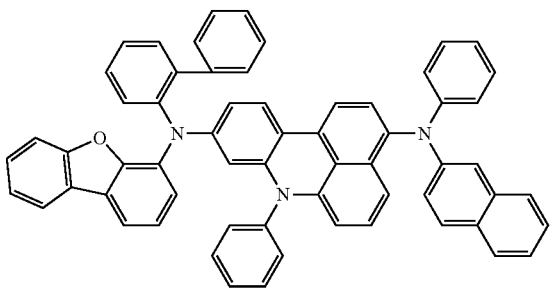
17
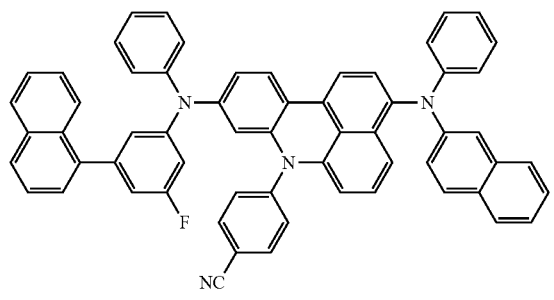
18
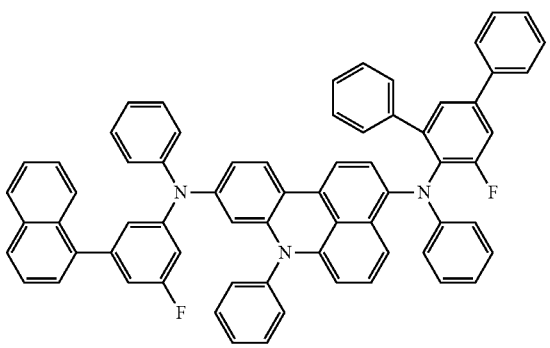

-continued
19
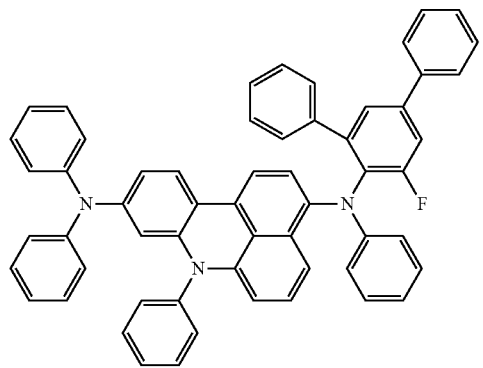
20
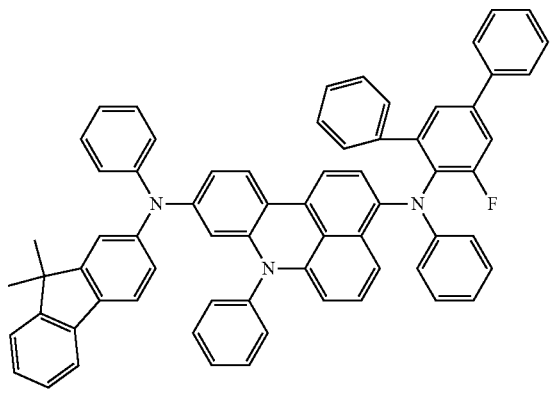
21
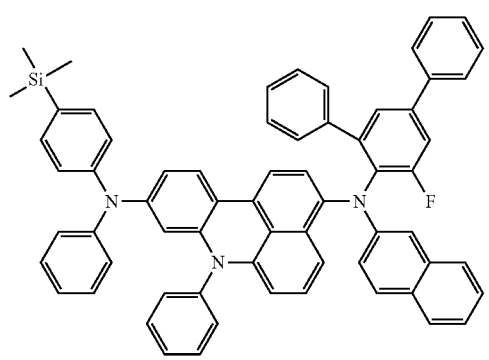
22
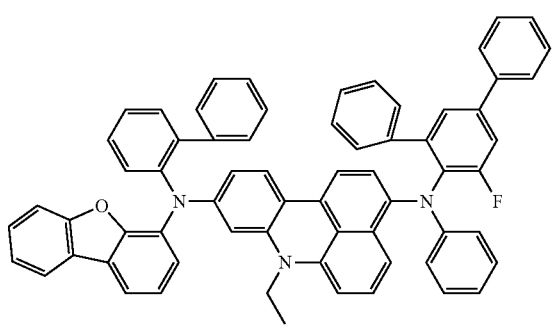
23
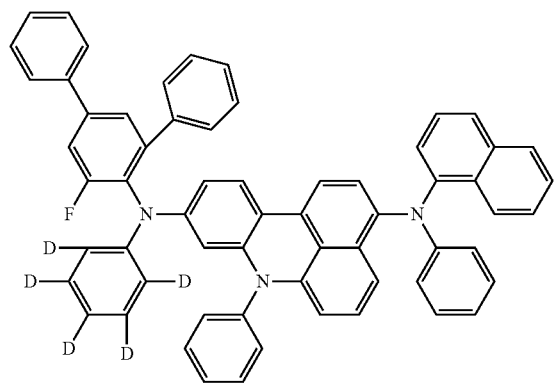
24
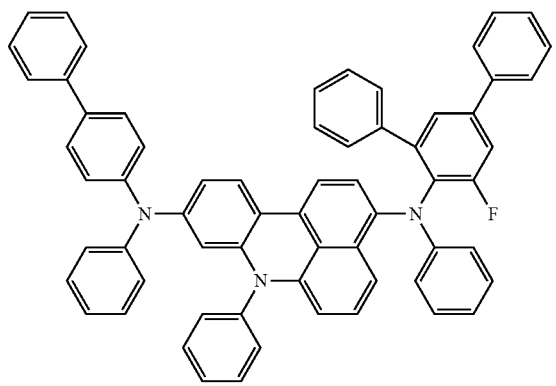
25
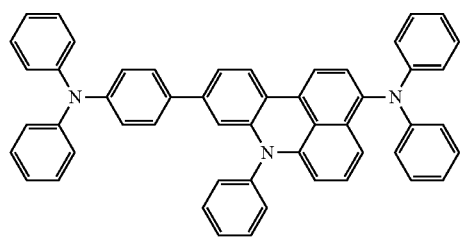
26
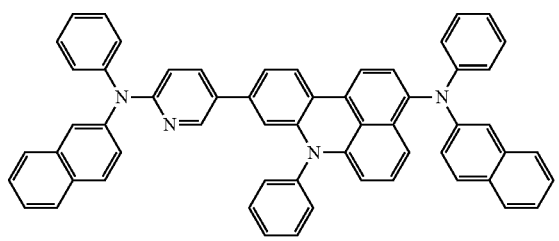

27
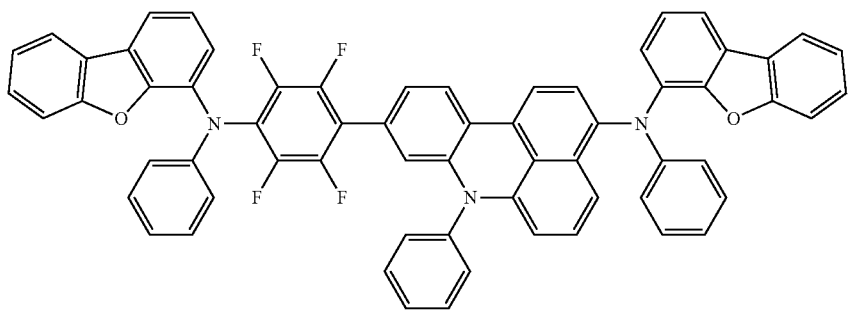
28
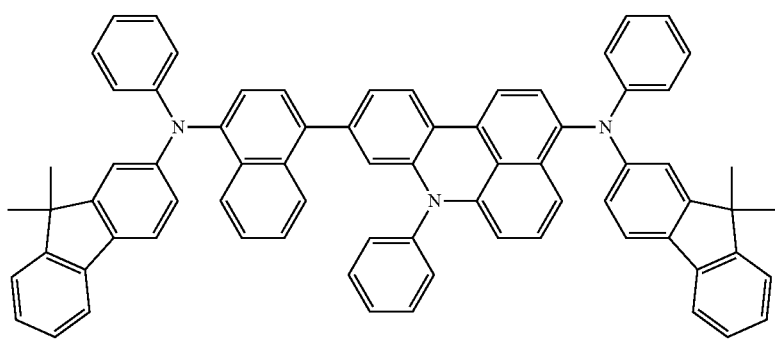
29 30
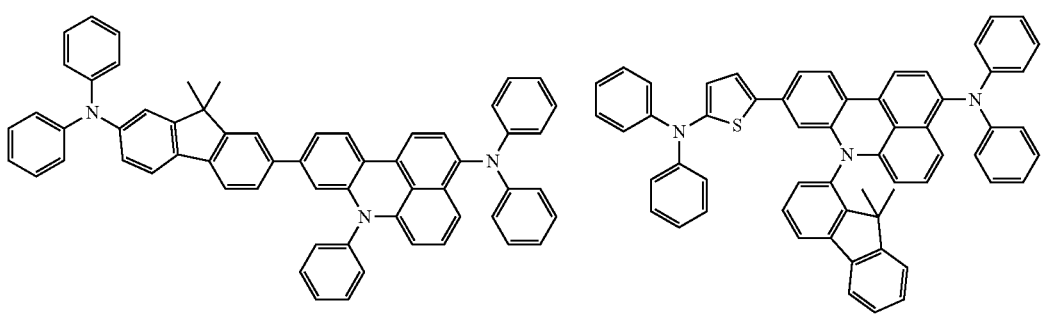
31
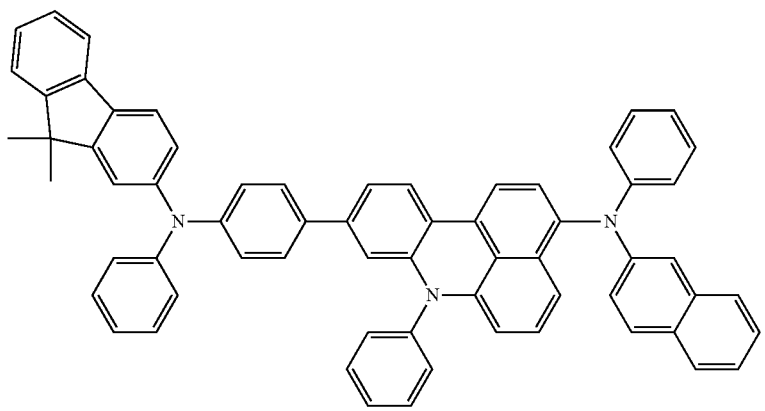

-continued
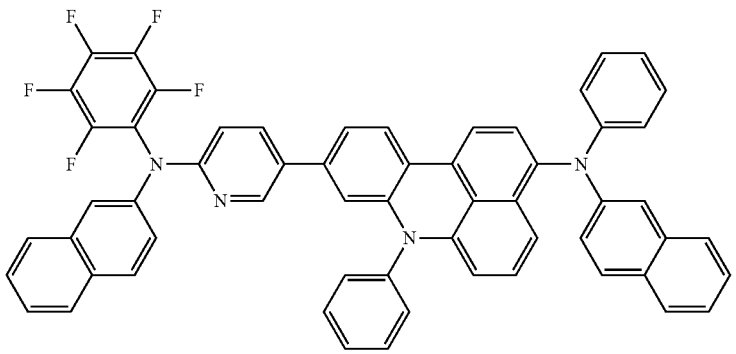
32
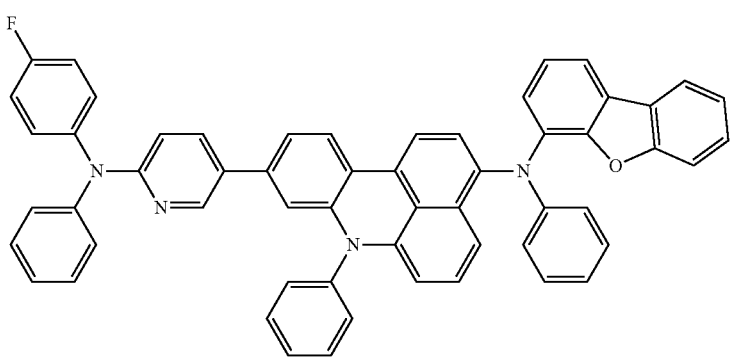
33
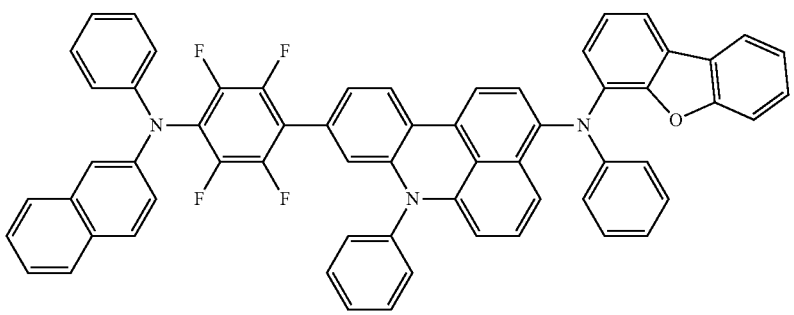
34
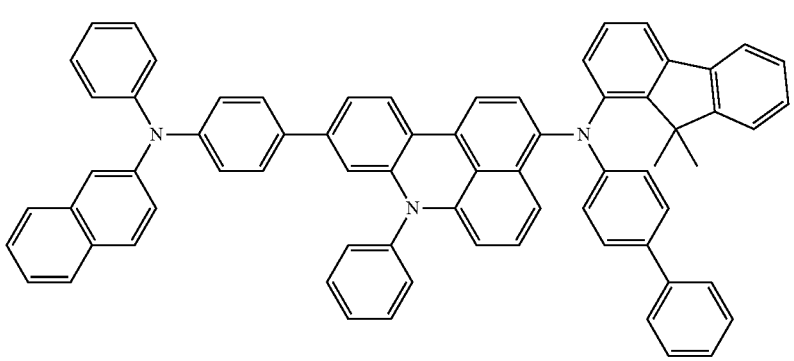
35

36
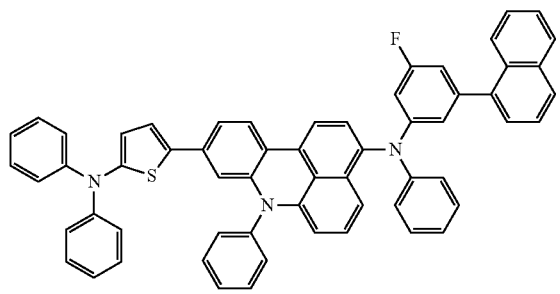
37
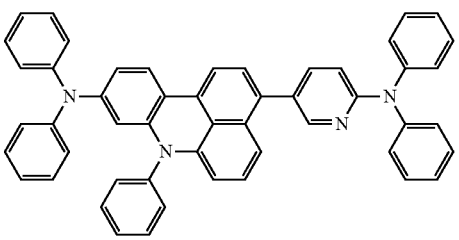
38
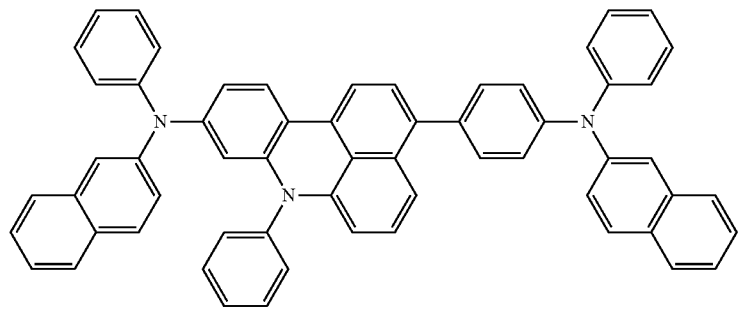
39
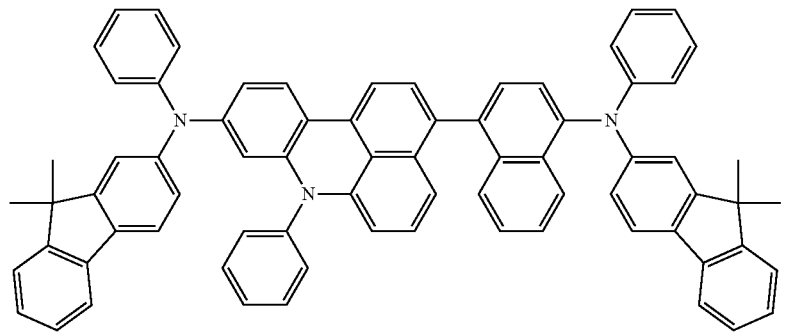
40
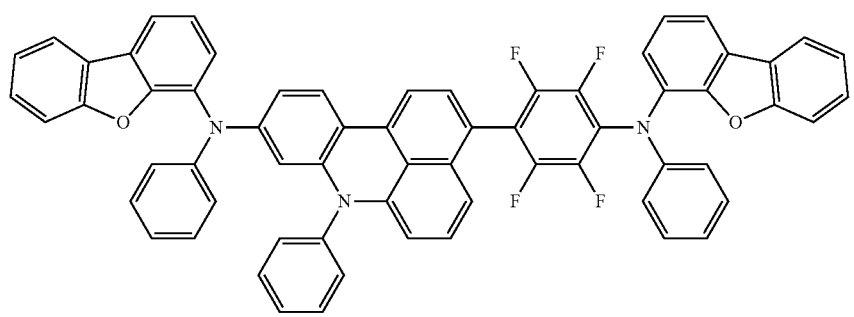
41
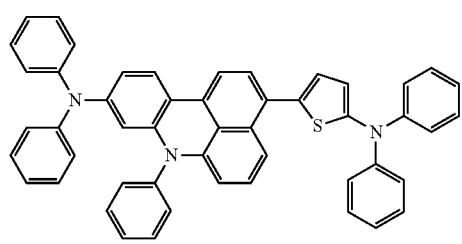
42
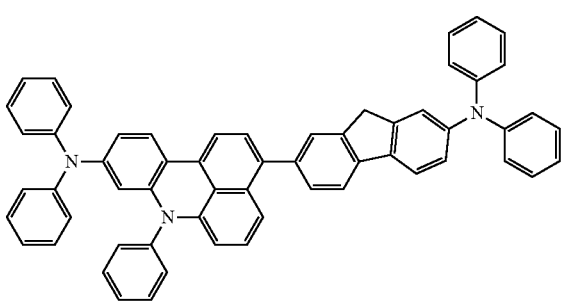

-continued
43
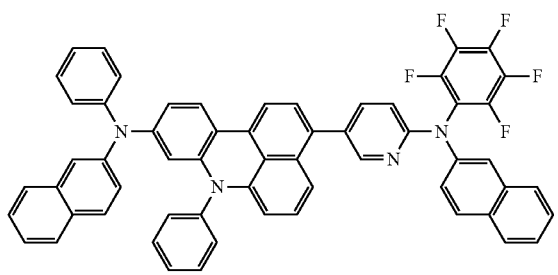
44
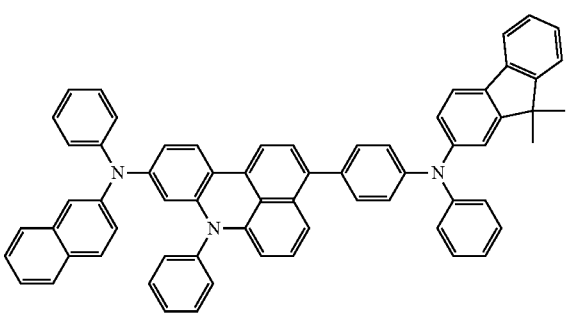
45
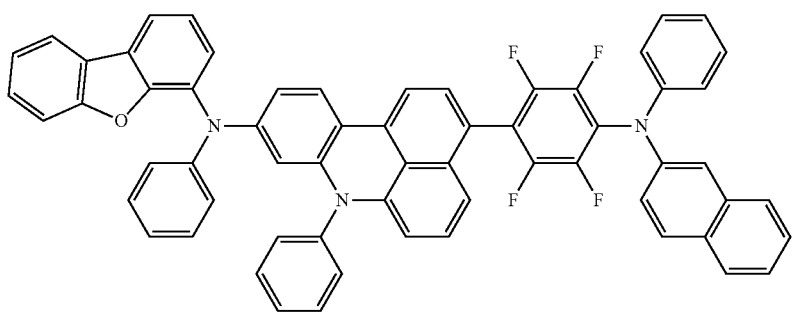
46
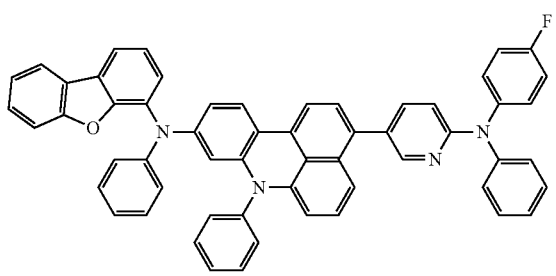
47
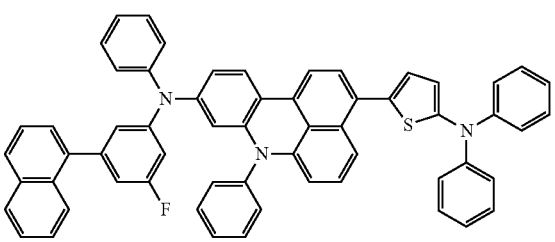
48
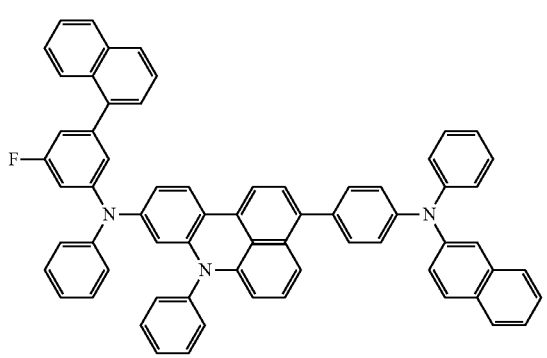
49
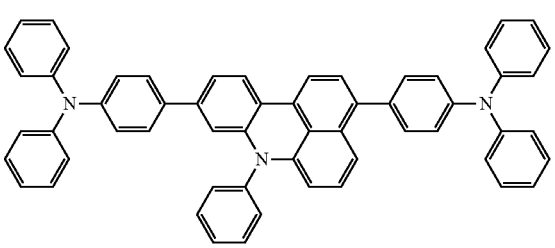
50
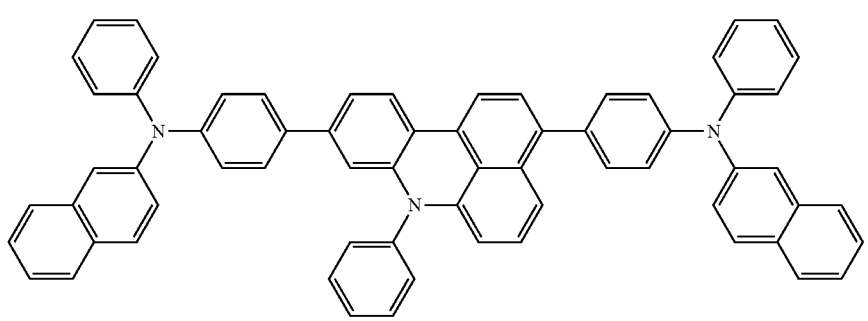

51
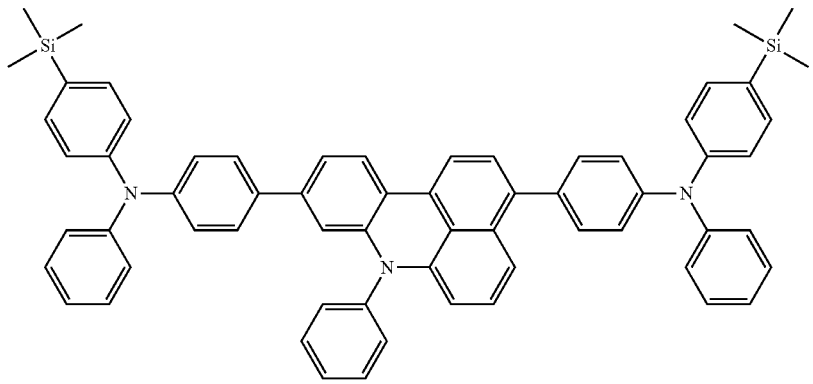
52
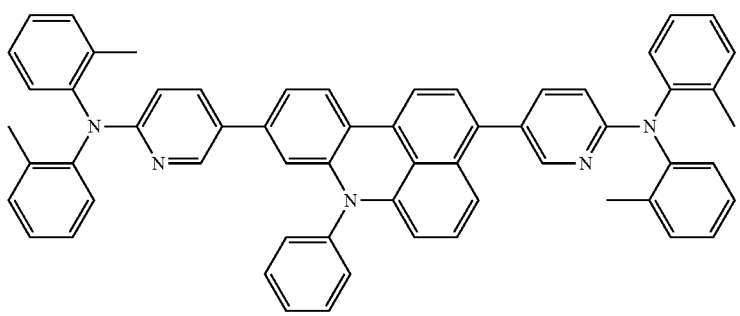
53
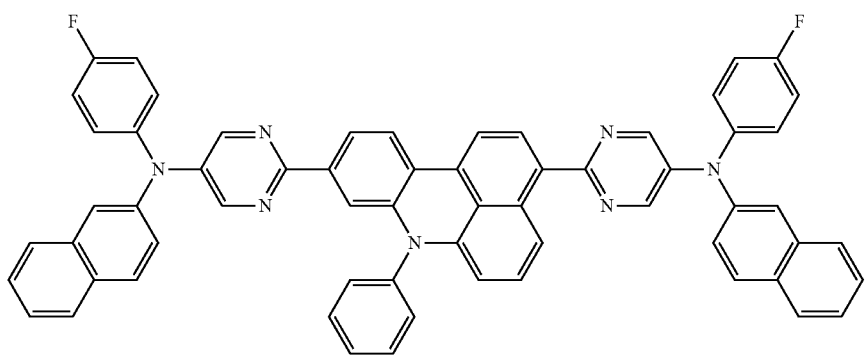
54
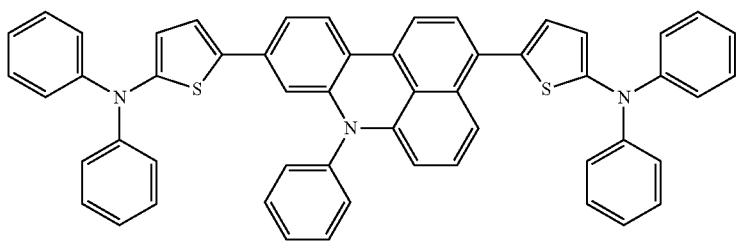
55
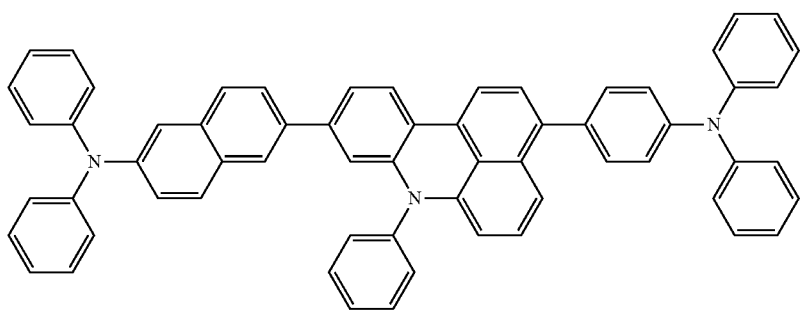

56
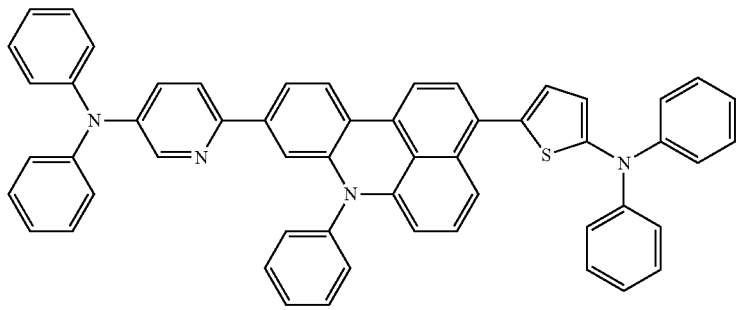
57
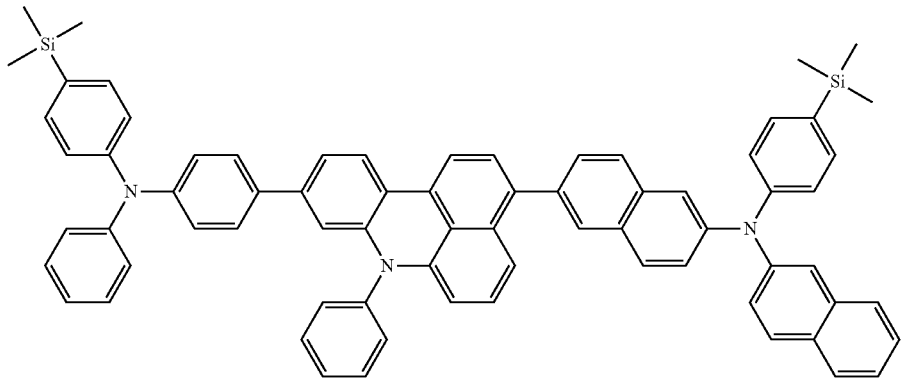
58
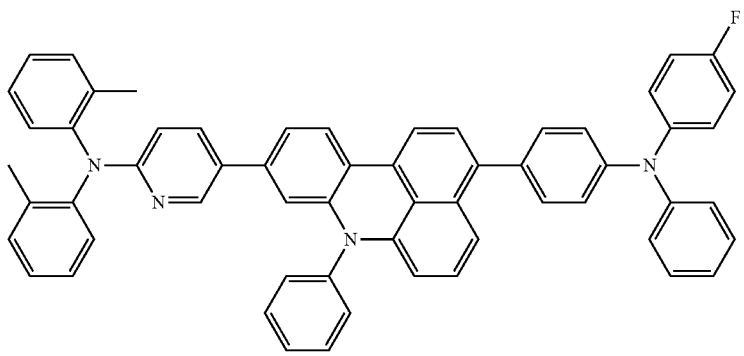
59
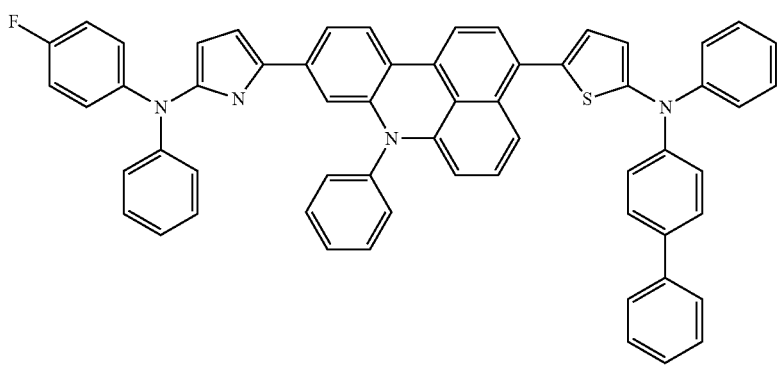

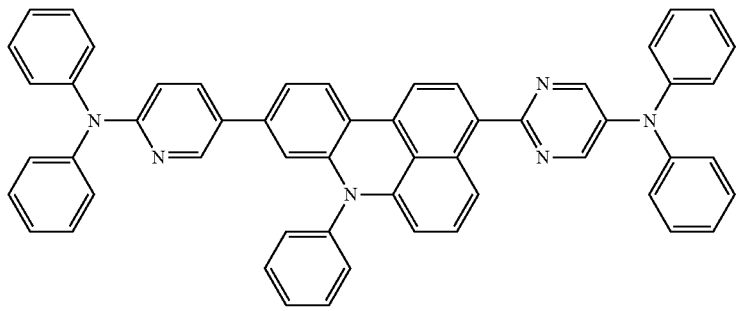

60

In Formula 1, a core

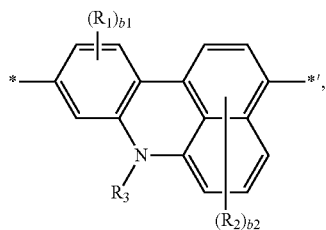

may have a structure of a benzene ring and a naphthalene ring that are condensed to each other through "$N(R_3)$" including one unshared electron pair. In Formula 1, the core may have a structure of $16\pi$-electrons that are delocalized and some of additional electrons of the unshared electron pair of N in "$N(R_3)$" may be transferred to the core, and a structure having abundant $\pi$-electrons in the center of the condensed-cyclic compound represented by Formula 1 may be formed. Thus, probability of $\pi \rightarrow \pi^*$ transition and $n \rightarrow \pi^*$ transition occurrence in the condensed-cyclic compound represented by Formula 1 may increase, and thus the condensed-cyclic compound represented by Formula 1 may contribute to improve light-emitting efficiency.

A comparative compound including, e.g., "C(R')(R")  (in which, R' and R" are each independently an arbitrary substituent)" instead of "$N(R_3)$" in a condensed-cyclic compound represented by Formula 1 (e.g., Compound B shown below) may include a benzene ring and a naphthalene ring that are condensed to each other through "C(R')(R")" that does not include an unshared electron pair, and thus may not achieve an improvement of light-emitting efficiency. In addition, vibrational and rotational energy degrees of freedom may increase in a molecule of the comparative compound due to R' and R" being connected to carbon as represented in "C(R')(R")", and thus loss of a transition energy of the molecule of the comparative compound may ensue. Accordingly, probability of nonradiative transition (not radiative transition) to a ground state may increase, and thus the increase may be a cause of decrease in light-emitting efficiency.

Also, a condensed-cyclic compound represented by Formula 1 may include both —$N(Ar_1)(Ar_2)$ and —$N(Ar_3)(Ar_4)$, and the abundant r-electrons of $Ar_1$ to $Ar_4$ and one unshared electron pair of nitrogen in "$N(R_3)$" may form an effective resonance structure. In this regard, probability of $\pi \rightarrow \pi^*$ transition and $n \rightarrow \pi^*$ transition occurrence in a molecule of the condensed-cyclic compound represented by Formula 1 may increase, and thus the condensed-cyclic compound represented by Formula 1 may help improve light-emitting efficiency.

A comparative compound including only one of —$N(Ar_1)(Ar_2)$ and —$N(Ar_3)(Ar_4)$ (e.g., Compound C shown below) may not improve light-emitting efficiency.

Therefore, an organic light-emitting device including the condensed-cyclic compound represented by Formula 1 may have a low driving voltage, a high efficiency, a high brightness, and a long lifetime.

A method of synthesizing a condensed-cyclic compound represented by Formula 1 may be easily understood by one of ordinary skill in the art in reference to Synthesis Examples below.

The condensed-cyclic compound represented by Formula 1 may be included (e.g., in an organic layer) between a pair of electrodes of an organic light-emitting device. For example, the condensed-cyclic compound may be included in an emission layer or in a hole transporting region (e.g., a hole injection layer, a hole transport layer, or a functional layer having both hole injection and hole transport capabilities) between a first electrode and the emission layer. In an implementation, the condensed-cyclic compound may be included in an emission layer (e.g., as a dopant in the emission layer) or in a hole transporting region material (e.g., as hole injection layer material) of an organic light-emitting device.

For example, an embodiment may provide an organic light-emitting device including a first electrode, a second electrode facing the first electrode, and an organic layer (including an emission layer) between the first electrode and the second electrode. The organic layer may include a condensed-cyclic compound represented by Formula 1. In an implementation, the organic layer may include a hole transporting region between the first electrode and the emission layer and an electron transporting region between the emission layer and the second electrode. The condensed-cyclic compound represented by Formula 1 may be included in the emission layer.

As used herein, the term "(an organic layer) includes at least one of a condensed-cyclic compound" may be understood as "(an organic layer) may include one kind of condensed-cyclic compound represented by Formula 1, or at least two different kinds of condensed-cyclic compound represented by Formula 1".

For example, the organic layer may include only Compound 1 as the condensed-cyclic compound. In this regard, Compound 2 may exist in an emission layer of an organic light-emitting device. According to another embodiment, the organic layer may include Compound 30 and Compound 54 as the condensed-cyclic compound. In this regard, Compound 30 and Compound 54 may exist in a single layer (for example, Compound 2 and Compound 50 may all exist in an electron transport layer), or different layers (for example, Compound 2 may exist in an electron transport layer and Compound 50 may exist in an emission layer).

The hole transporting region of the organic layer may include at least one layer selected from a hole injection layer, a hole transport layer, a functional layer having having both hole injection and hole transport capabilities (hereinafter referred to as "H-functional layer"), a buffer layer, and an electron blocking layer, and the electron transporting region of the organic layer may include at least one layer selected from a hole blocking layer, an electron transport layer, and an electron injection layer.

The term "organic layer" used herein refers to a single- and/or multi-layer interposed between the first electrode and the second electrode of the organic light-emitting device.

FIG. 1 illustrates a schematic sectional view of an organic light-emitting device 10 according to an embodiment. Hereinafter, the structure and manufacturing method of an organic light-emitting device according to an embodiment is described in detail with reference to FIG. 1.

A substrate 11, which may be a stuiable substrate for organic light-emitting devices, may be a glass substrate or a transparent plastic substrate with excellent mechanical strength, thermal stability, transparency, surface smoothness, ease of handling, and water resistance.

The substrate 11 shown in FIG. 1 is disposed under the first electrode 13, but the substrate 11 may be disposed on the second electrode 17 instead of being disposed under the first electrode 13 in some embodiments.

A first electrode 13 may be formed by, e.g., depositing or sputtering a material for a first electrode on the substrate 11. When the first electrode 13 is an anode, the material for the first electrode may be selected from materials with a high work function to facilitate hole injection. The first electrode 13 may be a reflective electrode or a transmission electrode. The material for the first electrode may be a transparent material with high conductivity, and examples of such a material may include indium tin oxide (ITO), indium zinc oxide (IZO), tin oxide ($SnO_2$), and zinc oxide (ZnO). When magnesium (Mg), aluminum (Al), aluminum-lithium (Al—Li), calcium (Ca), magnesium-indium (Mg—In), magnesium-silver (Mg—Ag), or the like is used, the first electrode 13 may be used as a reflective electrode.

The first electrode 13 may have, e.g., a single-layer structure or a multi-layer structure including at least two layers. For example, the first electrode 13 may have a three-layered structure of ITO/Ag/ITO.

The organic layer 15 may be disposed on the first electrode 13.

The organic layer 15 may include a hole transporting region (that sequentially includes a hole injection layer and a hole transport layer); an emmission layer; and an electron transporting region (that sequentially includes an electron transport layer and an electron injection layer).

A hole injection layer (HIL) may be formed on the first electrode 13 by using various methods, e.g., vacuum deposition, spin coating, casting, Langmuir-Blodgett (LB) deposition.

When the HIL is formed using vacuum deposition, vacuum deposition conditions may vary according to the compound that is used to form the HIL, and the desired structure and thermal properties of the HIL to be formed. For example, vacuum deposition may be performed at a temperature of about 100° C. to about 50° C., a pressure of about $10^{-8}$ torr to about $10^{-3}$ torr, and a deposition rate of about 0.01 to about 100 Å/sec.

When the HIL is formed using spin coating, the coating conditions may vary according to the compound that is used to form the HIL, and the desired structure and thermal properties of the HIL to be formed. For example, the coating rate may be in the range of about 2,000 rpm to about 5,000 rpm, and a temperature at which heat treatment is performed to remove a solvent after coating may be in the range of about 80° C. to about 200° C.

As a material for the HIL, the condensed-cyclic compound of Formula 1 may be used. Alternatively, a suitable hole injection material, e.g., N,N'-diphenyl-N,N'-bis-[4-(phenyl-m-tolyl-amino)-phenyl]-biphenyl-4,4'-diamine (DNTPD), a phthalocyanine compound such as copper phthalocyanine, 4,4',4"-tris(3-methylphenylphenylamino)triphenylamine (m-MTDATA), N,N'-di(1-naphthyl)-N,N'-diphenylbenzidine (NPB), TDATA, 2-TNATA, polyaniline/dodecylbenzenesulfonic acid (Pani/DBSA), poly(3,4-ethylenedioxythiophene)/poly(4-styrenesulfonate) (PEDOT/PSS), polyaniline/camphor sulfonic acid (pani/CSA), or (polyaniline)/poly(4-styrenesulfonate) (PANI/PSS) may be used:

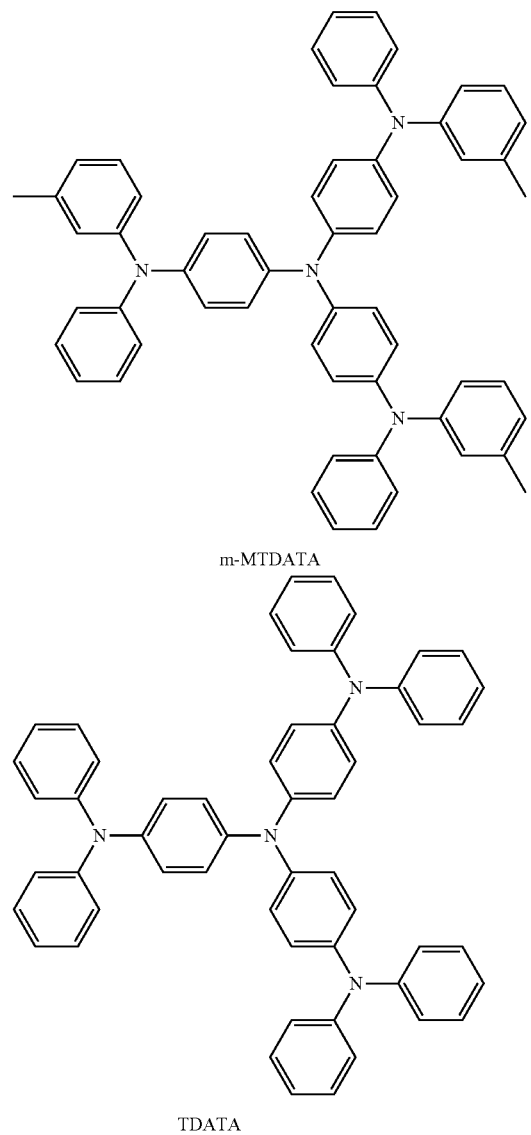

m-MTDATA

TDATA

-continued

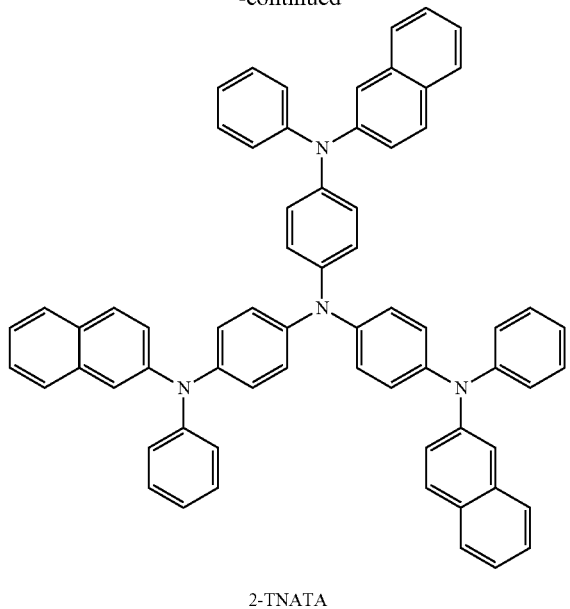

2-TNATA

A thickness of the HIL may be in a range of about 100 Å to about 10,000 Å, e.g., about 100 Å to about 1,000 Å. When the thickness of the HIL is within the range described above, the HIL may have satisfactory hole injection characteristics without a substantial increase in a driving voltage.

Then, a hole transport layer (HTL) may be formed on the HIL by using vacuum deposition, spin coating, casting, LB deposition, or the like. When the HTL is formed using vacuum deposition or spin coating, the deposition and coating conditions may be similar to those for the formation of the HIL, though the deposition and coating conditions may vary according to a compound that is used to form the HTL.

A suitable material for a HTL, a carbazole derivative, such as N-phenylcarbazole, or polyvinylcarbazole, N,N'-bis (3-methylphenyl)-N,N'-diphenyl-[1,1-biphenyl]-4,4'-diamine (TPD), 4,4',4"-tris(N-carbazolyl)triphenylamine (TCTA), N,N'-di(1-naphthyl)-N,N'-diphenylbenzidine (NPB), or the like may be used:

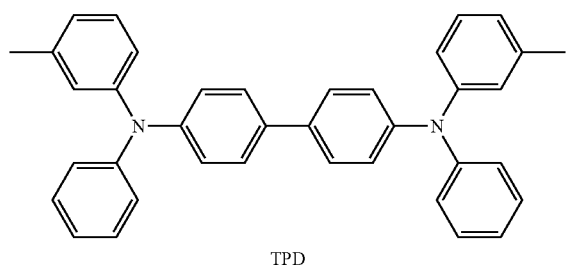

TPD

In an implementation, the hole transport layer material may include a condensed-cyclic compound represented by Formula 1.

A thickness of the HTL may be in a range of about 50 Å to about 20,000 Å, e.g., about 100 Å to about 1,500 Å. When the thickness of the HTL is within the range described above, the HTL may have satisfactory hole transport characteristics without a substantial increase in a driving voltage.

The organic light-emitting device 10 may include, instead of the HIL and the HTL, the H-functional layer (a functional layer having both hole injection and hole transport capabilities). The H-functional layer may include one or more materials selected from the materials for the HIL and the materials for the HTL. A thickness of the H-functional layer may be in a range of about 100 Å to about 10,000 Å, e.g., about 100 Å to about 1,000 Å. When the thickness of the H-functional layer is within the range described above, the H-functional layer may have satisfactory hole injection and transport characteristics without a substantial increase in a driving voltage.

In an implementation, at least one layer of the hole injection layer, the hole transport layer, and the H-functional layer may include at least one of a compound represented by Formula 300 below and a compound represented by Formula 301 below:

<Formula 300>

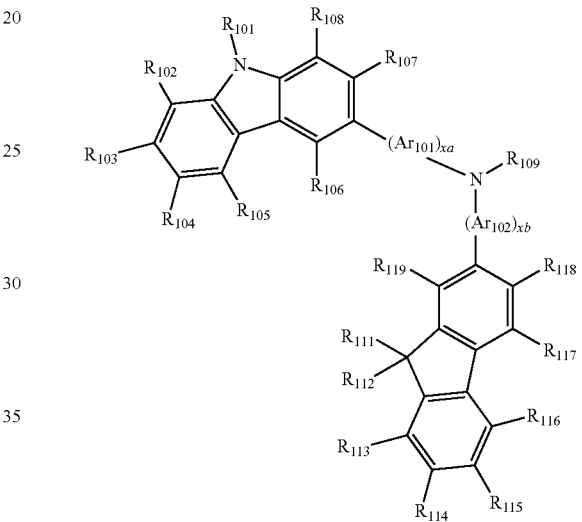

<Formula 301>

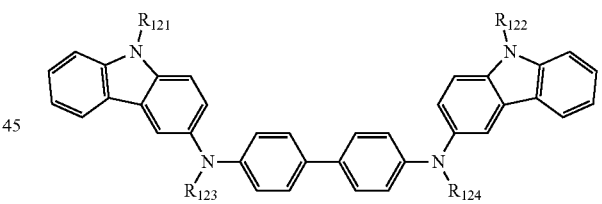

$Ar_{101}$ and $Ar_{102}$ in Formula 300 may be each independently selected from a substituted or unsubstituted $C_6$-$C_{60}$ arylene group.

For example, $Ar_{101}$ and $Ar_{102}$ may be each independently a phenylene group, a pentalenylene group, an indenylene group, a naphtylene group, an azulenylene group, a heptalenylene group, a substituted or unsubstituted acenaphtylene, a fluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, and a pentacenylene group; and a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a crysenylenylene group, a naphthacenylene group, a picenylene group, a perylenylene group, and a pentacenylene group substituted with at least one of a deuterium atom, a halogen atom, a hydroxyl group, a cyano group, a nitro group, an amino group, an amidino group, a hydrazine group, a hydrazone group, a carboxylic acid group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group.

In Formula 300, xa and xb may be each independently an integer of 0 to 5, e.g., 0, 1, or 2. For example, xa may be 1, and xb may be 0.

In Formulae 300 and 301, $R_{101}$ to $R_{108}$, $R_{111}$ to $R_{119}$, and $R_{121}$ to $R_{124}$ may be each independently a hydrogen atom, a deuterium atom, a halogen atom, a hydroxyl group, a cyano group, a nitro group, an amino group, an amidino group, a hydrazine group, a hydrazone group, a carboxylic acid group or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_6$-$C_{60}$ aryl group, a substituted or unsubstituted $C_6$-$C_{60}$ aryloxy group, or a substituted or unsubstituted $C_6$-$C_{60}$ arylthio group.

For example, $R_{101}$ to $R_{108}$, $R_{111}$ to $R_{119}$, and $R_{121}$ to $R_{124}$ may be each independently one of:

a hydrogen atom, a deuterium atom, a halogen atom, a hydroxyl group, a cyano group, a nitro group, an amino group, an amidino group, a hydrazine group, a hydrazone group, a carboxylic acid group or a salt thereof, a sulfonic acid or a salt thereof, a phosphoric acid or a salt thereof, a $C_1$-$C_{10}$ alkyl group (e.g., a methyl group, an ethyl group, a propyl group, a butyl group, a pentyl group, or a hexyl group), and a $C_1$-$C_{10}$ alkoxy group (e.g., a methoxy group, an ethoxy group, a propoxy group, a butoxy group, or a pentoxy group);

a $C_1$-$C_{10}$ alkyl group and a $C_1$-$C_{10}$ alkoxy group, each substituted with at least one of a deuterium atom, a halogen atom, a hydroxyl group, a cyano group, a nitro group, an amino group, an amidino group, a hydrazine group, a hydrazone group, a carboxylic acid group or a salt thereof, a sulfonic acid or a salt thereof, and a phosphoric acid or a salt thereof;

a phenyl group, a naphthyl group, an anthracenyl group, a fluorenyl group, and a pyrenyl group; and a phenyl group, a naphthyl group, an anthracenyl group, a fluorenyl group, and a pyrenyl group, each substituted with at least one of a deuterium atom, a halogen atom, a hydroxyl group, a cyano group, a nitro group, an amino group, an amidino group, a hydrazine group, a hydrazone group, a carboxylic acid group or a salt thereof, a sulfonic acid or a salt thereof, a phosphoric acid or a salt thereof, a $C_1$-$C_{10}$ alkyl group, and a $C_1$-$C_{10}$ alkoxy group.

In Formula 300, $R_{109}$ may be one of:
a phenyl group, a naphthyl group, an anthracenyl group, a biphenyl group, and a pyridyl group; and
a phenyl group, a naphthyl group, an anthracenyl group, a biphenyl group, and a pyridyl group, each substituted with at least one of a deuterium atom, a halogen atom, a hydroxyl group, a cyano group, a nitro group, an amino group, an amidino group, a hydrazine group, a hydrazone group, a carboxylic acid group or a salt thereof, a sulfonic acid or a salt thereof, a phosphoric acid or a salt thereof, a substituted or unsubstituted $C_1$-$C_{20}$ alkyl group, and a substituted or unsubstituted $C_1$-$C_{20}$ alkoxy group.

In an implementation, a compound represented by Formula 300 may be represented by Formula 300A, below.

<Formula 300A>

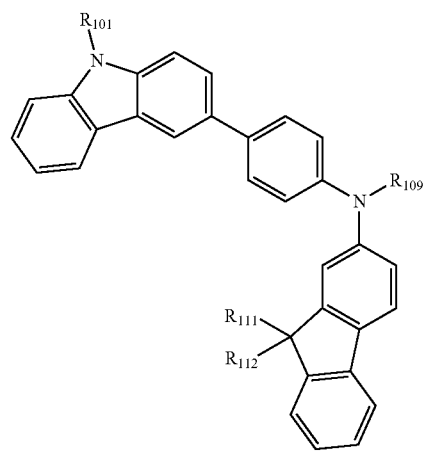

In Formula 300A, descriptions of $R_{101}$, $R_{111}$, $R_{112}$, and $R_{109}$ may be the same as described above.

For example, at least one layer of the HIL, the HTL, and the H-functional layer may include at least one of Compounds 301 to 320, below.

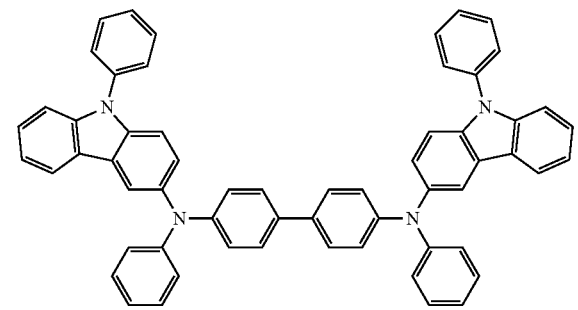

301

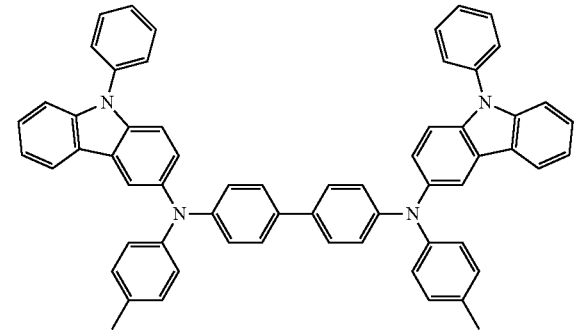

302

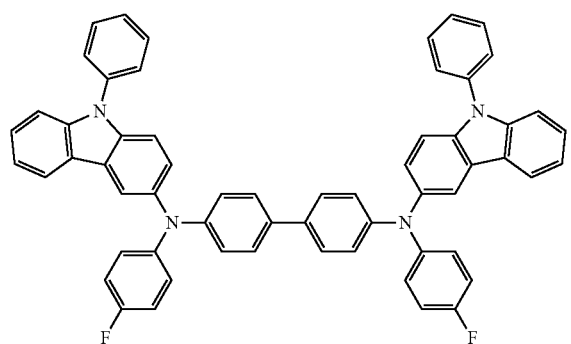
303
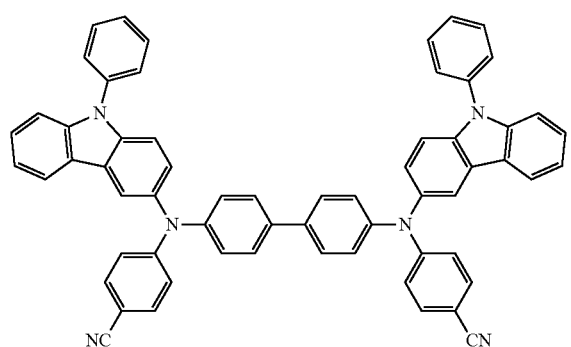
304
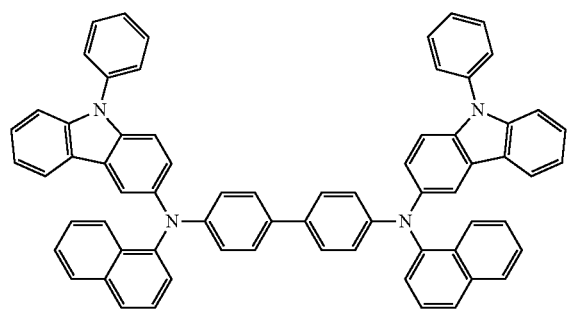
305
306
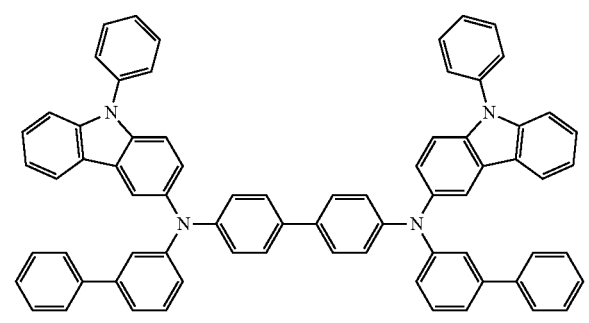
307
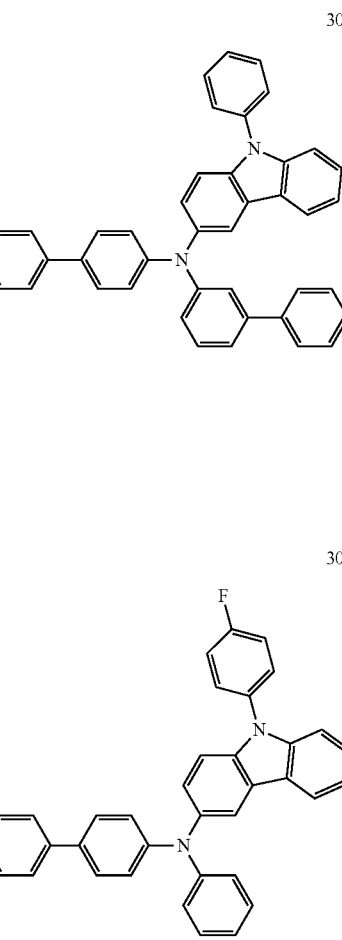
308
309

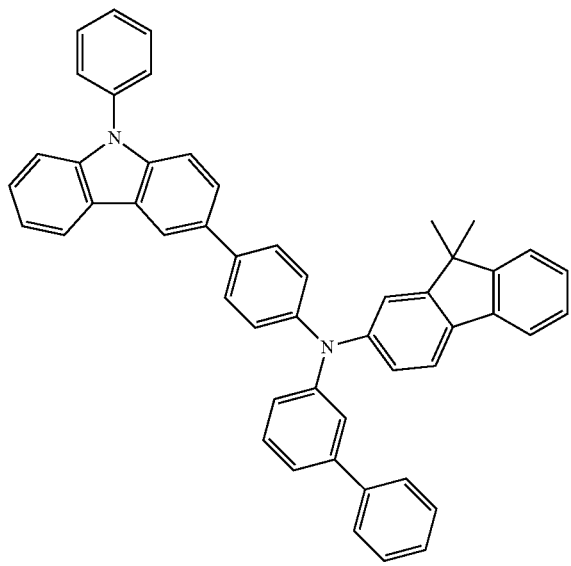
310
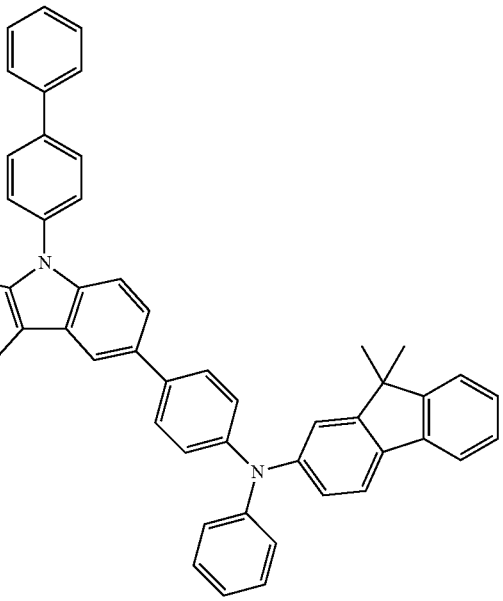
312
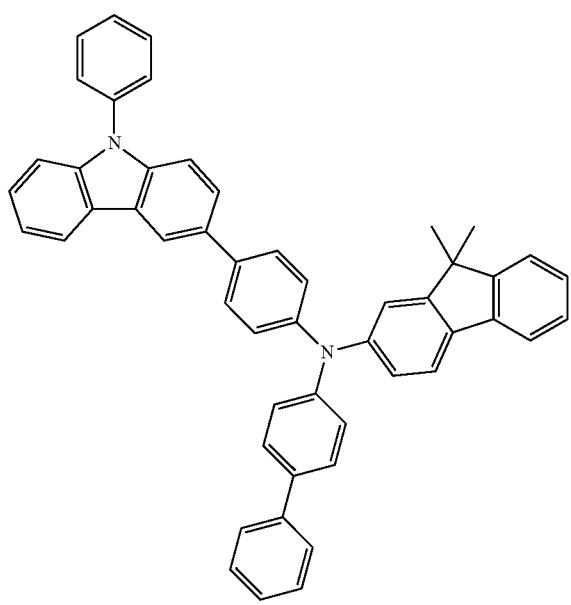
311
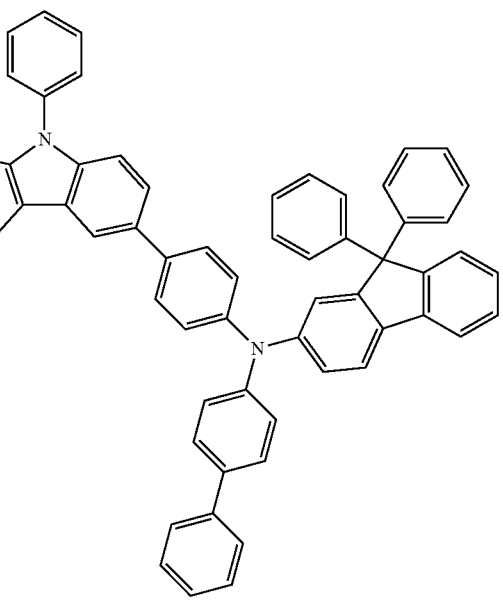
313

314
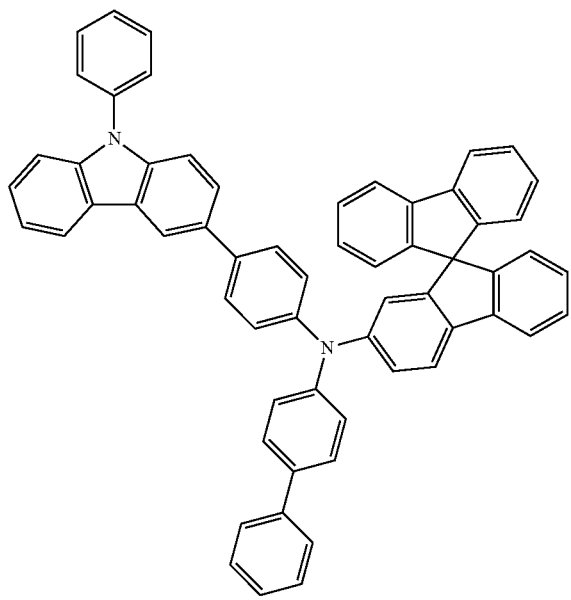
315
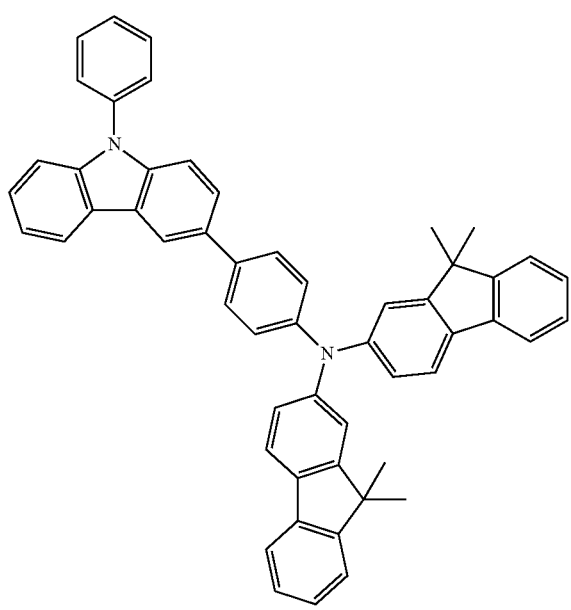
316
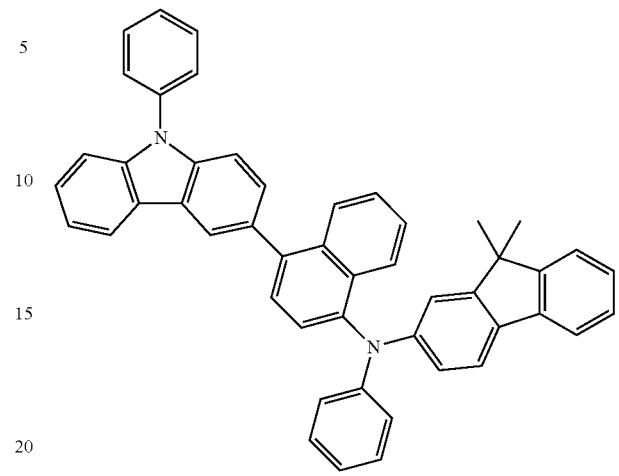
317
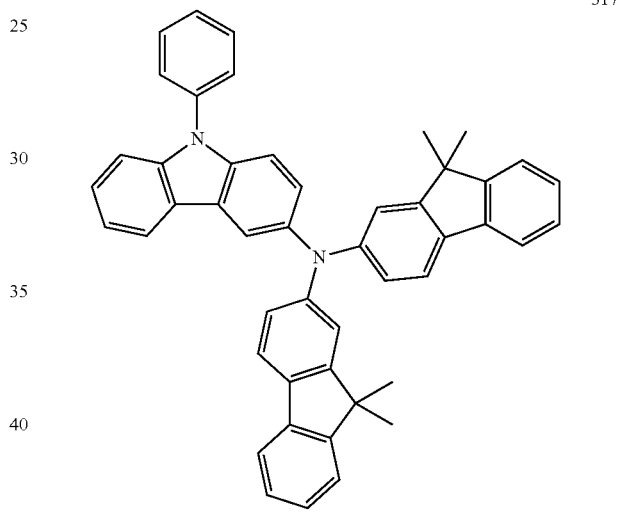
318
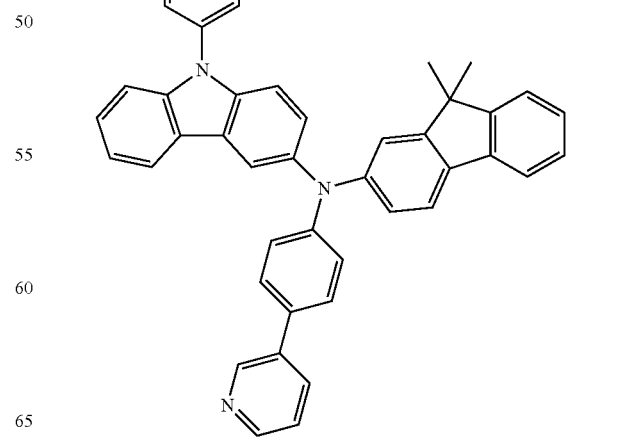

-continued

319

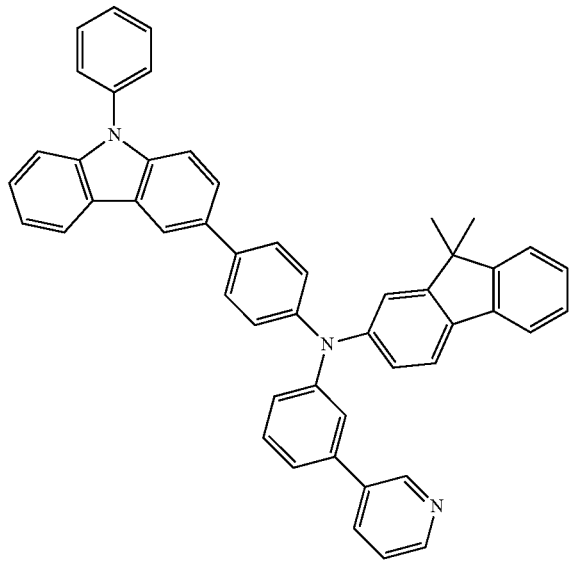

<Compound 200>

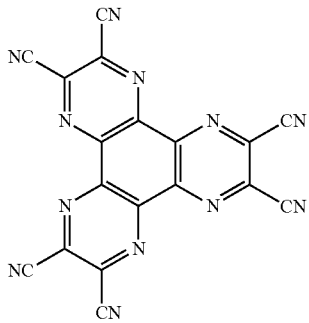

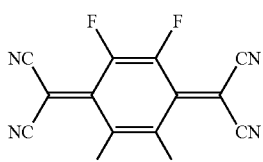

<F4-TCNQ>

320

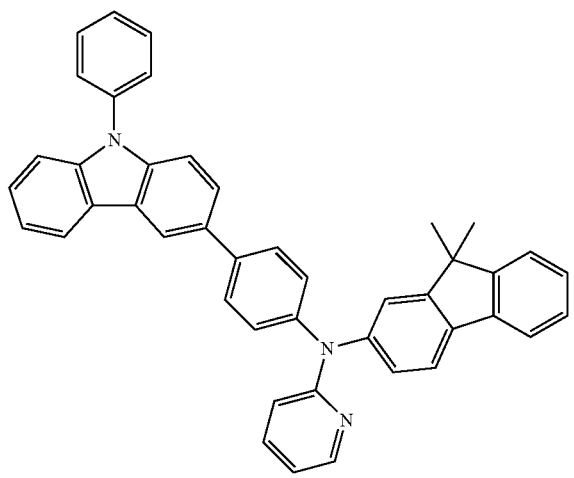

The hole transporting region may further include, in addition to such suitable hole injection materials and/or suitable hole transport materials, a charge-generation material to help improve conductivity of a film.

The charge-generating material may be, e.g., a p-dopant. The p-dopant may be one of quinone derivatives, metal oxides, and compounds with a cyano group. For example, examples of the p-dopant may include quinone derivatives, such as tetracyanoquinodimethane (TCNQ) and 2,3,5,6-tetrafluoro-tetracyano-1,4-benzoquinodimethane (F4-TCNQ); metal oxide, such as tungsten oxide and molybdenym oxide; and a cyano group-containing compound, such as Compound 200 below.

When the hole transporting region further includes a charge-generation material, the charge-generation material may be homogeneously or non-homogeneously dispersed in the hole transporting region.

The hole transporting region may further include a buffer layer between the HTL and the EML (or between the H-functional layer and the EML.

The buffer layer may help compensate for an optical resonance distance of light according to a wavelength of the light emitted from the EML, and thus may increase efficiency. The buffer layer may include a suitable hole injecting material or hole transporting material. In an implementation, the buffer layer may include the same material as one of the materials included in the HTL (or the H-functional layer) that underly the buffer layer.

The hole transporting region may include a condensed-cyclic compound represented by Formula 1. For example, the hole injection layer in the hole transporting region may include a condensed-cyclic compound represented by Formula 1.

Then, an emission layer (EML) may be formed on the hole transporting region by vacuum deposition, spin coating, casting, LB deposition, or the like. When the EML is formed using vacuum deposition or spin coating, the deposition and coating conditions may be similar to those for the formation of the HIL, though the conditions for deposition and coating may vary according to the material that is used to form the EML.

The EML may include a host and a dopant.

As the host, Alq$_3$, 4,4'-N,N'-dicarbazol-biphenyl (CBP), poly(n-vinylcarbazole) (PVK), 9,10-di(naphthalen-2-yl)anthracene (DNA), TCTA, 1,3,5-tris(N-phenylbenzimidazole2-yl)benzene (TPBI), 3-tert-butyl-9,10-di(naphth-2-yl) anthracene (TBADN), E3, distyryl arylene (DSA), dmCBP (illustrated below), Compounds 501 to 509 below, or the like may be used:

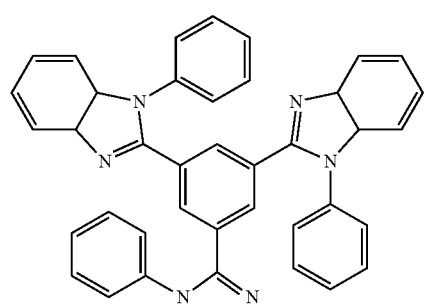
TPBI
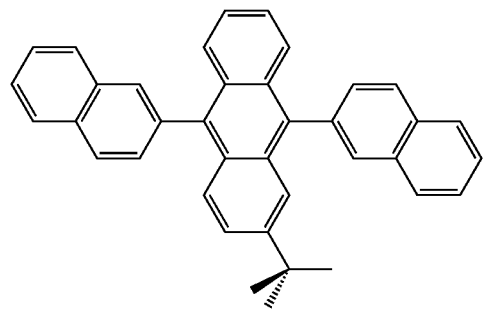
TBADN
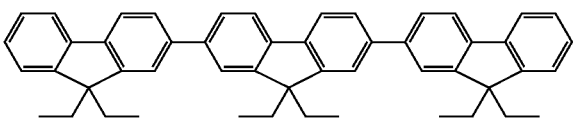
E3
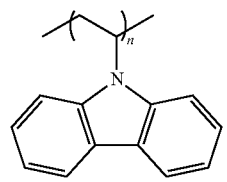
PVK
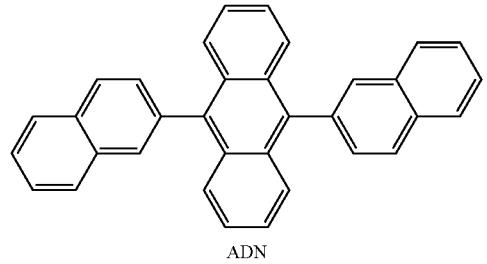
ADN
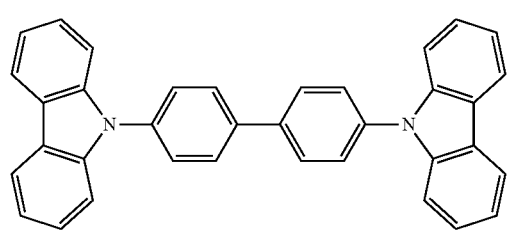
CBP
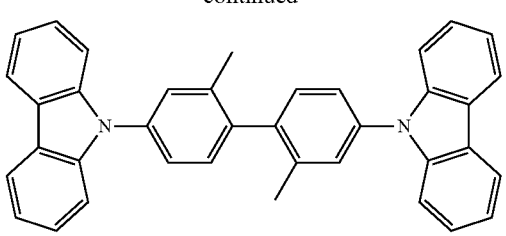
dmCBP
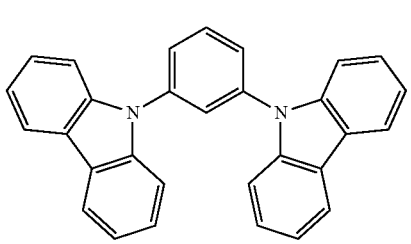
501
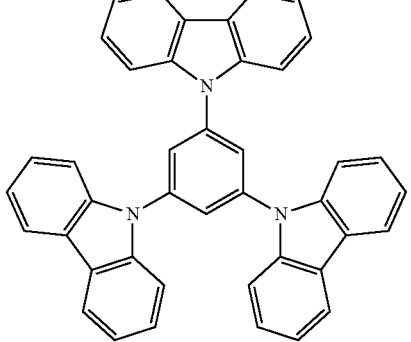
502
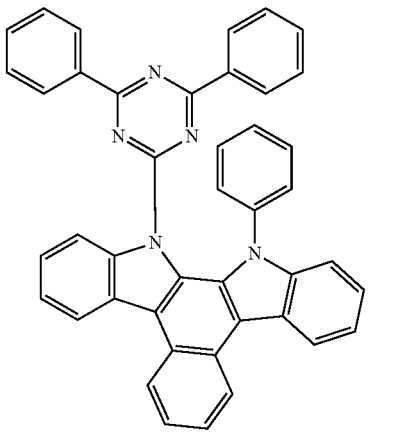
503

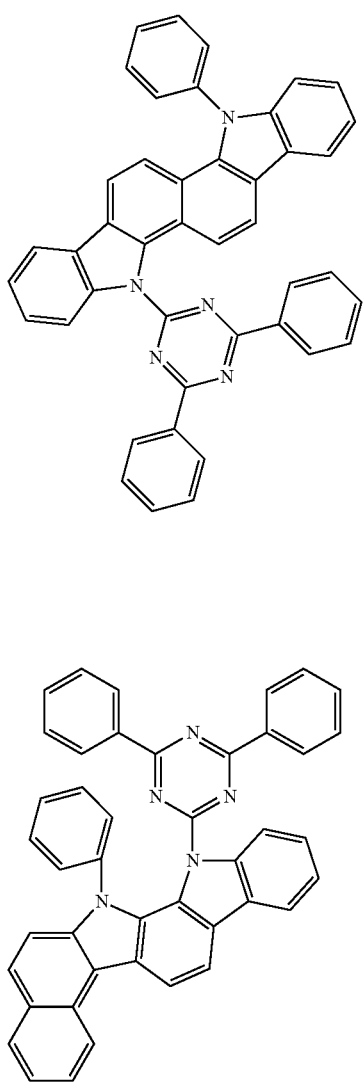
504
505
506
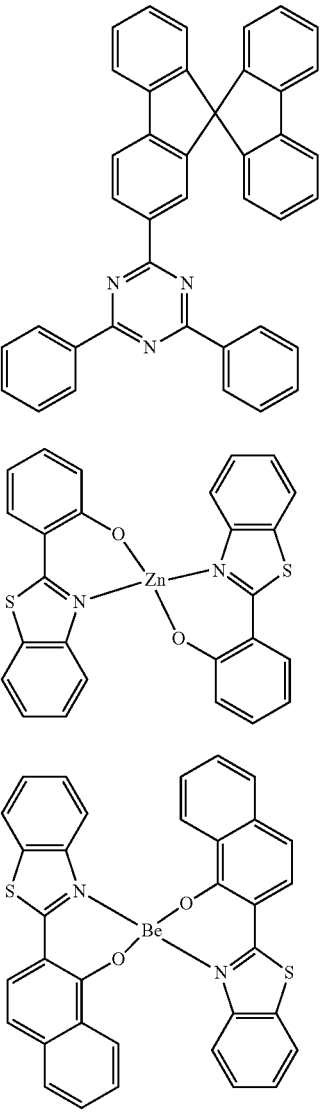
507
508
509
According to an embodiment, as the host, an anthracene-based compound represented by Formulae 400 below may be used.
<Formula 400>
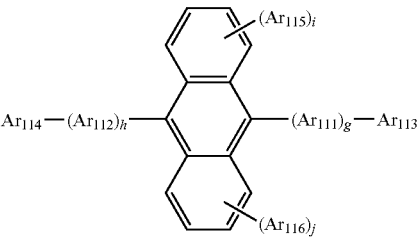
Ar$_{111}$ and Ar$_{112}$ in Formula 400 may be each independently a substituted or unsubstituted C$_6$-C$_{60}$ arylene group; and Ar$_{113}$ to Ar$_{116}$ may be each independently a substituted or unsubstituted C$_1$-C$_{10}$ alkyl group, or a substituted or unsubstituted $C_6$-$C_{60}$ aryl group; and g, h, I, and j may be each independently an integer of 0 to 4.

For example, $Ar_{111}$ and $Ar_{112}$ in Formula 400 may be selected from:

a phenylene group, a naphthylene group, a phenanthrenylene group, and a pyrenylene group; and a phenylene group, a naphthylene group, a phenanthrenylene group, and a pyrenylene group, each substituted with at least one substituent selected from a phenyl group, a naphthyl group, and an anthracenyl group.

In Formula 400, g, h, i and j may be each independently 0, 1, or 2.

In Formula 400, $Ar_{113}$ to $Ar_{116}$ may be each independently selected from:

a $C_1$-$C_{10}$ alkyl group substituted with at least one of a phenyl group, a naphthyl group, and an anthracenyl group;

a phenyl group, a naphthyl group, an anthracenyl group, a pyrenyl group, a phenanthrenyl group, and a fluorenyl group;

a phenyl group, a naphthyl group, an anthracenyl group, a pyrenyl group, a phenanthrenyl group, and a fluorenyl group, each substituted with at least one of a deuterium atom, a halogen atom, a hydroxyl group, a cyano group, a nitro group, an amino group, an amidino group, a hydrazine group, a hydrazone group, a carboxylic acid group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a pyrenyl group, a phenanthrenyl group, and a fluorenyl group; and

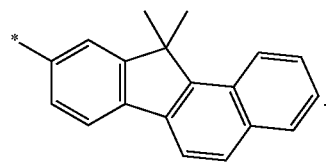 [SMILES: *c1ccc2c(c1)C(C)(C)c1c-2ccc2ccccc12]

For example, the anthracene-based compound represented by Formulae 400 may be any one of the compounds below.

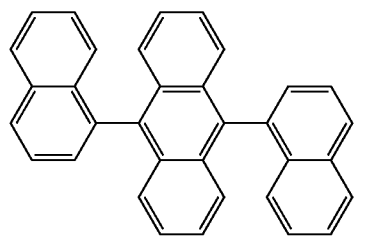

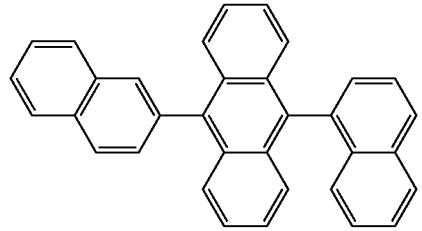

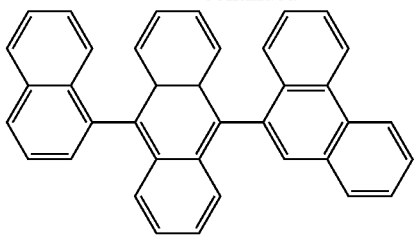

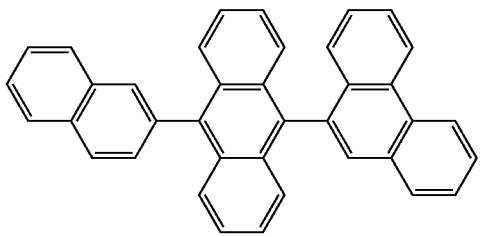

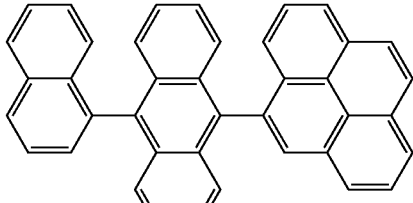

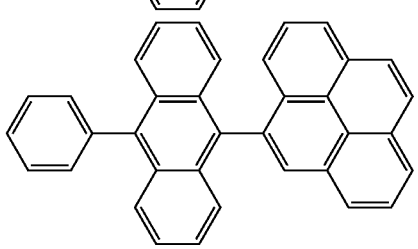

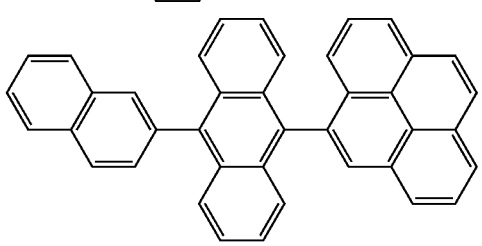

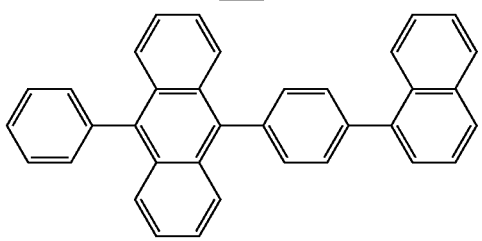

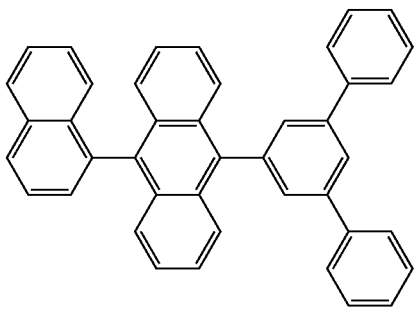

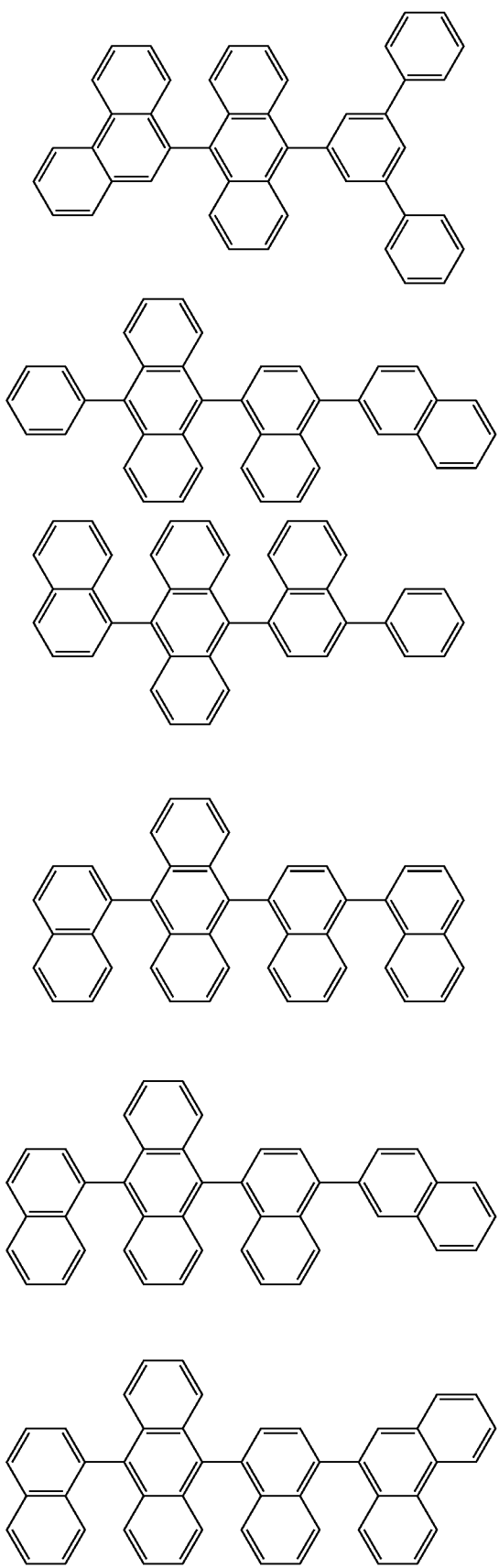
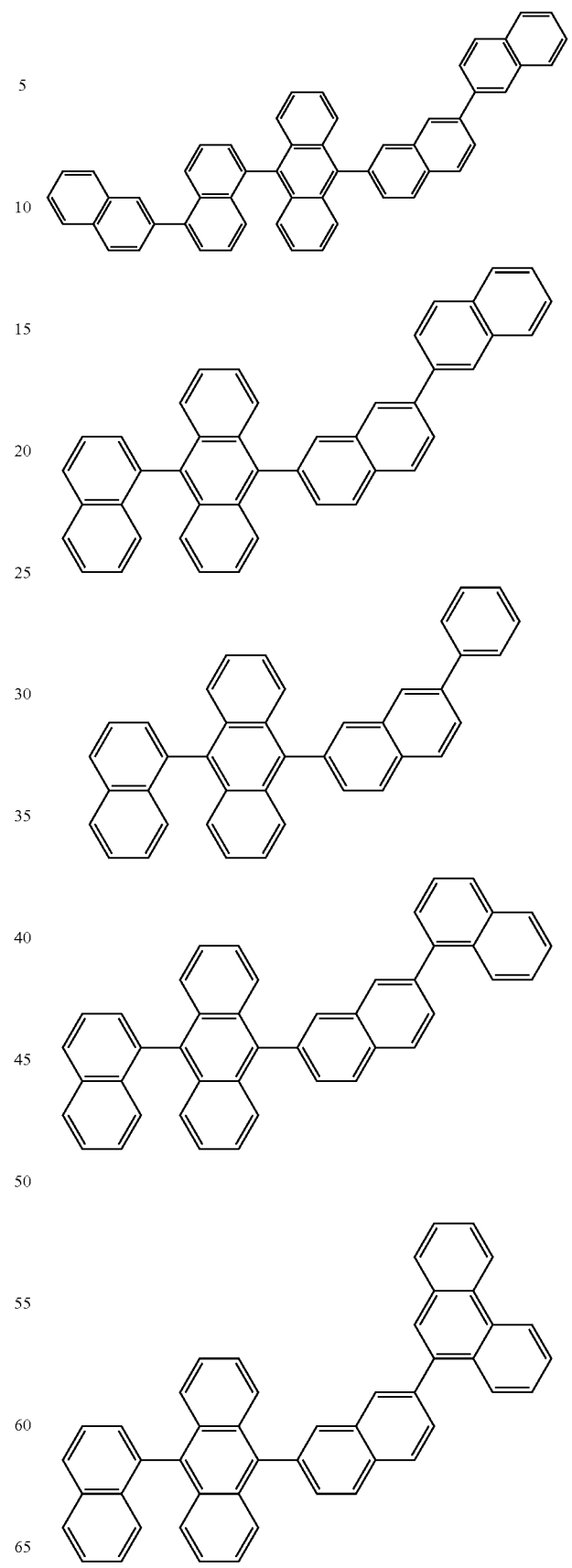

-continued
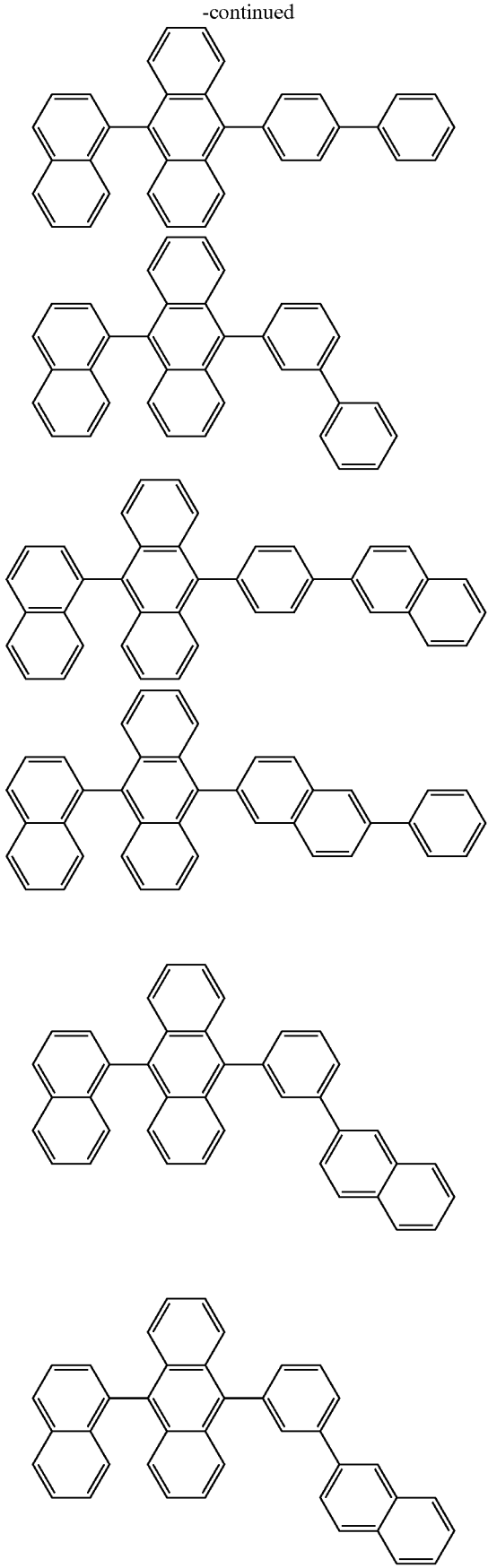
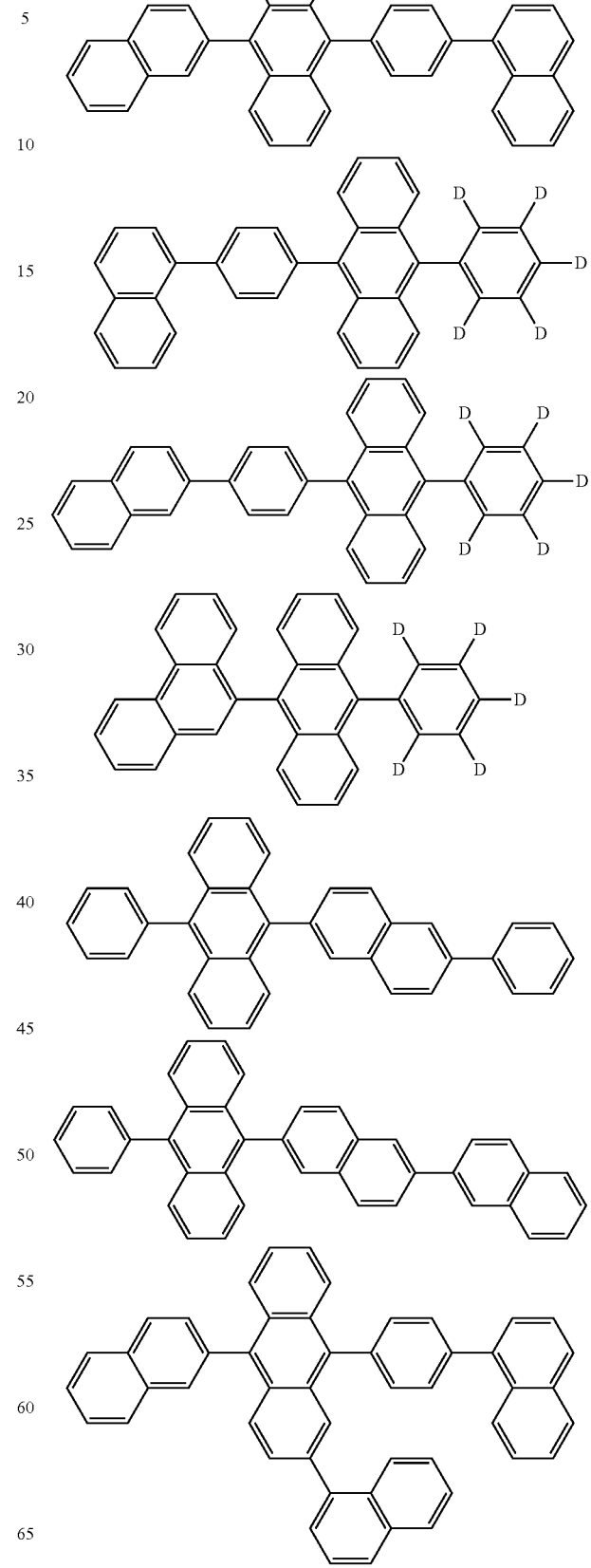

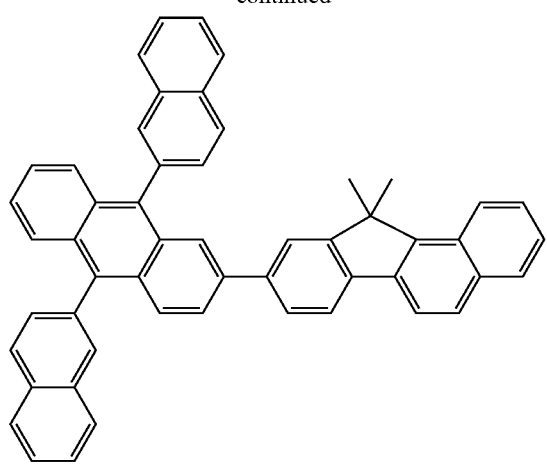
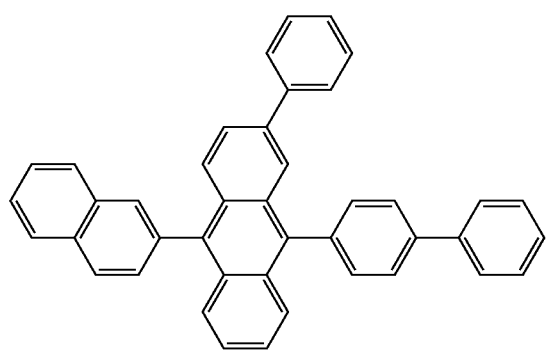
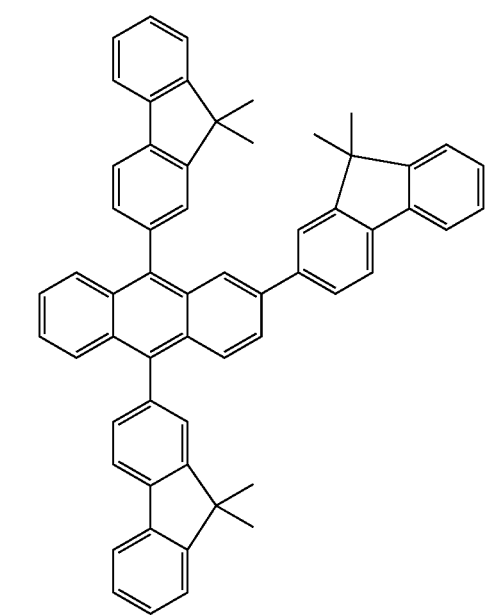
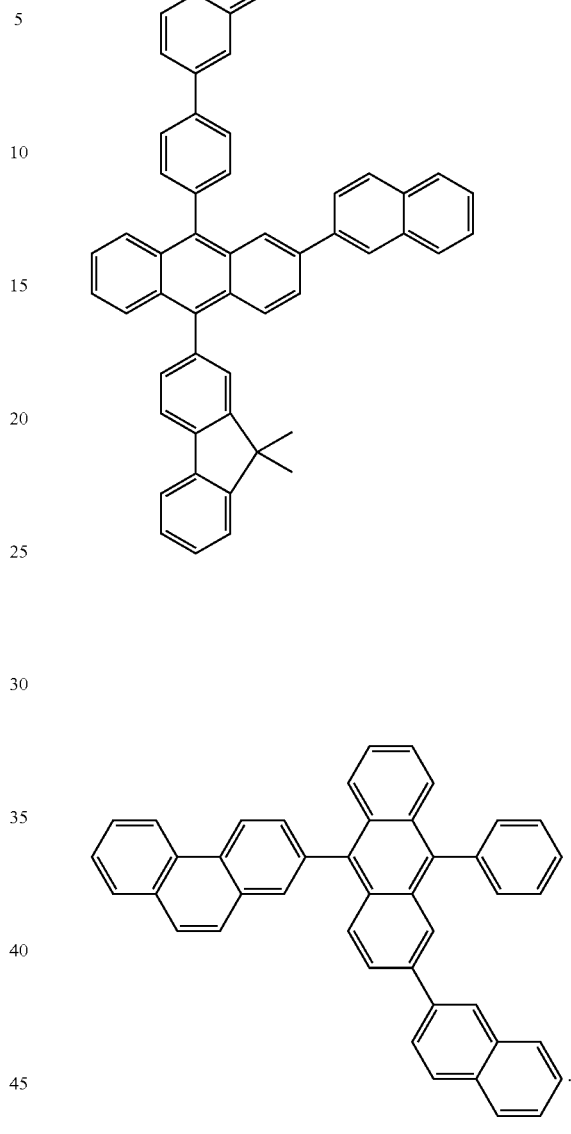
According to another embodiment, as the host, an anthracene-based compound represented by Formulae 401 below may be used.
<Formula 401>
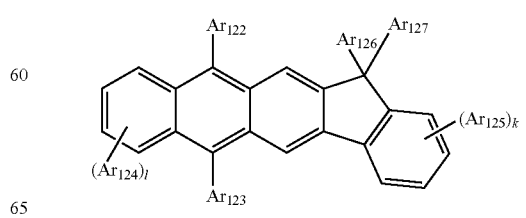

A detailed description of $Ar_{122}$ to $Ar_{125}$ in Formula 401 may be further understood with reference to the description of $Ar_{113}$ in Formulae 400.

$Ar_{126}$ and $Ar_{127}$ in Formula 401 may be each independently a $C_1$-$C_{10}$ alkyl group (e.g., a methyl group, an ethyl group, or a propyl group).

In Formula 401, k and l may be each independently an integer of 0 to 4. For example, k and l may be an integer of 0, 1, or 2.

For example, the anthracene-based compound represented by Formulae 401 may be one of compounds below.

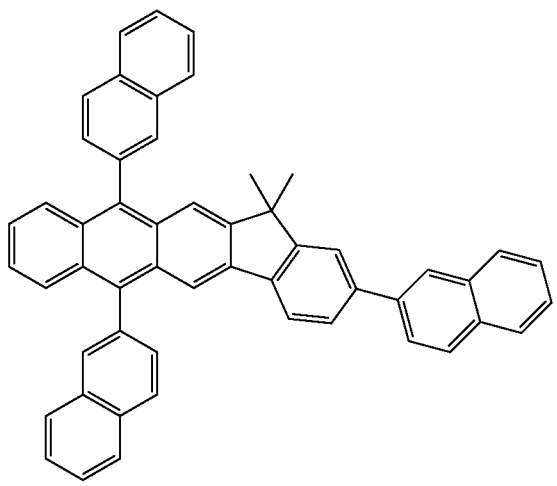

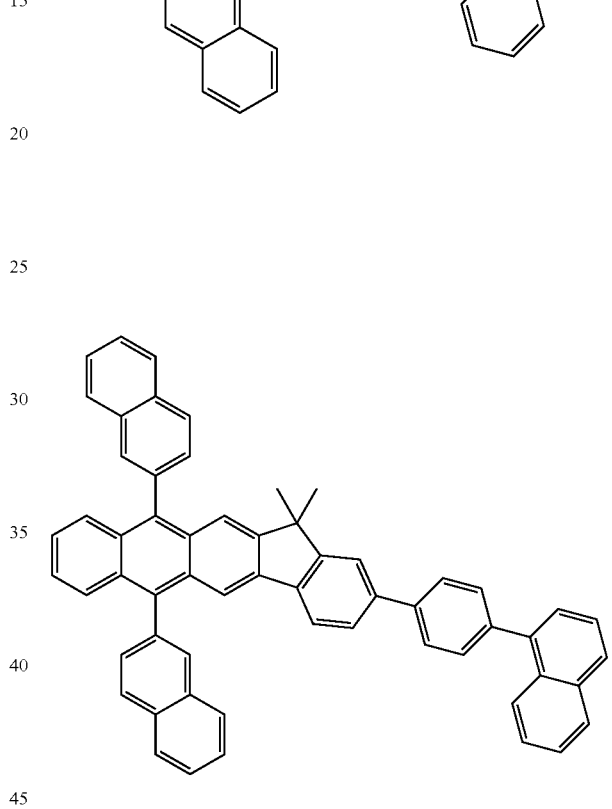

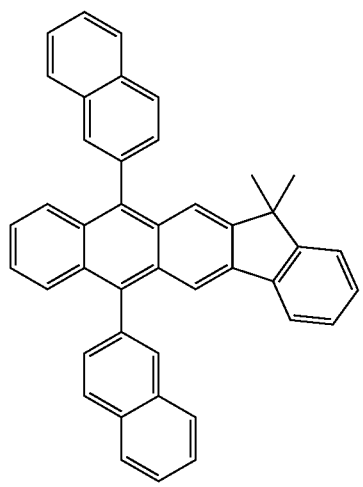

When the organic light-emitting device is a full color organic light-emitting device, the emission layer may be patterned into a red emission layer, a green emission layer, and a blue emission layer. According to another embodiment, due to the inclusion of a stack structure including a red EML, a green EML, and/or a blue EML, the EML may emit white light.

The dopant in the EML may include the condensed-cyclic compound represented by Formula 1. In this regard, the condensed-cyclic compound may act as a fluorescent dopant that emits light according to an emission mechanism. For example, the condensed-cyclic compound may act as a fluorescent dopant emitting blue light.

The emission layer may include a dopant described below in addition to a condensed-cyclic compound represented by Formula 1.

For example, compounds illustrated below may be used as a blue dopant.

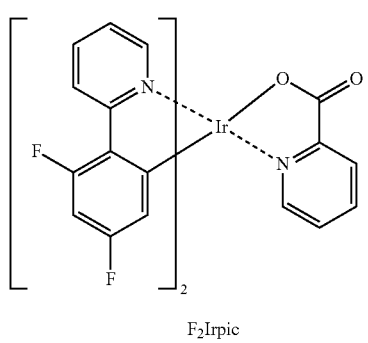
F2Irpic
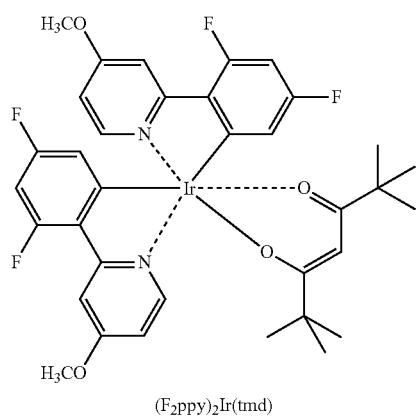
(F2ppy)2Ir(tmd)
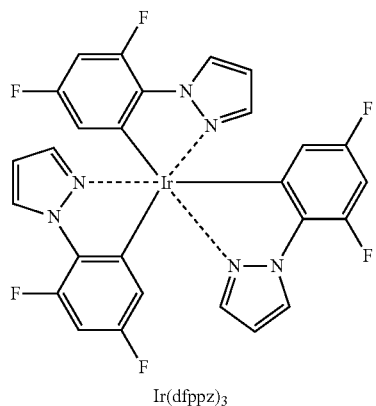
Ir(dfppz)3
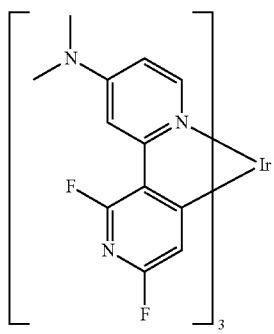
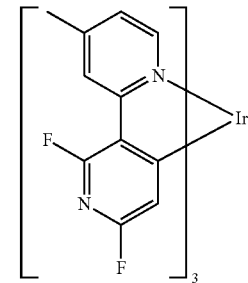
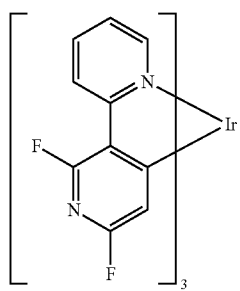
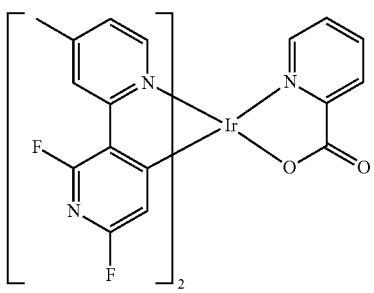
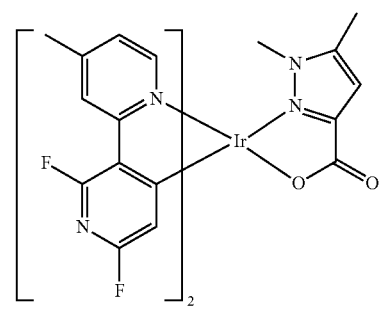
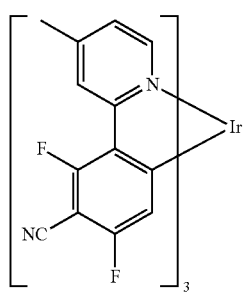
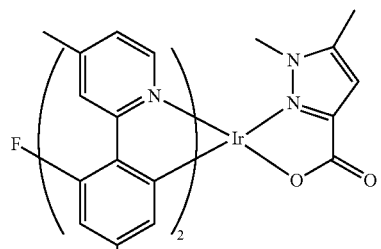
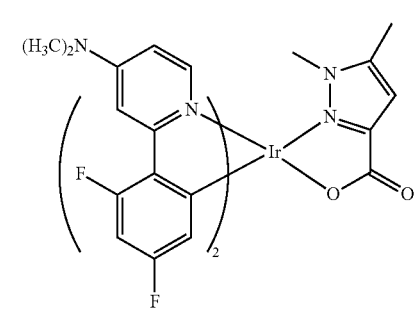
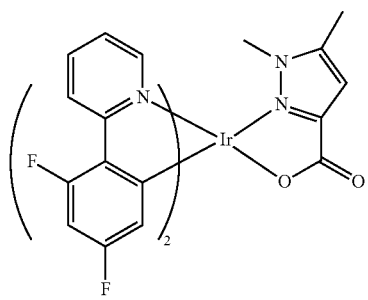
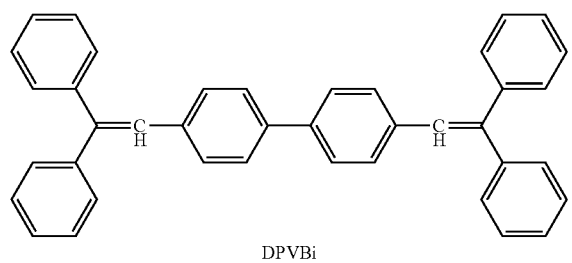
DPVBi

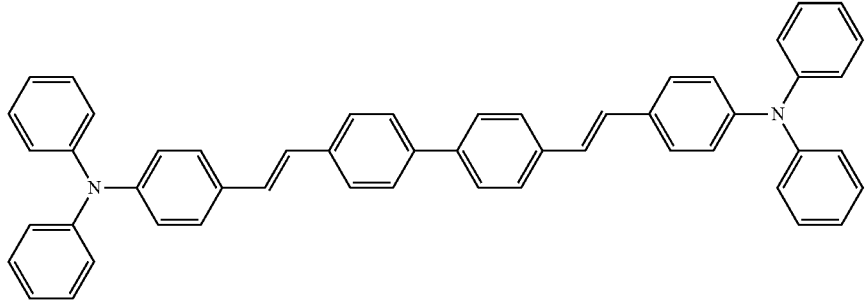
DPAVBi
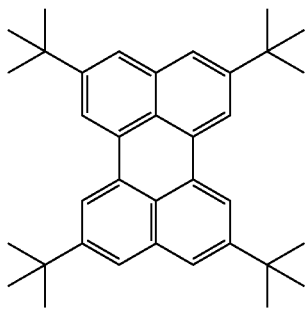
TBPe
For example, compounds illustrated below may be used as a red dopant. According to another embodiment, DCM or DCJTB may be used as the red dopant.
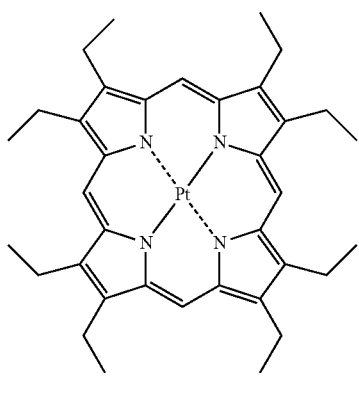
PtOEP
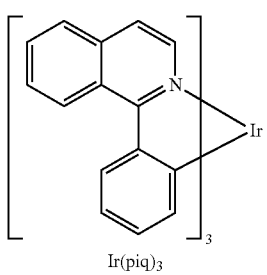
Ir(piq)₃
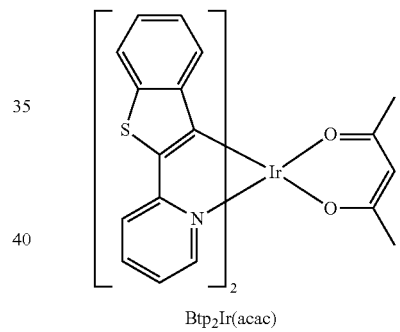
Btp₂Ir(acac)
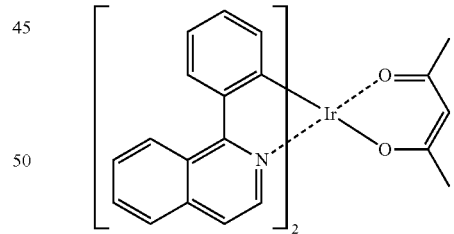
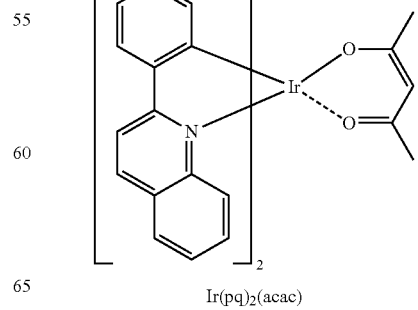
Ir(pq)₂(acac)

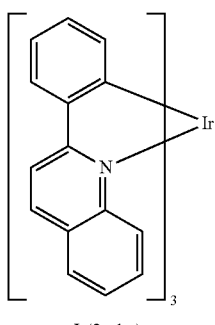
Ir(2-phq)₃
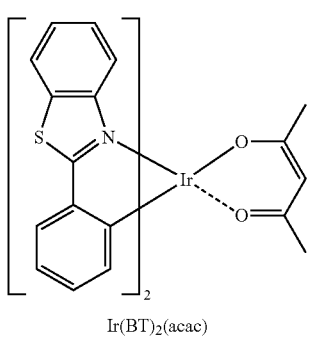
Ir(BT)₂(acac)
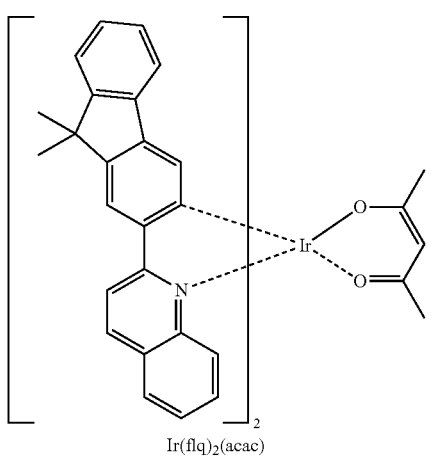
Ir(flq)₂(acac)
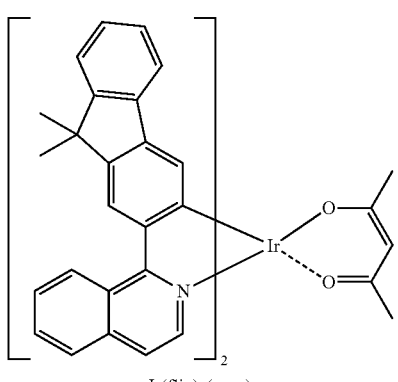
Ir(fliq)₂(acac)
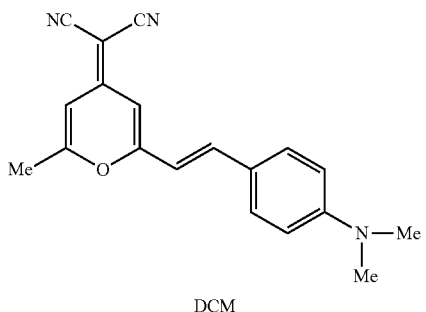
DCM
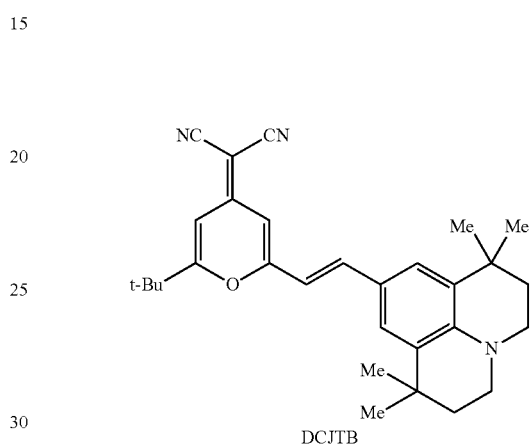
DCJTB
For example, compounds illustrated below may be used as a green dopant. For example, C545T may be used as the green dopant.
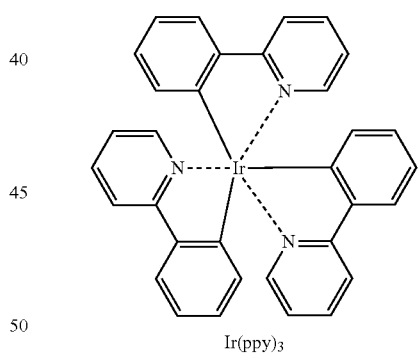
Ir(ppy)₃
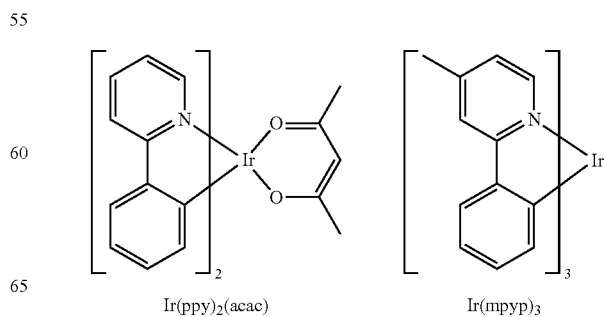
Ir(ppy)₂(acac)     Ir(mpyp)₃

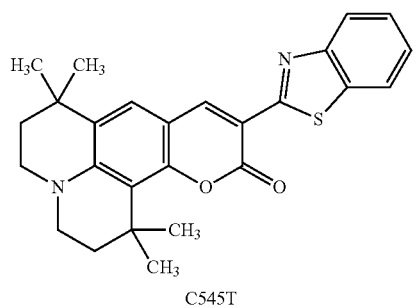
C545T
Examples of the dopant that may be used in the EML may include complexes represented by the following formulae.
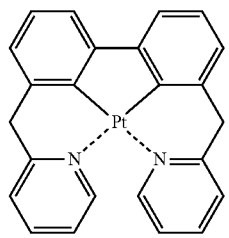
D5
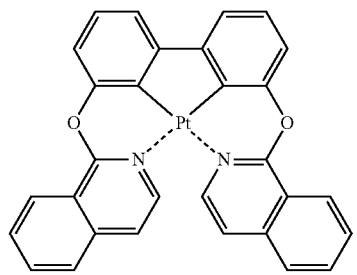
D6
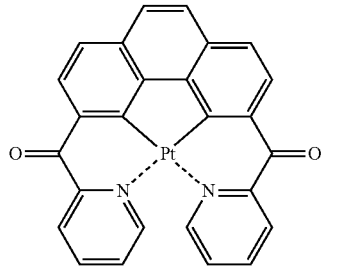
D7
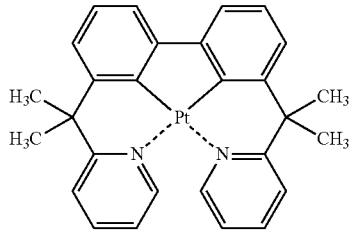
D8
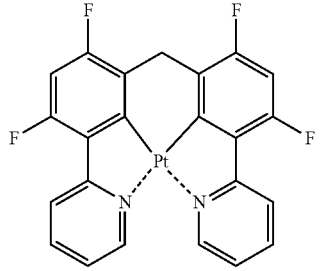
D9
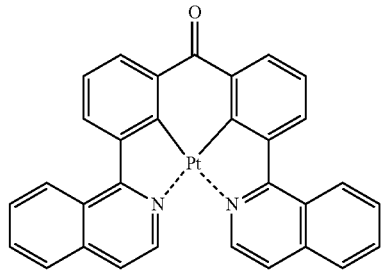
D10
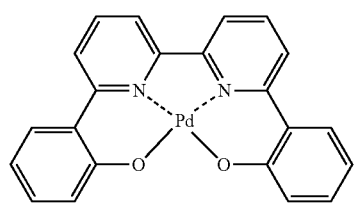
D1
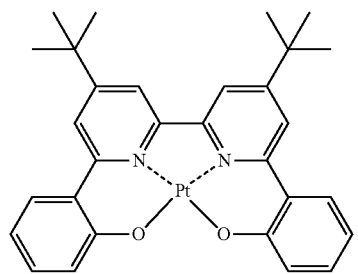
D2
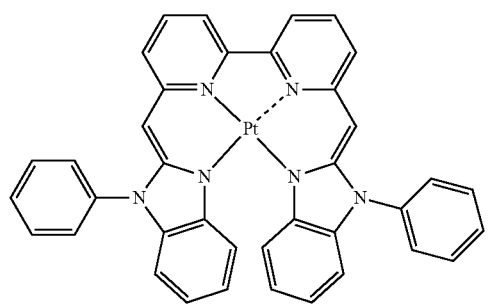
D3
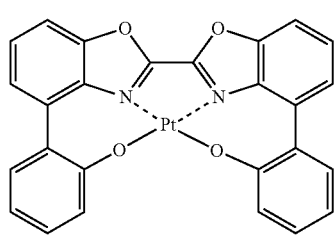
D4

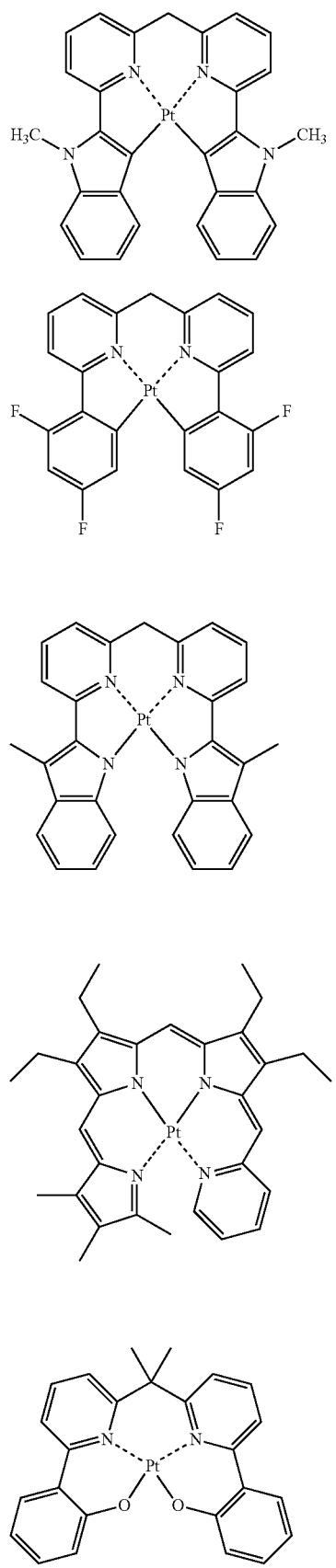
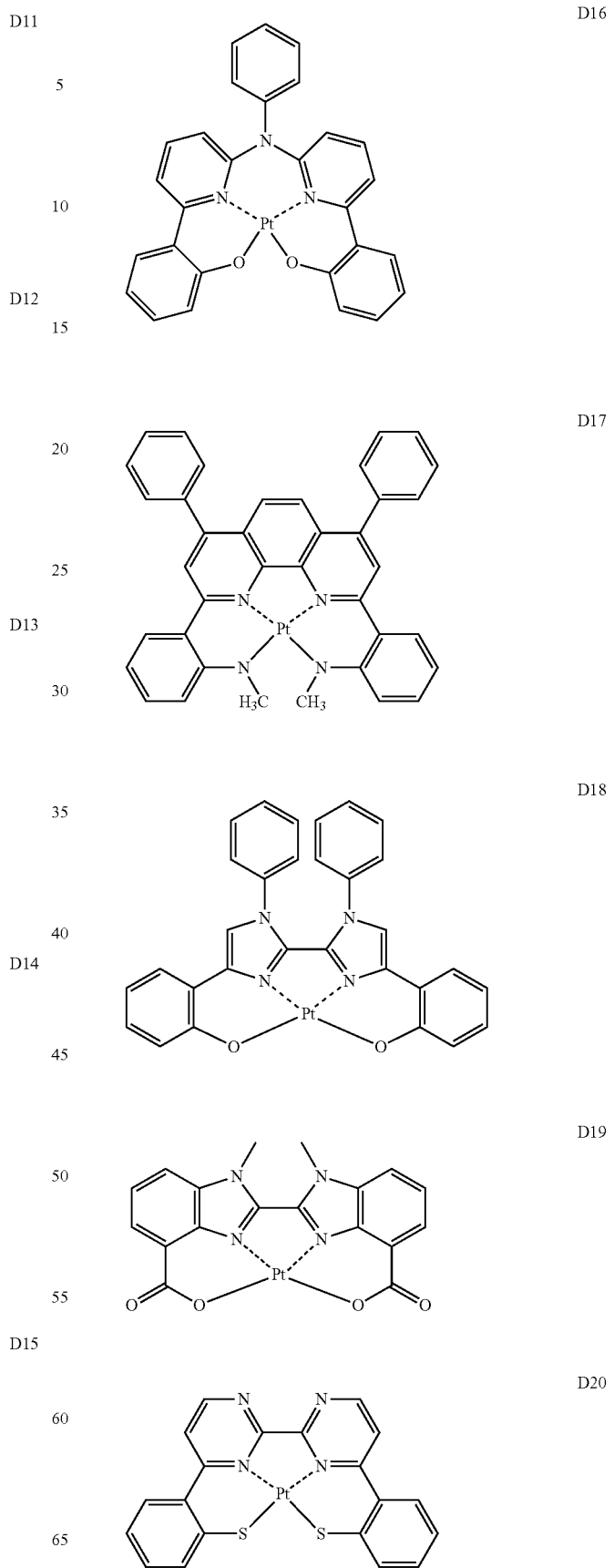

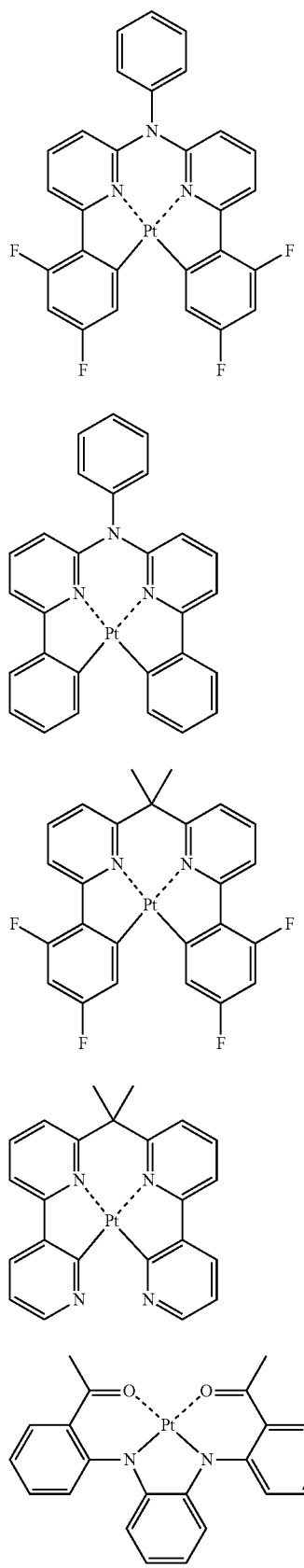
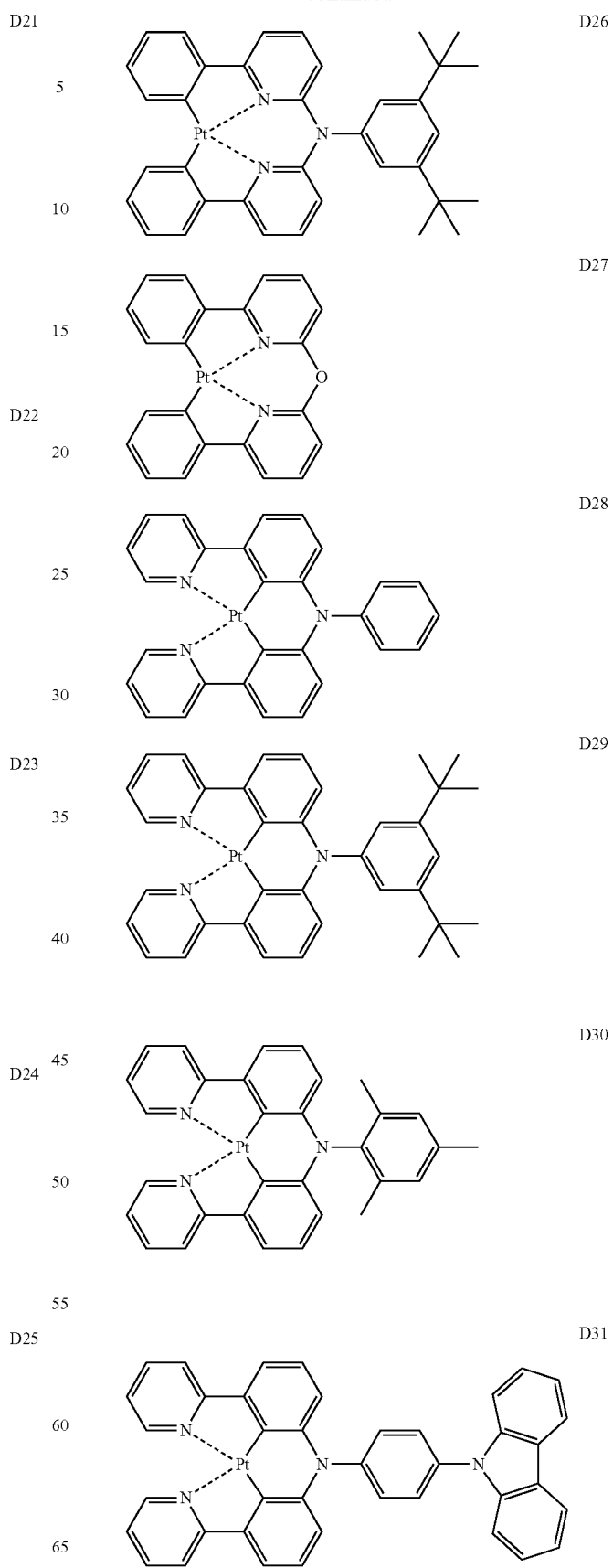

-continued
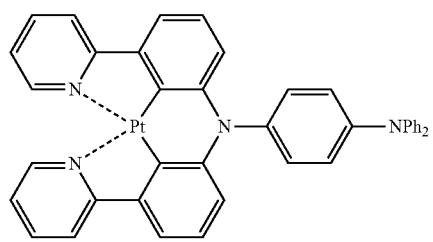
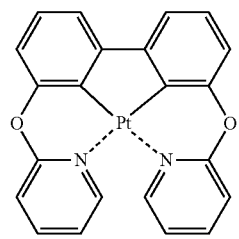
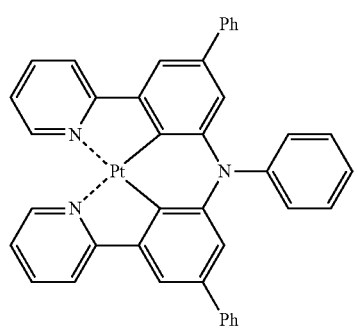
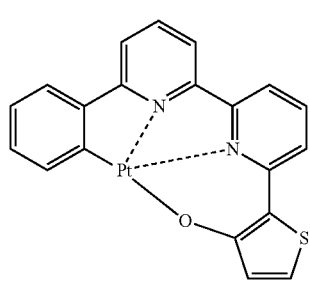
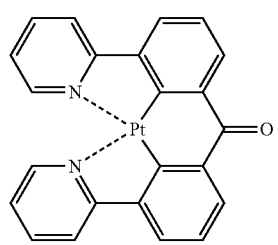
-continued
D32
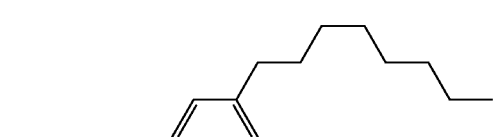
D33
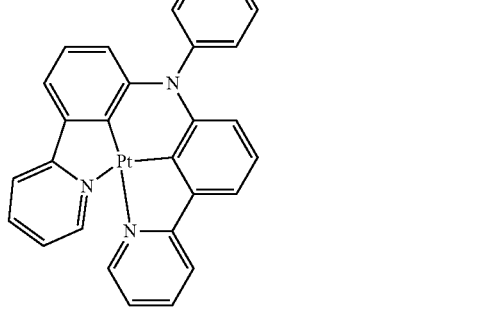
D34
D38
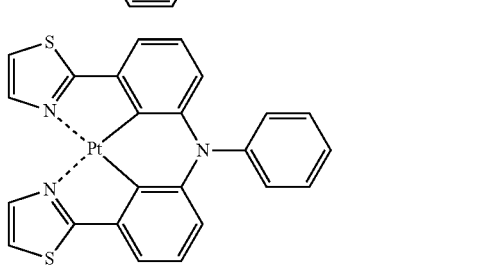
D39
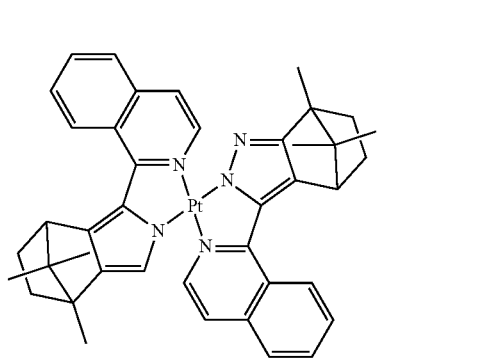
D35
D40
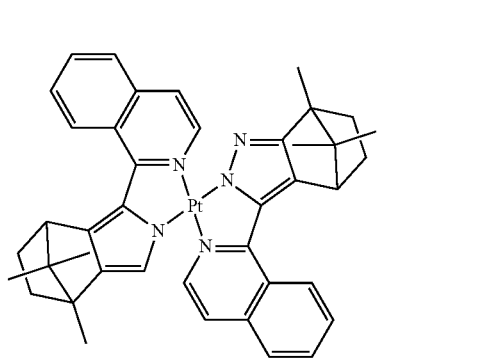
D36
D41
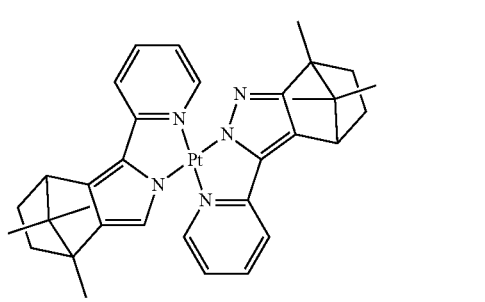

-continued
D42 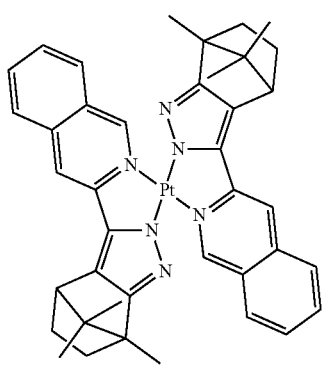
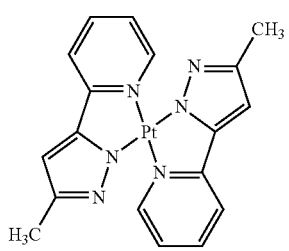
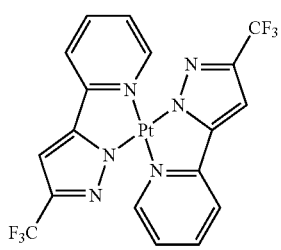
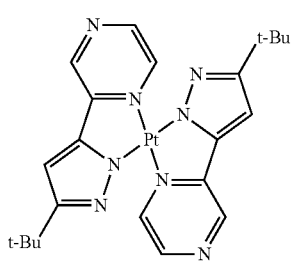
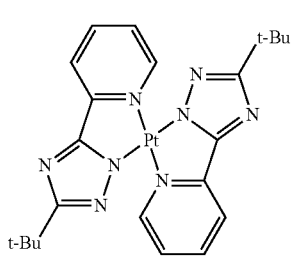
-continued
D47 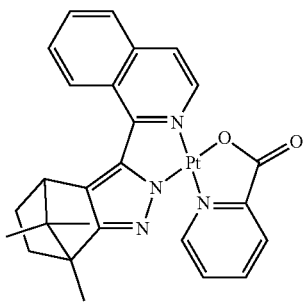
D48 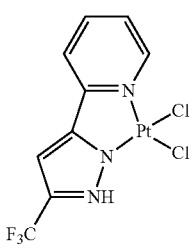
D49 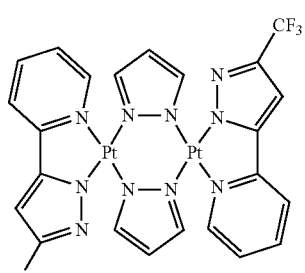
D50 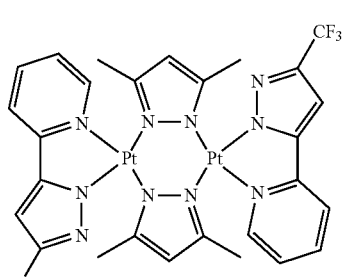
Examples of the dopant that may be used in the EML may include Pt complexes represented by the following formulae.
D46 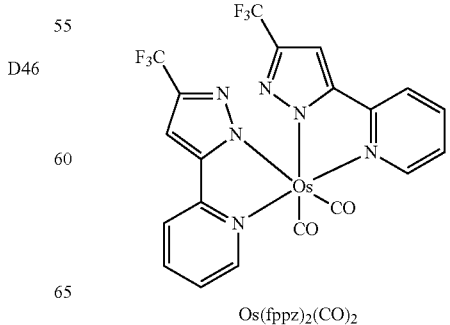
Os(fppz)$_2$(CO)$_2$

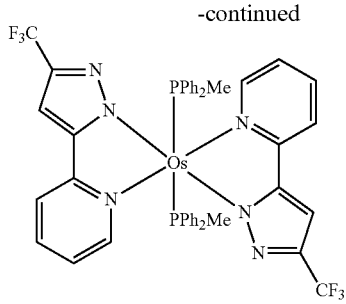

Os(fppz)₂(PPh₂Me)₂

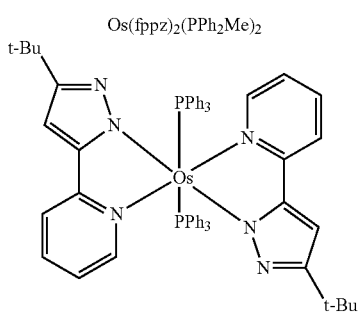

Os(bppz)₂(PPh₃)₂

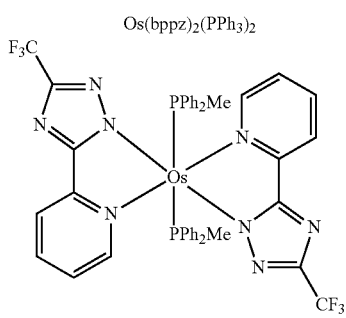

Os(fptz)₂(PPh₂Me)₂

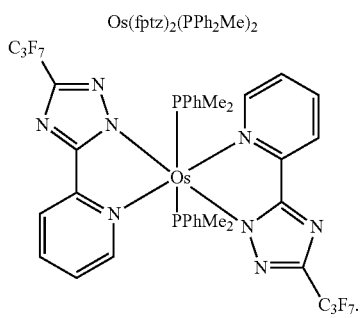

Os(hptz)₂(PPhMe₂)₂

When the EML includes both a host and a dopant, the amount of the dopant may be, e.g., about 0.01 parts to about 15 parts by weight, based on 100 parts by weight of the host.

A thickness of the HIL may be in a range of about 100 Å to about 10,000 Å, e.g., about 200 Å to about 600 Å. When the thickness of the EML is within these ranges, the EML may have improved light emitting ability without a substantial increase in driving voltage.

Next, an electron transport layer (ETL) may be formed on the EML using various methods, e.g., by vacuum deposition, spin coating, casting, or the like. When the ETL is formed using vacuum deposition or spin coating, the deposition and coating conditions may be similar to those for the formation of the HIL, though the conditions for deposition and coating may vary according to the material that is used to form the ETL.

The electron transport layer material may stably transport electrons injected from the second electrode and thus may include a suitable electron transporting material. Examples of the electron transporting material may include quinolin derivatives, e.g., tris(8-quinolate) aluminum (Alq₃), TAZ, Balq, beryllium bis(benzoquinolin-10-olate) (Bebq₂), ADN, Compound 201, Compound 202, and TmPyPB.

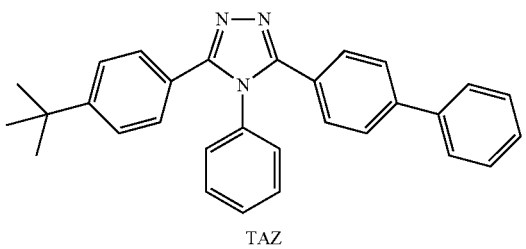

TAZ

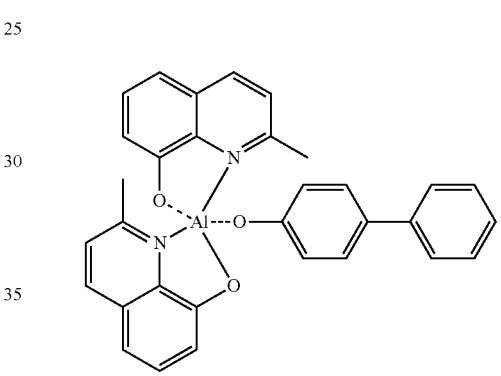

BAlq

<Compound 201>

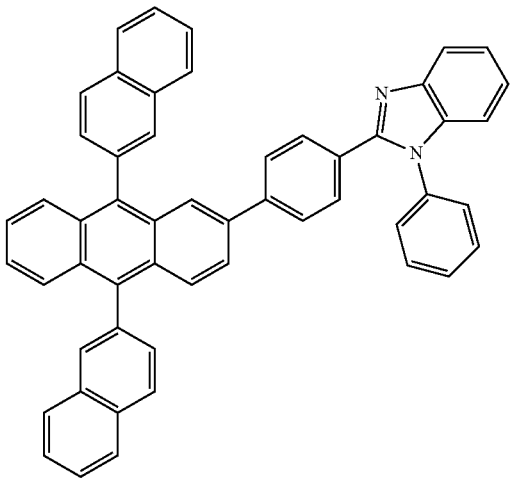

<Compound 202>

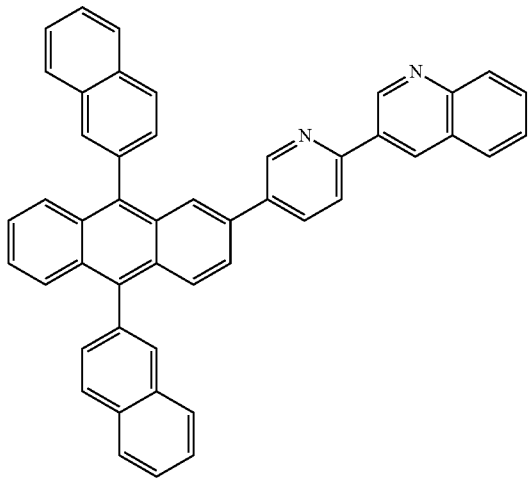

<Compound 203>

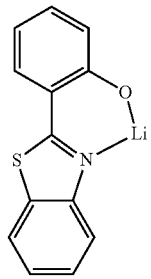

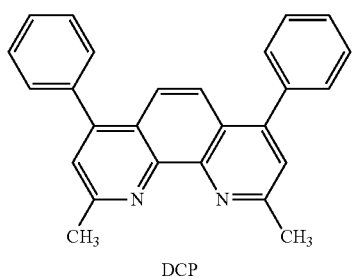

DCP

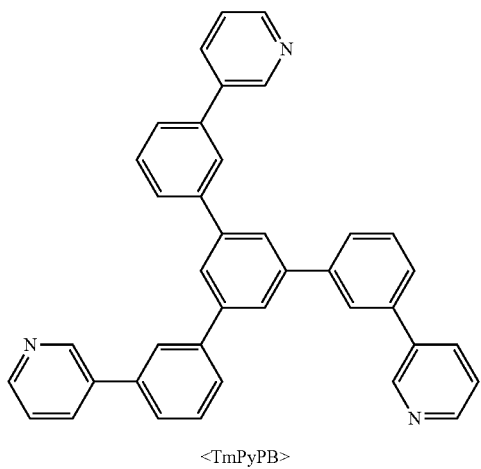

<TmPyPB>

A thickness of the ETL may be in a range of about 100 Å to about 1,000 Å, e.g., about 150 Å to about 500 Å. When the thickness of the ETL is within these ranges, the ETL may have satisfactory electron transporting ability without a substantial increase in driving voltage.

The ETL may further include, in addition to the condensed-cyclic compound, a metal-containing material.

The metal-containing material may include a lithium (Li) complex. Examples of the Li complex may include lithium quinolate (LiQ) and Compound 203 below.

Then, an EIL, which facilitates injection of electrons from the second electrode, may be formed on the ETL. A suitable electron-injecting material may be used to form the EIL.

Examples of materials for forming the EIL may include LiF, NaCl, CsF, Li$_2$O, and BaO. Deposition conditions of the EIL, may be similar to those for the formation of the HIL, although the conditions may vary according to a material that is used to form the EIL.

A thickness of the EIL may be in a range of about 1 Å to about 100 Å, e.g., about 3 Å to about 90 Å. When the thickness of the EIL is within these ranges, the EIL may have satisfactory electron transporting ability without a substantial increase in driving voltage.

The second electrode 17 may be disposed on the organic layer 15. The second electrode 17 may be a cathode, which is an electron injecting electrode. A material forming the second electrode may include, e.g., a metal, an alloy, an electrically conductive compound, which have a low-work function, or a mixture thereof. In this regard, the second electrode 17 may be formed of lithium (Li), magnesium (Mg), aluminum (Al), aluminum (Al)-lithium (Li), calcium (Ca), magnesium (Mg)-indium (In), magnesium (Mg)-silver (Ag), or the like, and may be formed as a thin film type transmission electrode. In an implementation, to manufacture a top-emission light-emitting device, the transmission electrode may be formed of indium tin oxide (ITO) or indium zinc oxide (IZO).

Herein, an organic light-emitting device 10 according to an embodiment has been described with reference to FIG. 1.

In addition, when the EML is formed using a phosphorescent dopant, to help prevent diffusion of triplet excitons or holes toward the ETL, a hole blocking layer (HBL) may be formed between the HTL and the EML or between the H-functional layer and the EML by a method, for example, vacuum deposition, spin coating, casting, LB, or the like. When the HBL is formed using vacuum deposition or spin coating, the deposition and coating conditions may be similar to those for the formation of the HIL, though the conditions for deposition and coating may vary according to the material that is used to form the HBL. A suitable hole-blocking material may be used. Examples of hole-blocking materials may include oxadiazole derivatives, triazole derivatives, and phenanthroline derivatives. For example, BCP illustrated below may be used as a material for the HBL.

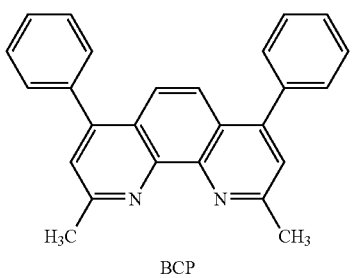

BCP

A thickness of the HBL may be in a range of about 20 Å to about 1,000 Å, e.g., about 30 Å to about 300 Å. When the thickness of the HBL is within these ranges, the HBL may have improved hole blocking ability without a substantial increase in driving voltage.

The organic light-emitting device may be included in an organic light-emitting device. Accordingly, the embodiments may provide an organic light-emitting device including the organic light-emitting device and a transistor. The transistor may include an active layer, source and drain electrodes, a gate electrode, and a gate insulating film, and at least one of a first electrode and a second electrode of the organic light-emitting device may be electrically connected to one of the source and drain electrodes of the transistor. The active layer of the transistor may be selected from suitable active layers formed of amorphous silicon, crystalline silicon, an oxide semiconductor, an organic compound semiconductor.

The unsubstituted $C_1$-$C_{60}$ alkyl group (or $C_1$-$C_{60}$ alkyl group) used herein may be a $C_1$-$C_{60}$ linear or branched alkyl group, such as methyl, ethyl, propyl, isobutyl, sec-butyl, pentyl, iso-amyl, or hexyl, and at least one substituent of the substituted $C_1$-$C_{60}$ alkyl group may be selected from:

a deuterium atom, a halogen atom, a hydroxyl group, a cyano group, a nitro group, an amino group, an amidino group, a hydrazine group, a hydrazone group, a carboxylic acid group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one of a deuterium atom, a halogen atom, a hydroxyl group, a cyano group, a nitro group, an amino group, an amidino group, a hydrazine group, a hydrazone group, a carboxylic acid group or a salt thereof, a sulfonic acid or a salt thereof, and a phosphoric acid or a salt thereof;

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group;

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group, each substituted with at least one of a deuterium atom, a halogen atom, a hydroxyl group, a cyano group, a nitro group, an amino group, an amidino group, a hydrazine group, a hydrazone group, a carboxylic acid group or a salt thereof a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a fluorenyl group, a dimethylfluorenyl group, a phenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group; and —$N(Q_{11})(Q_{12})$ and —$Si(Q_{11})(Q_{12})(Q_{13})$ (in which, $Q_{11}$ and $Q_{12}$ are each independently a $C_6$-$C_{60}$ aryl group or a $C_2$-$C_{60}$ heteroaryl group, and $Q_{13}$ to $Q_{15}$ are each independently a $C_1$-$C_{60}$ alkyl group, a $C_1$-$C_{60}$ alkoxy group, a $C_6$-$C_{60}$ aryl group, or a $C_2$-$C_{60}$ heteroaryl group).

The unsubstituted $C_1$-$C_{60}$ alkoxy group (or $C_1$-$C_{60}$ alkoxy group) used herein has a formula of —OA (where A is the unsubstituted $C_1$-$C_{60}$ alkyl group described above), and detailed examples thereof are methoxy, ethoxy, and isopropyloxy, and at least one hydrogen atom of these alkoxy groups may be substituted with the same substituent as described above in connection with the substituted $C_1$-$C_{60}$ alkyl group.

The unsubstituted $C_2$-$C_{60}$ alkenyl group (or $C_2$-$C_{60}$ alkenyl group) used herein refers to an unsubstituted $C_2$-$C_{60}$ alkyl group having one or more carbon double bonds at a center or end thereof. Examples of the unsubstituted $C_2$-$C_{60}$ alkenyl group are ethenyl, prophenyl, and butenyl. At least one hydrogen atom of these unsubstituted $C_2$-$C_{60}$ alkenyl groups may be substituted with the same substituent as described above in connection with the substituted $C_1$-$C_{60}$ alkyl group.

The unsubstituted $C_2$-$C_{60}$ alkynyl group (or $C_2$-$C_{60}$ alkynyl group) used herein refers to an unsubstituted $C_2$-$C_{60}$ alkyl group having one or more carbon triple bonds at a center or end thereof. Examples of the unsubstituted $C_2$-$C_{60}$ alkynyl group are ethynyl, propynyl, and the like. At least one hydrogen atom of these alkynyl groups may be substituted with the same substituent as described above in connection with the substituted $C_1$-$C_{60}$ alkyl group.

The unsubstituted $C_6$-$C_{60}$ aryl group is a monovalent group having a carbocyclic aromatic system having 6 to 60 carbon atoms including at least one aromatic ring. The unsubstituted $C_6$-$C_{60}$ arylene group is a divalent group having a carbocyclic aromatic system having 6 to 60 carbon atoms including at least one aromatic ring. When the aryl group and the arylene group include two or more rings, the rings may be fused to each other. At least one hydrogen atom of these aryl groups and arylene groups may be substituted with the same substituent as described above in connection with the substituted $C_1$-$C_{60}$ alkyl group.

Examples of the substituted or unsubstituted $C_6$-$C_{60}$ aryl group may include a phenyl group, a $C_1$-$C_{10}$ alkylphenyl group (for example, ethylphenyl group), a $C_1$-$C_{10}$ alkylbiphenyl group (for example, ethylbiphenyl group), a halophenyl group (for example, an o-, m- or p-fluorophenyl group, a dichlorophenyl group), a dicyanophenyl group, a trifluoromethoxyphenyl group, o-, m-, and p-tolyl groups, o-, m- and p-cumenyl groups, a mesityl group, a phenoxyphenyl group, a (α,α-dimethylbenzene)phenyl group, a (N,N'-dimethyl)aminophenyl group, a (N,N'-diphenyl)aminophenyl group, a pentalenyl group, an indenyl group, a naphthyl group, halonaphthyl group (for example, a fluoronaphthyl group), a $C_1$-$C_{10}$ alkylnaphthyl group (for example, a methylnaphthyl group), a $C_1$-$C_{10}$ alkoxynaphthyl group (for example, a methoxynaphthyl group), an anthracenyl group, azrenyl group, a heptalenyl group, an acenaphthylenyl group, a phenalenyl group, a fluorenyl group, anthraquinolinyl group, a methylanthracenyl group, a phenanthryl group, a triphenylenyl group, a pyrenyl group, a chrysenyl group, an ethyl-chrysenyl group, a picenyl group, perylenyl group, a chloroperylenyl group, a pentaphenyl group, a pentasenyl group, a tetraphenylenyl group, a hexaphenyl group, a hexacenyl group, a rubicenyl group, a coroneryl group, a trinaphthylenyl group, a heptaphenyl group, a heptacenyl group, a piranthrenyl group, and an obarenyl group, and examples of the substituted $C_6$-$C_{60}$ aryl group may be easily understood by referring to the examples of the unsubstituted $C_6$-$C_{60}$ aryl group and the substituents of the substituted $C_1$-$C_{60}$ alkyl group. Examples of the substituted or unsubstituted $C_6$-$C_{60}$ arylene group may be easily understood by referring to examples of the substituted or unsubstituted $C_6$-$C_{60}$ aryl group.

The unsubstituted $C_2$-$C_{60}$ heteroaryl group used herein refers to a monovalent group having a system composed of one or more aromatic rings having at least one hetero atom selected from nitrogen (N), oxygen (O), phosphorous (P), silicon (Si), and sulfur (S) and carbon atoms as the remaining ring atoms. The unsubstituted $C_2$-$C_{60}$ heteroarylene group used herein refers to a divalent group having a system composed of one or more aromatic rings having at least one hetero atom selected from nitrogen (N), oxygen (O), phosphorous (P), silicon (Si), and sulfur (S) and carbon atoms as the remaining ring atoms. In this regard, when the heteroaryl group and the heteroarylene group each include two or more rings, the rings may be fused to each other. At least one hydrogen atom of the heteroaryl group and the heteroarylene group may be substituted with the same substituent described in connection with the $C_1$-$C_{60}$ alkyl group.

Examples of the unsubstituted $C_2$-$C_{60}$ heteroaryl group may include a pyrazolyl group, an imidazolyl group, a oxazolyl group, a thiazolyl group, a triazolyl group, tetrazolyl, an oxadiazolyl group, a pyridinyl group, a pyridazinyl group, a pyrimidinyl group, a triazinyl group, a carbazolyl group, an indolyl group, a quinolinyl group, an isoquinolinyl group, benzoan imidazolyl group, an imidazo pyridinyl group, and an imidazo pyrimidinyl group. Examples of the unsubstituted $C_2$-$C_{60}$ heteroarylene group may be easily understood by referring to the examples of the substituted or unsubstituted $C_2$-$C_{60}$ arylene group.

The substituted or unsubstituted $C_6$-$C_{60}$ aryloxy group indicates —$OA_2$ (where $A_2$ is the substituted or unsubstituted $C_6$-$C_{60}$ aryl group), and the substituted or unsubstituted $C_5$-$C_{60}$ arylthio group indicates —$SA_3$ (where $A_3$ is the substituted or unsubstituted $C_6$-$C_{60}$ aryl group).

Regarding Synthesis Examples below, the wording "B was used instead of A" includes the meaning that a molar equivalent amount of B is identical to that of A.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLE

Synthesis Example 1

Synthesis of Compound 2

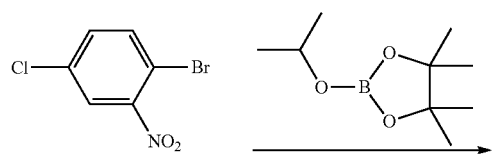

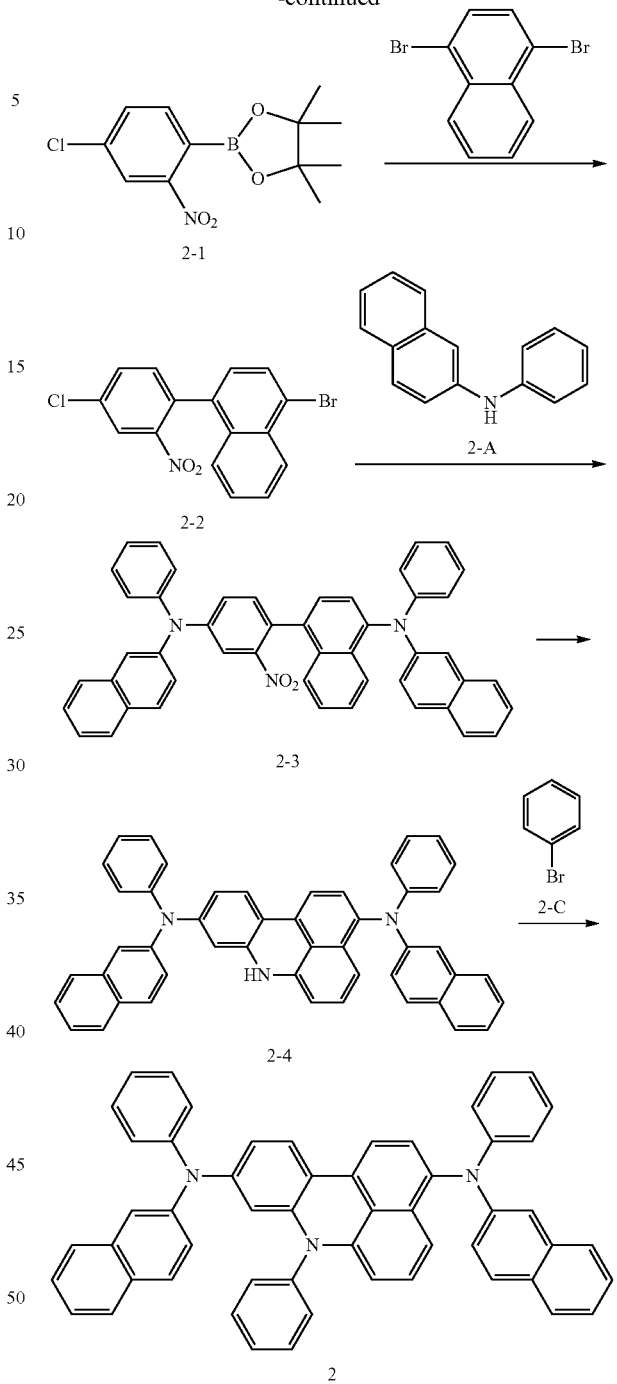

Synthesis of Intermediate 2-1

5.96 g (23.6 mmol) of 1-bromo-4-chloro-2-nitrobenzene was dissolved in 100 ml of tetrahydrofuran (THF), 10 ml (25.0 mmol, 2.5 M in hexane) of n-BuLi was slowly and dropwisely added thereto at a temperature of −78° C., and then the mixture was stirred while maintaining the temperature for about 1 hour. Next, 9.3 ml (50 mmol) of 2-isopropoxy-4,4,5,5-tetramethyl-1,3,2-dioxaborolane was slowly and dropwisely added to the mixture, the mixture was stirred at a temperature of −78° C. for 1 hour, and then additionally stirred at room temperature for 24 hours. After the reaction was completed, 50 ml of 10% HCl aqueous solution and 50 ml of H₂O were added to the reaction solution, and the reaction solution was extracted three times with 80 ml of diethyl ether. The organic layer obtained from the extraction was dried with magnesium sulfate, and the residual obtained by evaporating the solvent was separation-purified by silica gel column chromatography to obtain 6.36 g of Intermediate 2-1 (yield: 90%). The obtained compound was identified by LC-MS.

$C_{13}H_{19}BClNO_4$: M⁺ 299.5

Synthesis of Intermediate 2-2

6.59 g (22.0 mmol) of Intermediate 2-1, 12.4 g (44.0 mmol) of 1,4-dibromonaphthalene, 1.27 g (1.1 mmol) of tetrakis(triphosphine)palladium (Pd(PPh₃)₄), and 4.58 g (33 mmol) of K₂CO₃ were dissolved in 200 ml of a mixed solution of THF/H₂O (at a volume ratio of 2/1), stirred at a temperature of 70° C. for 5 hours, cooled to room temperature, added with 60 ml of water, and then extracted three times with 60 ml of ethyl ether. The organic layer obtained therefrom was dried with magnesium sulfate, and the residual obtained by evaporating the solvent was separation-purified by silica gel column chromatography to obtain 5.98 g of Intermediate 2-2 (yield: 75%). The obtained compound was identified by LC-MS.

$C_{16}H_9BrClNO_2$: M⁺ 362.4

Synthesis of Intermediate 2-3

7.25 g (20 mmol) of Intermediate 2-2, 8.77 g (40.0 mmol) of Intermediate 2-A, 0.37 g (0.4 mmol) of Pd₂(dba)₃, 0.08 g (0.4 mmol) of P(tBu)₃, and 5.76 g (60 mmol) of KOtBu were dissolved in 90 ml of toluene, stirred at a temperature of 85° C. for 4 hours, cooled to room temperature, and then extracted three times with 50 ml of water and 50 ml of diethyl ether. The organic layer obtained therefrom was dried with magnesium sulfate, and the residual obtained by evaporating the solvent was separation-purified by silica gel column chromatography to obtain 10.9 g of Intermediate 2-3 (yield: 80%). The obtained compound was identified by LC-MS.

$C_{48}H_{33}N_3O_2$: M⁺ 683.2

Synthesis of Intermediate 2-4

6.85 g (10.00 mmol) of Intermediate 2-3 and 8.3 g (50 mmol) of triethylphosphate were dissolved in 250 ml of cumene and stirred under reflux in nitrogen atmosphere for 24 hours. After the reaction was completed, the organic layer obtained by concentrating at a low pressure by using a high vacuum was separation-purified by silica gel column chromatography to obtain 4.04 g of Intermediate 2-4 (yield: 62%). The obtained compound was identified by LC-MS.

$C_{48}H_{33}N_3$: M⁺ 651.3

Synthesis of Compound 2

3.25 g (5.00 mmol) of Intermediate 2-4, 0.95 g (6 mmol) of Intermediate 2-C (bromobenzene), 0.003 g (0.1 mmol) of Pd(OAc)₂, 0.1 g (0.5 mmol) of P(tBu)₃, and 0.84 g (7.5 mmol) of KOtBu were dissolved in 200 ml of toluene, stirred under reflux in nitrogen atmosphere for 24 hours, cooled to room temperature, and extracted three times with 50 ml of water and 50 ml of diethyl ether. The organic layer obtained therefrom was dried with magnesium sulfate, and the residual obtained by evaporating the solvent was separation-purified by silica gel column chromatography to obtain 3.02 g of Compound 2 (yield: 83%). The obtained compound was identified by LC-MS and NMR.

$C_{54}H_{37}N_3$: M⁺ 727.3

1H NMR (CDCl₃, 400 MHz) δ 8.12-8.10 (d, 1H), 8.07-8.05 (d, 2H), 8.00-7.96 (m, 2H), 7.90-7.86 (m, 4H), 7.82-7.80 (m, 2H), 7.75-7.72 (m, 2H), 7.65-7.63 (ss, 2H), 7.61-7.59 (ss, 1H), 7.48-7.41 (m, 8H), 7.35-7.33 (m, 1H), 7.29-7.27 (ss, 1H), 7.23-7.18 (m, 3H), 7.10-7.00 (m, 7H), 6.98-6.96 (m, 1H)

Synthesis Example 2

Synthesis of Compound 3

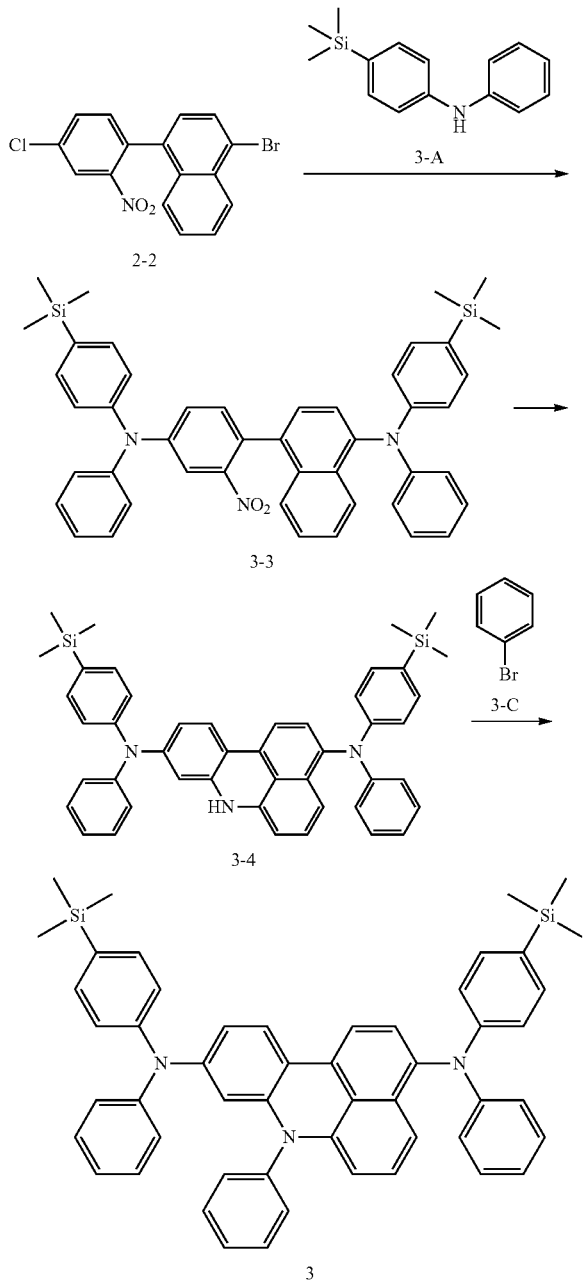

Synthesis of Intermediate 3-3

Intermediate 3-3 was synthesized in the same manner as used to synthesize Intermediate 2-3 of Synthesis Example 1, except that Intermediate 3-A (phenyl-(4-trimethylsilanyl-phenyl)-amine) was used instead of Intermediate 2-A. The obtained compound was identified by LC-MS.

$C_{46}H_{45}N_3O_2Si_2$: $M^+$ 728.1

Synthesis of Intermediate 3-4

Intermediate 3-4 was synthesized in the same manner as used to synthesize Intermediate 2-4 of Synthesis Example 1, except that Intermediate 3-3 was used instead of Intermediate 2-3. The obtained compound was identified by LC-MS.

$C_{46}H_{45}N_3Si_2$: $M^+$ 696.2

Synthesis of Compound 3

2.89 g of Compound 3 (yield: 75%) was synthesized in the same manner as used to synthesize Compound 2 of Synthesis Example 1, except that Intermediate 3-4 was used instead of Intermediate 2-4. The obtained compound was identified by LC-MS and NMR.

$C_{52}H_{49}N_3Si_2$: $M^+$ 772.14

1H NMR (CDCl$_3$, 400 MHz) δ 8.12-8.10 (d, 1H), 7.85-7.75 (m, 6H), 7.68-7.66 (d, 1H), 7.62-7.53 (m, 7H), 7.50-7.48 (m, 1H), 7.38-7.30 (m, 5H), 7.28-7.20 (m, 2H), 7.18-7.16 (m, 1H), 7.14-7.12 (m, 2H), 7.10-7.08 (m, 4H), 7.06-7.04 (d, 1H), 0.24 (s, 18H)

Synthesis Example 3

Synthesis of Compound 8

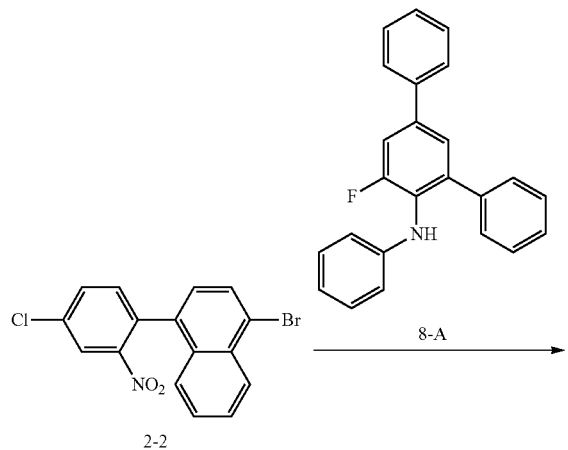

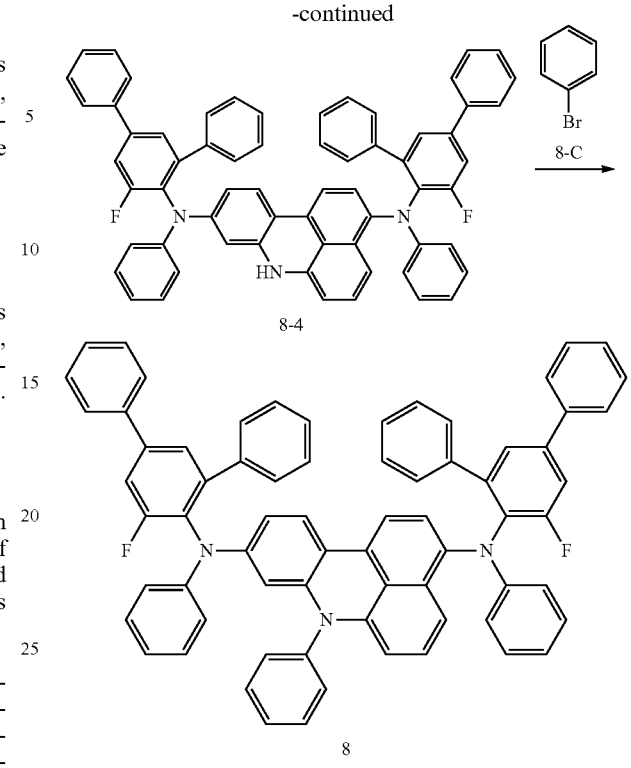

Synthesis of Intermediate 8-3

Intermediate 8-3 was synthesized in the same manner as used to synthesize Intermediate 2-3 of Synthesis Example 1, except that Intermediate 8-A as ((5'-fluoro-[1,1';3',1'']terphenyl-4'-yl)-phenyl-amine) was used instead of Intermediate 2-A. The obtained compound was identified by LC-M-MS $C_{64}H_{43}F_2N_3O_2$: $M^+$ 924.0

Synthesis of Intermediate 8-4

Intermediate 8-4 was synthesized in the same manner as used to synthesize Intermediate 2-4 of Synthesis Example 1, except that Intermediate 8-3 was used instead of Intermediate 2-3. The obtained compound was identified by LC-MS.

$C_{64}H_{43}F_2N_3$: $M^+$ 892.04

Synthesis of Compound 8

3.78 g of Compound 8 (yield: 78%) was synthesized in the same manner as used to synthesize Compound 2 of Synthesis Example 1, except that Intermediate 8-4 was used instead of Intermediate 2-4. The obtained compound was identified by LC-MS and NMR.

$C_{70}H_{47}F_2N_3$: $M^+$ 968.14

1H NMR (CDCl$_3$, 400 MHz) δ 8.12-8.10 (d, 1H), 8.06-8.04 (m, 5H), 7.94-7.91 (m, 16H), 7.87-7.74 (m, 3H), 7.70-7.60 (m, 11H), 7.52-7.48 (m, 4H), 7.42-7.40 (m, 1H), 7.27-7.22 (m, 4H), 7.15-7.12 (m, 2H)

Synthesis Example 4

Synthesis of Compound 4

3.36 g of Compound 4 (yield: 70%) was synthesized in the same manner as used in Synthesis Example 1, except that biphenyl-2-yl-dibenzofuran-4-yl-amine was used instead of Intermediate 2-A in Synthesis of Intermediate 2-3. The obtained compound was identified by LC-MS and NMR.

$C_{70}H_{45}N_3O_2$: M+ 959.55

1H NMR (CDCl$_3$, 400 MHz) δ 8.14-8.12 (m, 2H), 7.95-7.90 (m, 3H), 7.86-7.79 (m, 10H), 7.75-7.62 (m, 5H), 7.60-7.54 (m, 3H), 7.42-7.38 (m, 7H), 7.32-7.22 (m, 9H), 7.10-7.08 (m, 2H), 6.95-6.93 (d, 1H), 6.88-6.85 (m, 3H)

Synthesis Example 5

Synthesis of Compound 6

3.31 g of Compound 6 (yield: 69%) was synthesized in the same manner as used in Synthesis Example 1, except that (9,9-dimethyl-9H-fluoren-2-yl)-naphthalen-2-yl-amine was used instead of Intermediate 2-A in Synthesis of Intermediate 2-3. The obtained compound was identified by LC-MS and NMR.

$C_{72}H_{53}N_3$: M+ 960.3

1H NMR (CDCl$_3$, 400 MHz) δ 8.11-8.09 (d, 1H), 8.03-8.00 (m, 4H), 7.96-7.94 (m, 3H), 7.89-7.85 (m, 7H), 7.82-7.80 (d, 1H), 7.72-7.68 (m, 6H), 7.62-7.60 (d, 1H), 7.52-7.42 (m, 8H), 7.28-7.26 (d, 1H), 7.24-7.22 (d, 1H), 7.18-7.15 (m, 3H), 7.10-7.08 (d, 2H), 7.06-7.04 (d, 1H), 7.00-6.98 (m, 2H), 1.60 (s, 12H)

Synthesis Example 6

Synthesis of Compound 11

3.06 g of Compound 11 (yield: 75%) was synthesized in the same manner as used in Synthesis Example 1, except that biphenyl-4-yl-(2-fluoro-phenyl)-amine was used instead of Intermediate 2-A in Synthesis of Intermediate 2-3. The obtained compound was identified by LC-MS and NMR.

$C_{58}H_{39}F_2N_3$: M+ 815.12

1H NMR (CDCl$_3$, 400 MHz) δ 7.88-7.84 (m, 4H), 7.78-7.68 (m, 12H), 7.57-7.55 (d, 1H), 7.52-7.48 (m, 6H), 7.40-7.36 (m, 4H), 7.30-7.26 (m, 2H), 7.20-7.18 (d, 1H), 7.12-7.08 (m, 4H), 7.05-7.03 (m, 2H), 6.98-6.96 (m, 2H), 6.95-6.93 (d, 1H)

Synthesis Example 7

Synthesis of Compound 12

2.95 g of Compound 12 (yield: 65%) was synthesized in the same manner as used in Synthesis Example 1, except that 4-(9,9-Dimethyl-9H-fluoren-2-ylamino)-benzonitrile was used instead of Intermediate 2-A in Synthesis of Intermediate 2-3. The obtained compound was identified by LC-MS and NMR.

$C_{66}H_{47}N_5$: M+ 909.22

1H NMR (CDCl$_3$, 400 MHz) δ 8.14-8.12 (d, 1H), 8.10-8.08 (d, 2H), 7.87-7.85 (d, 1H), 7.82-7.80 (d, 1H), 7.75-7.68 (m, 8H), 7.62-7.60 (d, 1H), 7.54-7.50 (m, 8H), 7.38-7.36 (m, 2H), 7.30-7.20 (m, 6H), 7.12-7.10 (m, 2H) 7.07-7.05 (d, 1H) 6.95-6.93 (m, 2H, 1.60 (s, 12H)

Synthesis Example 8

Synthesis of Compound 14

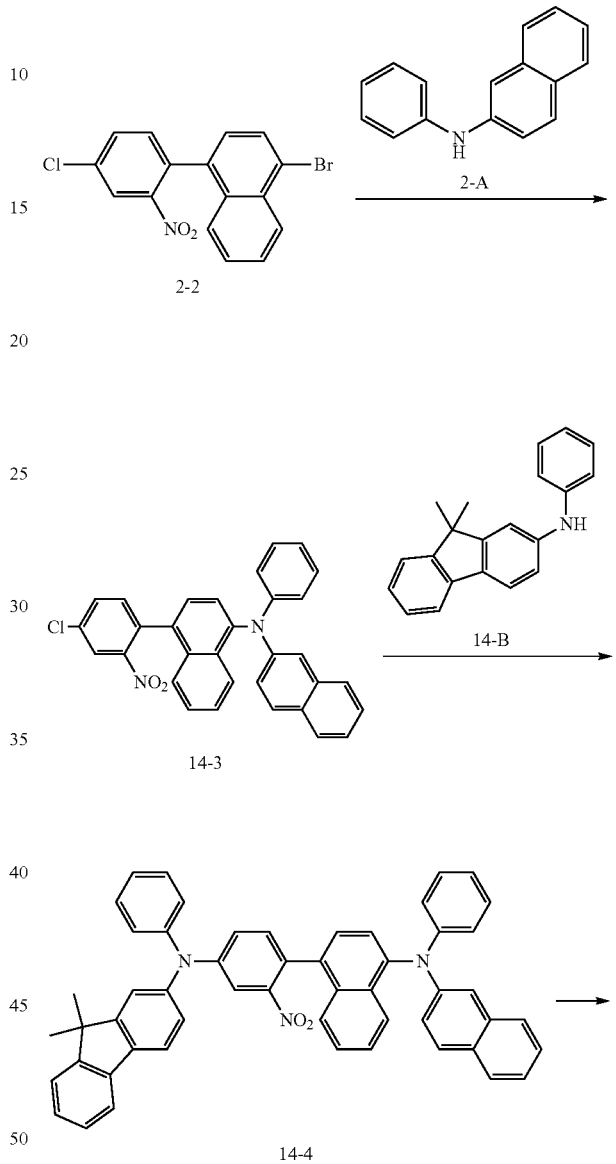

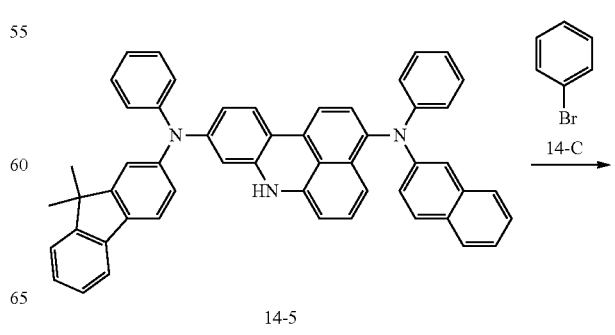

-continued

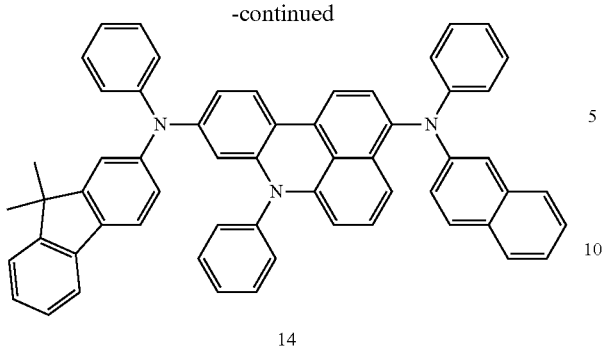

14

Synthesis of Intermediate 14-3

Intermediate 14-3 was synthesized in the same manner as used to synthesize Intermediate 2-3 of Synthesis Example 1, except that 20 mmol of Intermediate 2-A was used instead of 40 mmol of Intermediate 2-A. The obtained compound was identified by LC-MS.

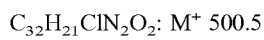

Synthesis of Intermediate 14-4

Intermediate 14-4 was synthesized in the same manner as used to synthesize Intermediate 2-3 of Synthesis Example 1, except that Intermediate 14-3 was used instead of Intermediate 2-2, and 20 mmol of Intermediate 14-B was used instead of 40 mmol of Intermediate 2-A. The obtained compound was identified by LC-MS.

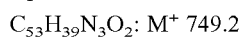

Synthesis of Intermediate 14-5

Intermediate 14-5 was synthesized in the same manner as used to synthesize Intermediate 2-4 of Synthesis Example 1, except that Intermediate 14-4 was used instead of Intermediate 2-3. The obtained compound was identified by LC-MS.

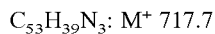

Synthesis of Compound 14

2.78 g of Compound 14 (yield: 70%) was synthesized in the same manner as used to synthesize Compound 2 of Synthesis Example 1, except that Intermediate 14-5 was used instead of Intermediate 2-4. The obtained compound was identified by LC-MS and NMR.

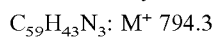

1H NMR (CDCl$_3$, 400 MHz) δ 8.12-8.10 (d, 1H), 8.05-8.02 (m, 2H), 7.94-7.92 (ss, 1H), 7.88-7.85 (m, 3H), 7.83-7.81 (d, 1H), 7.80-7.62 (m, 5H), 7.54-7.44 (m, 10H), 7.33-7.23 (m, 6H), 7.15-7.01 (m, 1H), 6.98-6.96 (m, 7H), 1.6 (s, 6H)

Synthesis Example 9

Synthesis of Compound 23

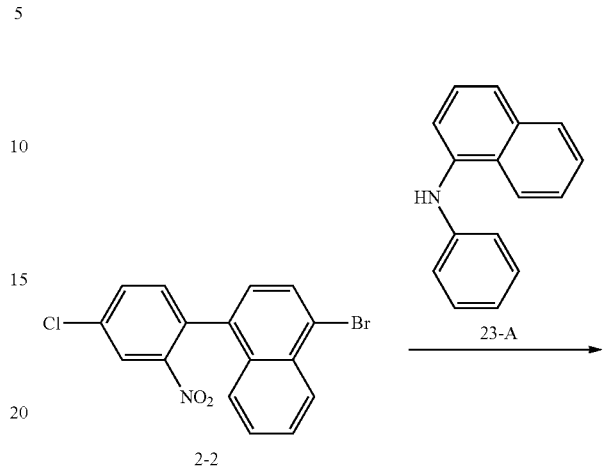

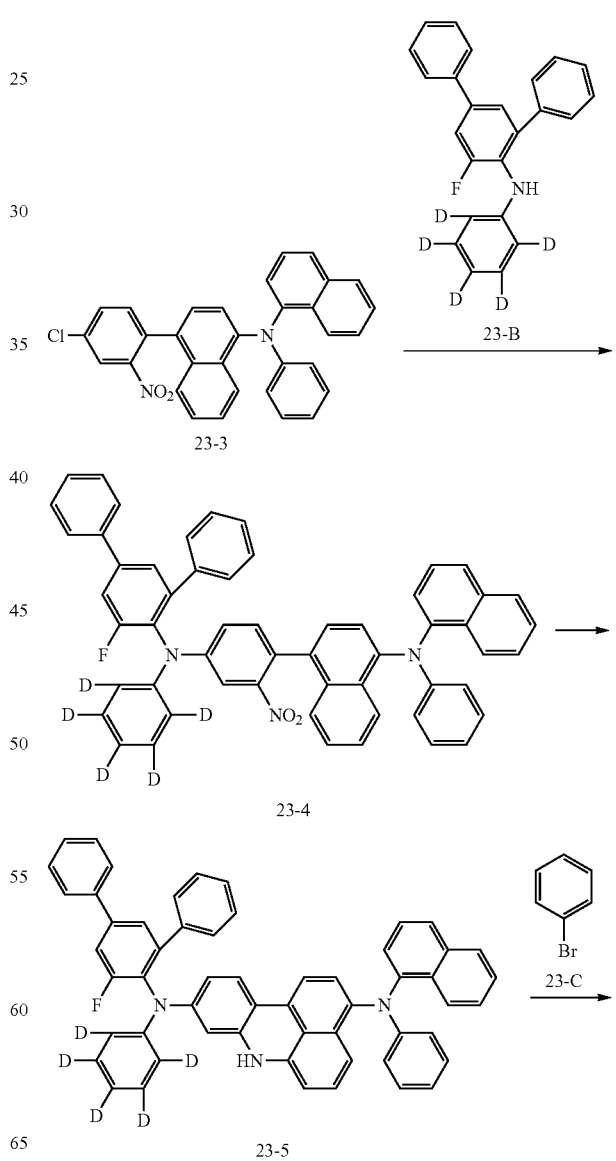

-continued

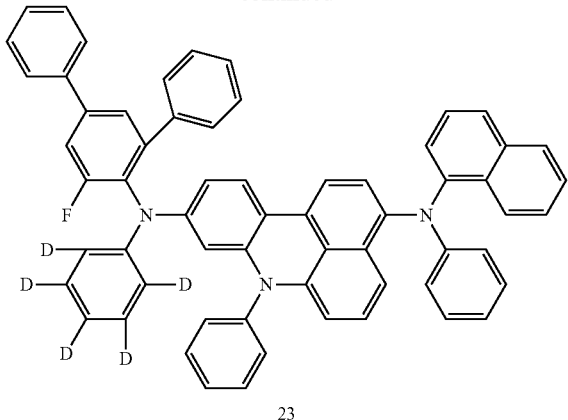 [SMILES: [2H]c1c([2H])c([2H])c(N(c2ccc3c(c2)N(c2ccccc2)c2cccc4c(N(c5ccccc5)c5cccc6ccccc56)ccc-3c24)c2c(F)cc(-c3ccccc3)cc2-c2ccccc2)c([2H])c1[2H]]

23

Synthesis of Intermediate 23-3

Intermediate 23-3 was synthesized in the same manner as used to synthesize Intermediate 14-3 of Synthesis Example 8, except that Intermediate 23-A was used instead of Intermediate 2-A. The obtained compound was identified by LC-MS.

$C_{32}H_{21}ClN_2O$: M+ 500.4

Synthesis of Intermediate 23-4

Intermediate 23-4 was synthesized in the same manner as used to synthesize Intermediate 14-4 of Synthesis Example 8, except that Intermediate 23-3 was used instead of Intermediate 14-3, and Intermediate 23-B was used instead of Intermediate 14-B. The obtained compound was identified by LC-MS.

$C_{56}H_{33}FN_3O_2$: M+ 808.7

Synthesis of Intermediate 23-5

Intermediate 23-5 was synthesized in the same manner as used to synthesize Intermediate 14-5 of Synthesis Example 8, except that Intermediate 23-4 was used instead of Intermediate 14-4. The obtained compound was identified by LC-MS.

$C_{56}H_{33}D_5FN_3$: M+ 776.8

Synthesis of Compound 23

2.90 g of Compound 23 (yield: 68%) was synthesized in the same manner as used to synthesize Compound 14 of Synthesis Example 8, except that Intermediate 23-5 was used instead of Intermediate 14-5. The obtained compound was identified by LC-MS and NMR.

$C_{62}H_{37}D_5FN_3$: M+ 853.1

1H NMR (CDCl$_3$, 400 MHz) δ 8.18-8.16 (m, 1H), 8.12-8.10 (m, 1H), 8.08-8.06 (d, 1H), 7.96-7.94 (m, 2H), 7.90-7.86 (m, 3H), 7.82-7.62 (m, 10H), 7.50-7.32 (m, 10H), 7.28-7.22 (m, 4H), 7.20 (d, 1H), 7.16-7.12 (m, 2H), 6.96-6.94 (m, 2H)

Synthesis Example 10

Synthesis of Compound 13

2.46 g of Compound 13 (yield: 72%) was synthesized in the same manner as used in Synthesis Example 8, except that phenyl-phenyl(d5)-amine was used instead of Intermediate 14-B in Synthesis of Intermediate 14-4. The obtained compound was identified by LC-MS and NMR.

$C_{59}H_{30}D_5N_3$: M+ 682.11

1H NMR (CDCl$_3$, 400 MHz) δ 8.12-8.10 (d, 1H), 8.08-8.06 (d, 1H), 7.98-7.96 (d, 1H), 7.90-7.86 (m, 2H), 7.82-7.80 (d, 1H), 7.76-7.70 (m, 3H), 7.66-7.64 (d, 1H), 7.58-7.50 (m, 8H), 7.35-7.33 (d, 1H), 7.30-7.28 (m, 3H), 7.24-7.22 (dd, 1H), 7.18-7.14 (m, 6H), 7.08-7.06 (d, 1H)

Synthesis Example 11

Synthesis of Compound 18

3.20 g of Compound 18 (yield: 68%) was synthesized in the same manner as used in Synthesis Example 8, except that (5'-fluoro-[1,1';3',1"]terphenyl-4'-yl)-phenyl-amine was used instead of Intermediate 2-A in Synthesis of Intermediate 14-3, and (3-fluoro-5-naphthalene-1-yl-phenyl)-phenyl-amine was used instead of Intermediate 14-B in Synthesis of Intermediate 14-4. The obtained compound was identified by LC-MS and NMR.

$C_{68}H_{45}F_2N_3$: M+ 941.42

1H NMR (CDCl$_3$, 400 MHz) δ 8.13-8.11 (d, 1H), 8.08-8.05 (m, 2H), 8.00-7.96 (m, 4H), 7.90-7.81 (m, 10H), 7.76-7.72 (m, 3H), 7.68-7.64 (m, 1H), 7.60-7.58 (m, 1H), 7.56-7.49 (m, 10H), 7.44-7.42 (m, 1H), 7.30-7.24 (m, 3H), 7.20-7.16 (m, 4H), 7.10-7.08 (m, 2H), 7.04-7.00 (m, 3H)

Synthesis Example 12

Synthesis of Compound 21

3.08 g of Compound 21 (yield: 67%) was synthesized in the same manner as used in Synthesis Example 8, except that (5'-fluoro-[1,1';3',1"]terphenyl-4'-yl)-naphthalene-2-yl-amine was used instead of Intermediate 2-A in Synthesis of Intermediate 14-3, and phenyl-(4-trimethylsilanyl-phenyl)-amine was used instead of Intermediate 14-B in Synthesis of Intermediate 14-4. The obtained compound was identified by LC-MS and NMR.

$C_{65}H_{50}FN_3Si$: M+ 919.50

1H NMR (CDCl$_3$, 400 MHz) δ 8.08-8.06 (d, 1H), 8.03-8.01 (d, 1H), 7.98-7.96 (m, 2H), 7.92-7.89 (m, 3H), 7.85-7.80 (m, 8H), 7.75-7.73 (m, 2H), 7.68-7.62 (m, 5H), 7.48-7.46 (d, 1H), 7.40-7.36 (m, 8H), 7.20-7.14 (m, 4H), 7.10-7.08 (dd, 1H), 7.06-7.04 (m, 2H), 7.02-7.00 (m, 2H), 6.98-6.96 (d, 1H), 0.24 (s, 9H)

Synthesis Example 13

Synthesis of Compound 24

3.06 g of Compound 24 (yield: 70%) was synthesized in the same manner as used in Synthesis Example 8, except that (5'-fluoro-[1,1';3',1"]terphenyl-4'-yl)-phenyl-amine was used instead of Intermediate 2-A in Synthesis of Intermediate 14-3, and biphenyl-4-yl-phenyl-amine was used instead of Intermediate 14-B in Synthesis of Intermediate 14-4. The obtained compound was identified by LC-MS and NMR.

$C_{64}H_{44}FN_3$: M+ 873.51

1H NMR (CDCl$_3$, 400 MHz) δ 8.00-7.98, (d, 1H), 7.92-7.89 (m, 3H), 7.85-7.81 (m, 5H), 7.78-7.72 (m, 7H), 7.70-7.68 (m, 2H), 7.66-7.64 (m, 2H), 7.62-7.60 (m, 2H), 7.52-7.47 (m, 9H), 7.38-7.35 (m, 3H), 7.30-7.27 (m, 2H), 7.18-7.14 (dd, 1H), 7.12-7.10 (m, 2H), 7.08-7.06 (m, 2H), 7.04-7.02 (m, 3H)

Synthesis Example 14

Synthesis of Compound 30

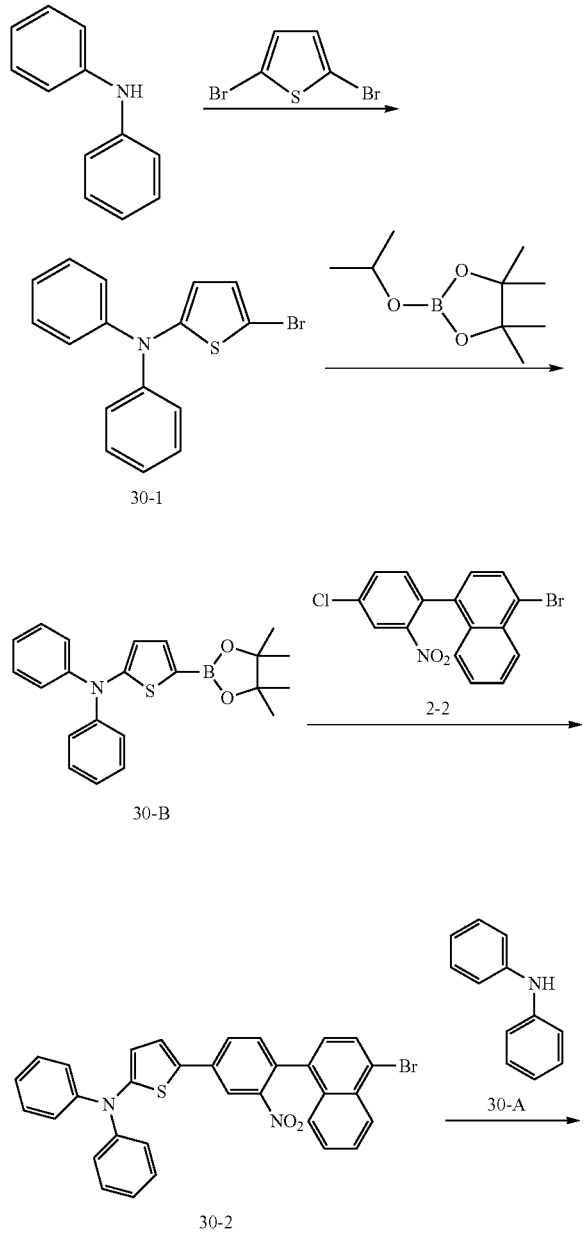

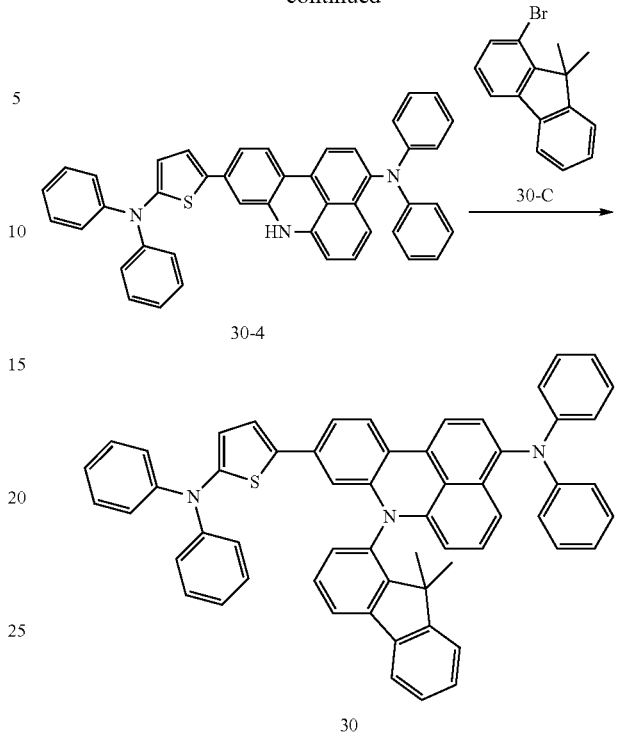

Synthesis of Intermediate 30-1

Intermediate 30-1 was synthesized in the same manner as used to synthesize Intermediate 2-3 of Synthesis Example 1, except that 20 mmol of diphenylamine was used instead of 40 mmol of Intermediate 2-A, and 20 mmol of 2,5-dibromothiophene was used instead of 20 mmol of Intermediate 2-2. The obtained compound was identified by LC-MS.

$C_{16}H_{12}BrNS$: $M^+$ 330.1

Synthesis of Intermediate 30-B

Intermediate 30-B was synthesized in the same manner as used to synthesize Intermediate 2-1 of Synthesis Example 1, except that Intermediate 30-1 was used instead of 1-bromo-4-chloro-2-nitrobenzene. The obtained compound was identified by LC-MS.

$C_{22}H_{24}BNO_2S$: $M^+$ 377.2

Synthesis of Intermediate 30-2

7.55 g (20 mmol) of Intermediate 30-B, 6.95 g (20.0 mmol) of Intermediate 2-2, 0.22 g (1.0 mmol) of Pd(OAc), and 11.4 g (35 mmol) of $CsCO_3$ were dissolved in 200 ml of a mixed solution of $THF/H_2O$ (at a volume ratio of 2/1), stirred at a temperature of 70° C. for 5 hours, and cooled to room temperature. Next, 60 ml of water was added thereto, and then the resultant was extracted three times with 60 ml of ethyl ether. The organic layer obtained therefrom was dried with magnesium sulfate, and the residual obtained by evaporating the solvent was separation-purified by silica gel column chromatography to obtain 8.55 g of intermediate 30-2 (yield: 74%). The obtained compound was identified by LC-MS.

$C_{32}H_{21}BrN_2O_2S$: $M^+$ 577.2

Synthesis of Intermediate 30-3

Intermediate 30-3 was synthesized in the same manner as used to synthesize Intermediate 2-3 of Synthesis Example 1, except that Intermediate 30-2 was used instead of Intermediate 2-2, and 20 mmol of Intermediate 30-A (diphenylamine) was used instead of 40 mmol of Intermediate 2-A. The obtained compound was identified by LC-MS.

$C_{44}H_{31}N_3O_2S$: $M^+$ 665.5

Synthesis of Intermediate 30-4

Intermediate 30-4 was synthesized in the same manner as used to synthesize Intermediate 2-4 of Synthesis Example 1, except that Intermediate 30-3 was used instead of Intermediate 2-3. The obtained compound was identified by LC-MS.

$C_{44}H_{31}N_3S$: $M^+$ 633.6

Synthesis of Compound 30

2.93 g of Compound 30 (yield: 71%) was synthesized in the same manner as used to synthesize Compound 2 of Synthesis Example 1, except that Intermediate 30-4 was used instead of Intermediate 2-4, and Intermediate 30-C (1-bromo-9,9-dimethyl-9H-fluorene) was used instead of Intermediate 2-C (bromobenzene). The obtained compound was identified by LC-MS and NMR.

$C_{59}H_{43}N_3S$: $M^+$ 826.3

1H NMR (CDCl$_3$, 400 MHz) δ 8.12-8.10 (d, 1H), 8.07-8.02 (m, 2H), 7.96-7.94 (ss, 1H), 7.89-7.87 (m, 1H), 7.81-7.65 (m, 9H), 7.58-7.40 (m, 14H), 7.35-7.33 (m, 1H), 7.28-7.26 (m, 3H), 7.20-7.18 (d, 1H), 7.05-7.03 (m, 4H), 1.72 (s, 6H)

Synthesis Example 15

Synthesis of Compound 25

2.64 g of Compound 25 (yield: 75%) was synthesized in the same manner as used in Synthesis Example 14, except that (4-bromo-phenyl)-diphenyl-amine was used instead of Intermediate 30-1 in synthesis of Intermediate 30-B, and Intermediate 2-C was used instead of Intermediate 30-C in synthesis of Compound 30. The obtained compound was identified by LC-MS and NMR.

$C_{52}H_{37}N_3$: $M^+$ 703.41

1H NMR (CDCl$_3$, 400 MHz) δ 8.05-8.03 (d, 1H), 8.01-7.99 (d, 1H), 7.95-7.92 (m, 1H), 7.88-7.86 (d, 1H), 7.65-7.63 (m, 1H), 7.60-7.58 (m, 2H), 7.54-7.52 (m, 1H), 7.38-7.36 (m, 1H), 7.34-7.27 (m, 10H), 7.14-7.12 (d, 1H), 7.08-7.00 (m, 5H), 6.90-6.80 (m, 4H), 6.78-6.72 (m, 8H)

Synthesis Example 16

Synthesis of Compound 29

2.95 g of Compound 29 (yield: 72%) was synthesized in the same manner as used in Synthesis Example 14, except that (7-bromo-9,9-dimethyl-9H-fluorene-2-yl)-diphenyl-amine was used instead of Intermediate 30-1 in synthesis of Intermediate 30-B, and Intermediate 2-C was used instead of Intermediate 30-C in synthesis of Compound 30. The obtained compound was identified by LC-MS and NMR.

$C_{61}H_{45}N_3$: $M^+$ 819.51

1H NMR (CDCl$_3$, 400 MHz) δ 8.05-8.03 (d, 1H), 7.98-7.96 (d, 1H), 7.90-7.85 (m, 3H), 7.75-7.73 (d, 1H), 7.68-7.63 (m, 2H), 7.58-7.52 (m, 2H), 7.48-7.38 (m, 11H), 7.30-7.28 (d, 1H), 7.22-7.18 (m, 6H), 7.15-7.13 (m, 2H), 7.09-7.07 (d, 1H), 6.98-6.93 (m, 8H), 1.63 (s, 6H)

Synthesis Example 17

Synthesis of Compound 31

3.09 g of Compound 31 (yield: 71%) was synthesized in the same manner as used in Synthesis Example 14, except that (4-bromo-phenyl)-(9,9-dimethyl-9H-fluorene-2-yl)-phenyl-amine was used instead of Intermediate 30-1 in synthesis of Intermediate 30-B, and naphthalen-2-yl-phenyl-amine was used instead of Intermediate 30-A in synthesis of Intermediate 30-3. The obtained compound was identified by LC-MS and NMR.

$C_{65}H_{47}N_3$: $M^+$ 869.42

1H NMR (CDCl$_3$, 400 MHz) δ 8.15-8.11 (m, 2H), 8.08-8.05 (m, 3H), 7.98-7.96 (d, 1H), 7.92-7.90 (d, 1H), 7.84-7.80 (m, 3H), 7.74-7.72 (d, 1H), 7.68-7.64 (m, 4H), 7.58-7.54 (m, 2H), 7.41-7.29 (m, 10H), 7.12-7.08 (m, 5H), 7.06-7.02 (m, 4H), 6.95-6.93 (d, 1H), 6.88-6.84 (m, 4H), 1.61 (s, 6H)

Synthesis Example 18

Synthesis of Compound 42

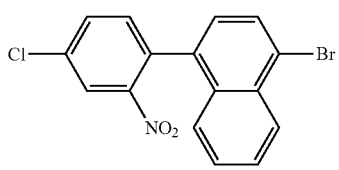

2-2

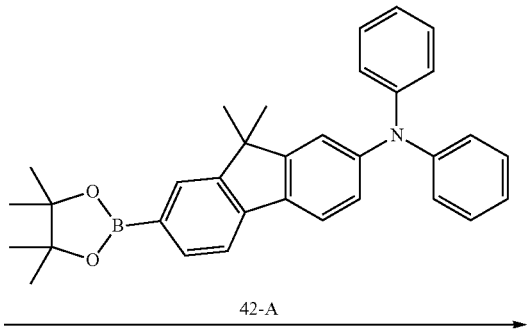

42-A

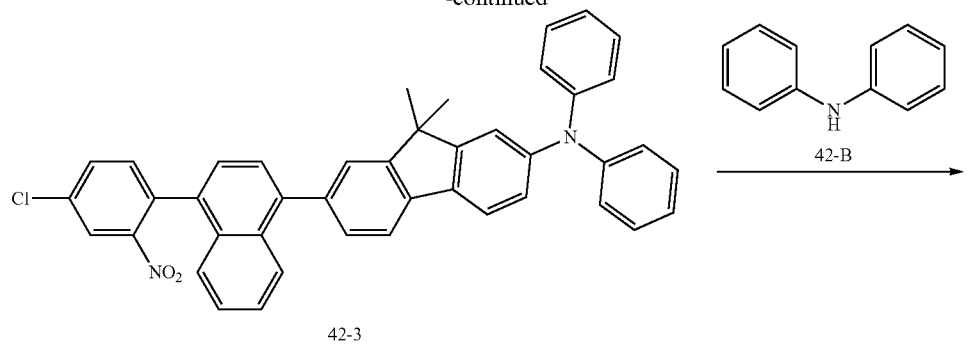

42-3

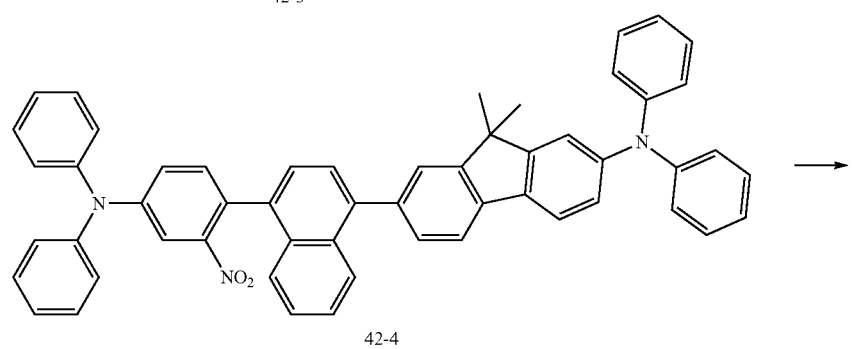

42-4

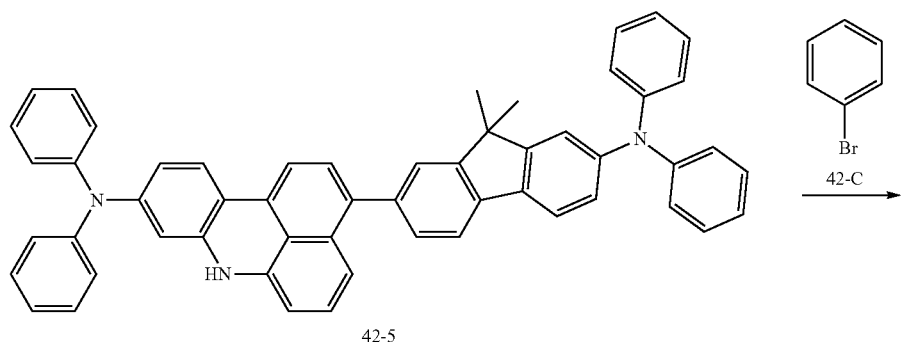

42-5

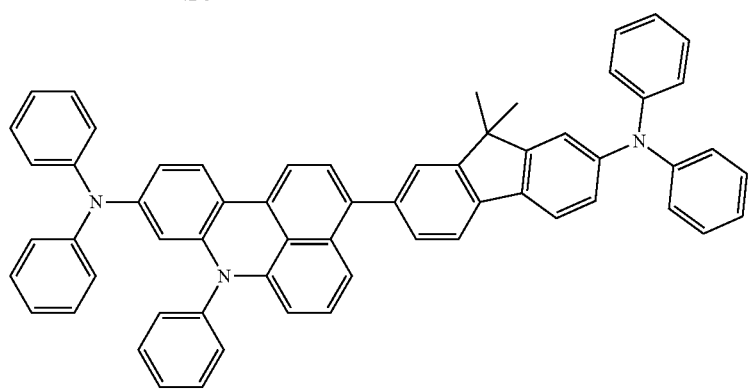

42

Synthesis of Intermediate 42-3

Intermediate 42-3 was synthesized in the same manner as used to synthesize Intermediate 2-2 of Synthesis Example 1, except that Intermediate 42-A was used instead of Intermediate 2-1, and Intermediate 2-2 was used instead of 1,4-dibromonaphthalene. The obtained compound was identified by LC-MS.

$C_{43}H_{31}ClN_2O_2$: $M^+$ 643.2

Synthesis of Intermediate 42-4

Intermediate 42-4 was synthesized in the same manner as used to synthesize Intermediate 2-3 of Synthesis Example 1, except that 20 mmol of Intermediate 42-B (diphenylamine) was used instead of 40 mmol of Intermediate 2-A, and Intermediate 42-3 was used instead of Intermediate 2-2. The obtained compound was identified by LC-MS.

$C_{55}H_{41}N_3O_2$: $M^+$ 775.5

Synthesis of Intermediate 42-5

Intermediate 42-5 was synthesized in the same manner as used to synthesize Intermediate 2-4 of Synthesis Example 1, except that Intermediate 42-4 was used instead of Intermediate 2-3. The obtained compound was identified by LC-MS.
$C_{55}H_{41}N_3$: M+ 743.8

Synthesis of Compound 42

2.79 g of Compound 42 (yield: 68%) was synthesized in the same manner as used to synthesize Compound 2 of Synthesis Example 1, except that Intermediate 42-5 was used instead of Intermediate 2-4. The obtained compound was identified by LC-MS and NMR.
$C_{61}H_{45}N_3$: M+ 820.1

1H NMR (CDCl$_3$, 400 MHz) δ 8.18-8.16 (d, 1H), 8.12-8.10 (d, 1H), 8.05-8.00 (d, 1H), 7.96-7.94 (m, 2H), 7.88-7.84 (m, 2H), 7.72-7.70 (m, 1H), 7.68-7.66 (m, 1H), 7.60-7.54 (m, 10H), 7.50-7.48 (m, 1H), 7.37-7.30 (m, 6H), 7.28-7.26 (m, 1H), 7.20-7.18 (d, 1H), 7.04-6.94 (m, 10H), 6.88-6.86 (m, 1H), 1.63 (s, 6H)

Synthesis Example 19

Synthesis of Compound 46

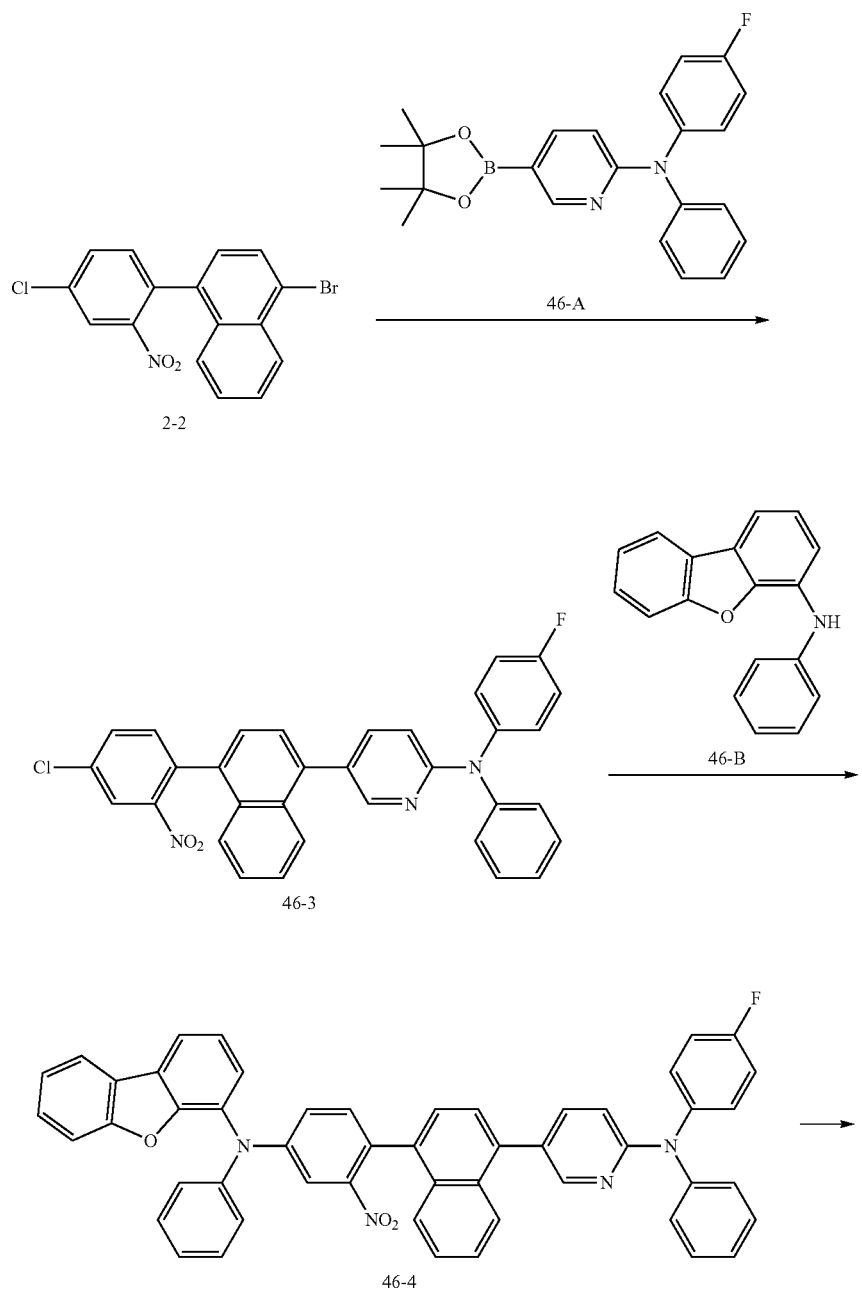

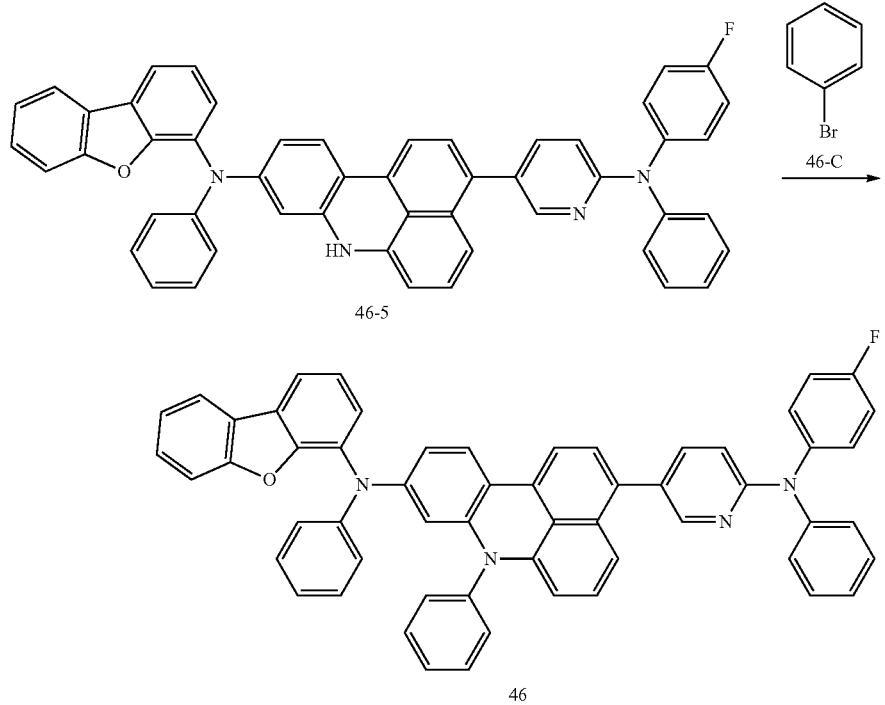

Synthesis of Intermediate 46-3

Intermediate 46-3 was synthesized in the same manner as used to synthesize Intermediate 42-3 of Synthesis Example 18, except that Intermediate 46-A was used instead of intermediate 42-A in synthesis of intermediate 42-3. The obtained compound was identified by LC-MS.

$C_{43}H_{31}ClN_2O_2$: $M^+$ 546.2

Synthesis of Intermediate 46-4

Intermediate 46-4 was synthesized in the same manner as used to synthesize Intermediate 42-4 of Synthesis Example 18, except that Intermediate 46-3 was used instead of Intermediate 42-3 in synthesis of Intermediate 42-4, and Intermediate 46-B was used instead of Intermediate 42-B in synthesis of Intermediate 42-4. The obtained compound was identified by LC-MS.

$C_{51}H_{33}FN_4O_3$: $M^+$ 768.9

Synthesis of Intermediate 46-5

Intermediate 46-5 was synthesized in the same manner as used to synthesize Intermediate 42-5 of Synthesis Example 18, except that Intermediate 46-4 was used instead of intermediate 42-4. The obtained compound was identified by LC-MS.

$C_{51}H_{33}FN_4O$: $M^+$ 736.9

Synthesis of Compound 46

2.80 g of Compound 46 (yield: 69%) was synthesized in the same manner as used to synthesize Compound 42 of Synthesis Example 18, except that intermediate 46-5 was used instead of Intermediate 42-5. The obtained compound was identified by LC-MS and NMR.

$C_{57}H_{37}FN_4O$: $M^+$ 812.8

1H NMR (CDCl$_3$, 400 MHz) δ 8.65-8.63 (d, 1H), 8.48-8.46 (ss, 1H), 8.34-8.32 (ss, 1H), 8.20-8.18 (m, 1H), 8.15-8.13 (m, 1H), 8.06-8.04 (m, 1H), 8.00-7.81 (m, 5H), 7.68-7.45 (m, 13H), 7.32-7.30 (ss, 1H), 7.26-7.16 (m, 7H), 7.13-7.11 (d, 1H), 7.02-7.00 (m, 2H), 6.95-6.93 (m, 2H)

Synthesis Example 20

Synthesis of Compound 37

2.36 g of Compound 37 (yield: 67%) was synthesized in the same manner as used in Synthesis Example 18, except that diphenyl-[5-(4,4,5,5-tetramethyl-[1,3,2]dioxaborolan-2-yl)-pyridine-2-yl]-amine was used instead of Intermediate 42-A in synthesis of Intermediate 42-3. The obtained compound was identified by LC-MS and NMR.

$C_{51}H_{36}N_4$: $M^+$ 704.35

1H NMR (CDCl$_3$, 400 MHz) δ 8.65-8.63 (d, 1H), 8.45-8.43 (d, 1H), 8.38-8.36 (d, 1H), 8.02-8.00 (m, 1H), 7.94-7.92 (m, 2H), 7.82-7.78 (m, 4H), 7.76-7.74 (d, 1H), 7.70-7.66 (m, 6H), 7.62-7.58 (m, 4H), 7.48-7.40 (m, 8H), 7.32-7.30 (m, 6H), 7.21-7.19 (d, 1H)

Synthesis Example 21

Synthesis of Compound 38

2.81 g of Compound 38 (yield: 70%) was synthesized in the same manner as used in Synthesis Example 18, except that naphthalen-2-yl-phenyl-[4-(4,4,5,5-tetramethyl-[1,3,2]dioxaborolan-2-yl)-phenyl]-amine was used instead of Intermediate 42-A in synthesis of Intermediate 42-3, and naphthalen-2-yl-phenyl-amine was used instead of Intermediate 42-B in synthesis of Intermediate 42-4. The obtained compound was identified by LC-MS and NMR.

$C_{60}H_{41}N_3$: $M^+$ 803.51

1H NMR (CDCl$_3$, 400 MHz) δ 8.35-8.33 (d, 1H), 7.98-7.96 (d, 1H), 7.92-7.90 (d, 1H), 7.82 (s, 1H), 7.78-7.76 (m, 2H), 7.65-7.62 (m, 4H), 7.57-7.55 (m, 2H), 7.52-7.50 (m, 3H), 7.42-7.36 (m, 3H), 7.22-7.14 (m, 9H), 7.08-7.06 (m, 2H), 7.04-7.02 (m, 1H), 6.91-6.85 (m, 3H), 6.74-6.67 (m, 7H), 6.64 (d, 1H)

Synthesis Example 22

Synthesis of Compound 39

3.21 g of Compound 39 (yield: 65%) was synthesized in the same manner as used in Synthesis Example 18, except that (9,9-dimethyl-9H-fluorene-2-yl)-phenyll-[4-(4,4,5,5-tetramethyl-[1,3,2]dioxaborolan-2-yl-naphthalen-1-yl]-amine was used instead of Intermediate 42-A in synthesis of Intermediate 42-3, and (9,9-dimethyl-9H-fluorene-2-yl)-phenyl-amine was used instead of Intermediate 42-B in synthesis of Intermediate 42-4. The obtained compound was identified by LC-MS and NMR.

C$_{74}$H$_{55}$N$_3$: M$^+$ 985.57

1H NMR (CDCl$_3$, 400 MHz) δ 8.34-8.32 (d, 1H), 8.15-8.13 (d, 1H), 8.02-8.00 (d, 1H), 7.98-7.96 (d, 1H), 7.88-7.86 (m, 1H), 7.80-7.78 (m, 1H), 7.74-7.70 (m, 4H), 7.62-7.58 (m, 2H), 7.50-7.48 (m, 2H), 7.46-7.32 (m, 13H), 7.12-7.08 (m, 6H), 7.06-7.04 (d, 1H), 7.00-6.98 (d, 1H), 6.96-6.94 (d, 1H), 6.92-6.90 (d, 1H), 6.88-6.86 (m, 2H), 6.83-6.81 (m, 2H), 6.79-6.77 (m, 2H), 1.61 (s, 12H)

Synthesis Example 23

Synthesis of Compound 50

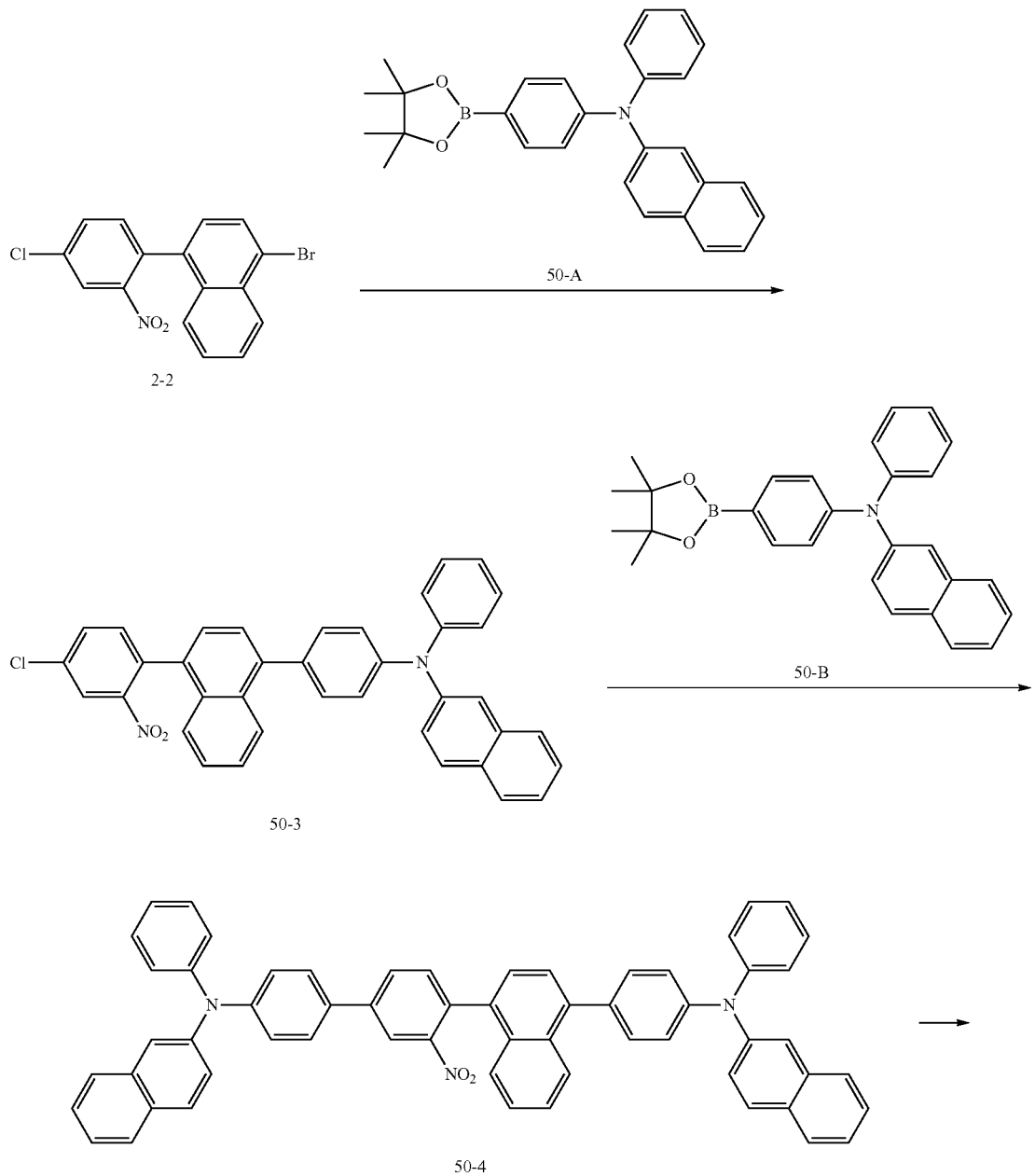

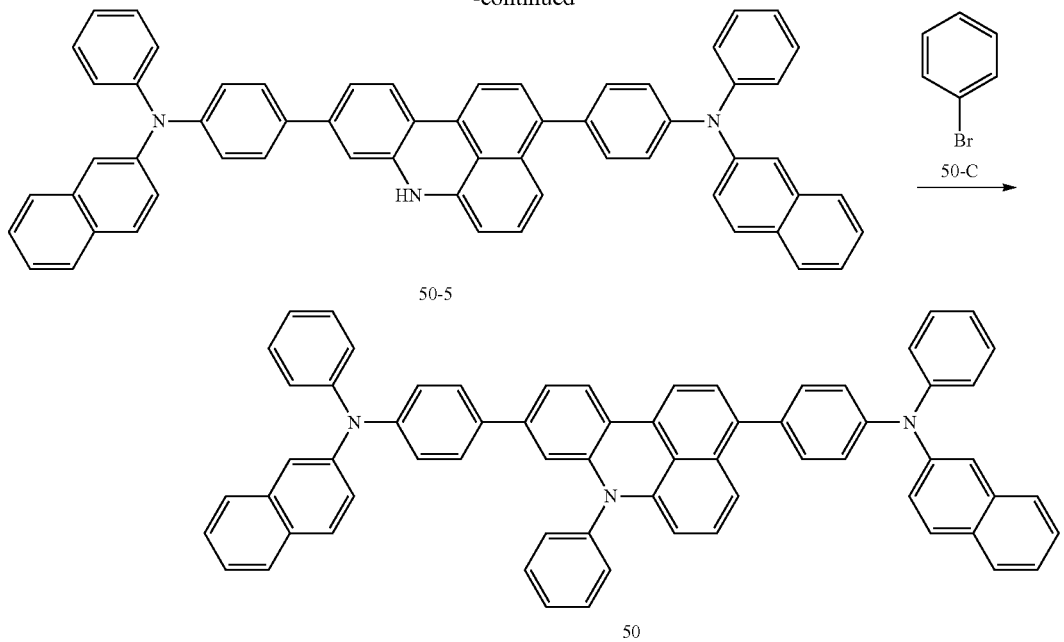

50-5

50

Synthesis of Intermediate 50-3

Intermediate 50-3 was synthesized in the same manner as used to synthesize Intermediate 2-2 of Synthesis Example 1, except that Intermediate 50-A was used instead of Intermediate 2-1, and Intermediate 2-2 was used instead of 1,4-dibromonaphthalene. The obtained compound was identified by LC-MS.

$C_{38}H_{25}ClN_2O_2$: $M^+$ 577.5

Synthesis of Intermediate 50-4

Intermediate 50-4 was synthesized in the same manner as used to synthesize Intermediate 30-2 of Synthesis Example 14, except that Intermediate 50-B was used instead of Intermediate 30-B, and Intermediate 50-3 was used instead of Intermediate 2-2. The obtained compound was identified by LC-MS.

$C_{60}H_{41}N_3O_2$: $M^+$ 836.3

Synthesis of Intermediate 50-5

Intermediate 50-5 was synthesized in the same manner as used to synthesize Intermediate 2-4 of Synthesis Example 1, except that Intermediate 50-4 was used instead of Intermediate 2-3. The obtained compound was identified by LC-MS.

$C_{60}H_{41}N_3$: $M^+$ 804.2

Synthesis of Compound 50

2.86 g of Compound 50 (yield: 65%) was synthesized in the same manner as used to synthesize Compound 2 of Synthesis Example 1, except that Intermediate 50-5 was used instead of Intermediate 2-4. The obtained compound was identified by LC-MS and NMR.

$C_{66}H_{45}N_3$: $M^+$ 880.4

1H NMR (CDCl$_3$, 400 MHz) δ 8.10-8.05 (m, 2H), 8.01-7.96 (m, 3H), 7.88-7.80 (m, 3H), 7.67-7.48 (m, 14H), 7.40-7.38 (m, 1H), 7.24-7.12 (m, 9H), 7.08-7.04 (m, 2H), 7.02-6.95 (m, 7H), 6.88-6.84 (m, 4H)

Synthesis Example 24

Synthesis of Compound 51

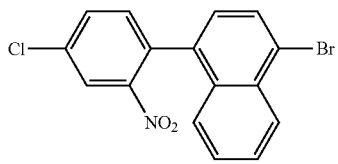

2-2

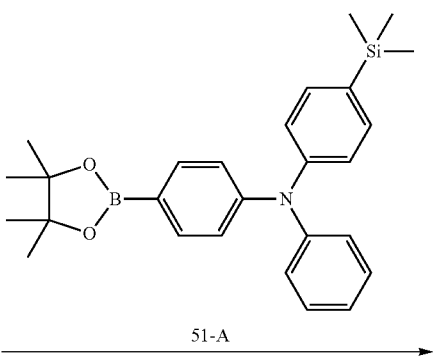

51-A

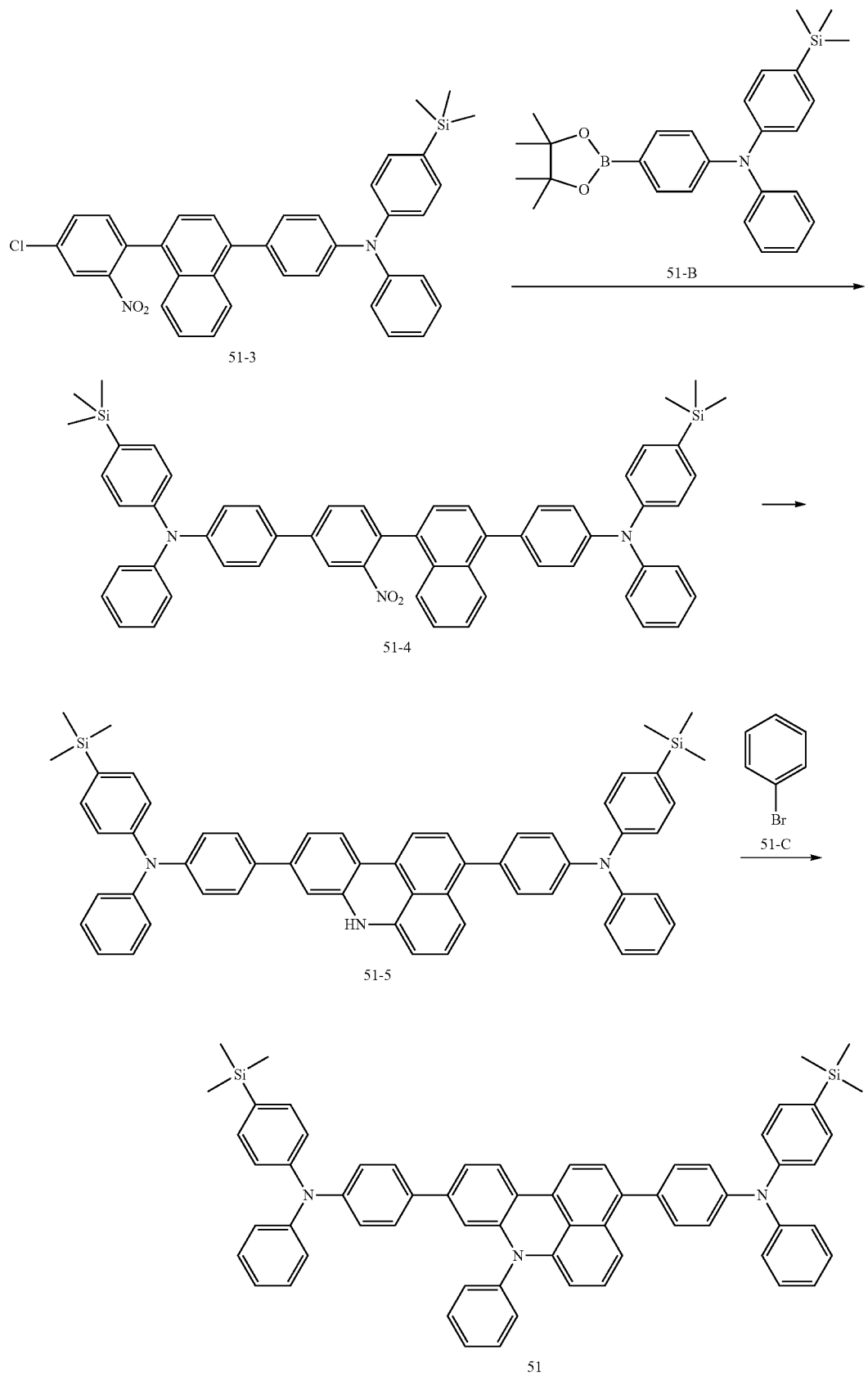

Synthesis of Intermediate 51-3

Intermediate 51-3 was synthesized in the same manner as used to synthesize Intermediate 2-2 of Synthesis Example 1, except that Intermediate 51-A was used instead of Intermediate 2-1, and Intermediate 2-2 was used instead of Intermediate 1,4-dibromonaphthalene. The obtained compound was identified by LC-MS.

$C_{37}H_{31}ClN_2O_2Si$: M$^+$ 599.5

Synthesis of Intermediate 51-4

Intermediate 51-4 was synthesized in the same manner as used to synthesize Intermediate 30-2 of Synthesis Example 14, except that Intermediate 51-B was used instead of Intermediate 30-B, and Intermediate 51-3 was used instead of Intermediate 2-2. The obtained compound was identified by LC-MS.

$C_{58}H_{53}N_3O_2Si_2$: M$^+$ 880.6

Synthesis of Intermediate 51-5

Intermediate 51-5 was synthesized in the same manner as used to synthesize Intermediate 2-4 of Synthesis Example 1, except that Intermediate 51-4 was used instead of Intermediate 2-3. The obtained compound was identified by LC-MS.

$C_{58}H_{53}N_3Si_2$: M$^+$ 848.4

Synthesis of Compound 51

3.05 g of Compound 51 (yield: 66%) was synthesized in the same manner as used to synthesize Compound 2 of Synthesis Example 1, except that Intermediate 51-5 was used instead of Intermediate 2-4. The obtained compound was identified by LC-MS and NMR.

$C_{64}H_{57}N_3Si_2$: M$^+$ 924.3

1H NMR (CDCl$_3$, 400 MHz) δ 8.15-8.12 (m, 2H), 8.08-8.06 (d, 1H), 8.02-8.00 (ss, 1H), 7.92-7.78 (m, 11H), 7.72-7.70 (m, 1H), 7.62-7.58 (m, 6H), 7.50-7.48 (m, 2H), 7.35-7.22 (m, 3H), 7.18-7.01 (m, 8H), 6.92-6.88 (m, 4H), 0.24 (s, 18H)

Synthesis Example 25

Synthesis of Compound 49

2.50 g of Compound 49 (yield: 64%) was synthesized in the same manner as used in Synthesis Example 23, except that diphenyl-[4-(4,4,5,5-tetramethyl-[1,3,2]dioxaborolan-2-yl)-phenyl]-amine was used instead of Intermediate 50-A in synthesis of Intermediate 50-3, and diphenyl-[4-(4,4,5,5-tetramethyl-[1,3,2]dioxaborolan-2-yl)-phenyl]-amine was used instead of Intermediate 50-B in synthesis of Intermediate 50-4. The obtained compound was identified by LC-MS and NMR.

$C_{58}H_{41}N_3$: M$^+$ 779.12

1H NMR (CDCl$_3$, 400 MHz) δ 8.18-8.13 (m, 2H), 8.09-8.07 (m, 1H), 8.03-8.01 (m, 1H), 7.85-7.80 (m, 6H), 7.75-7.73 (m, 1H), 7.65-7.63 (m, 1H), 7.58-7.53 (m, 10H), 7.41-7.36 (m, 2H), 7.14-7.10 (m, 5H), 7.05-7.01 (m, 4H), 6.97-6.95 (m, 8H)

Synthesis Example 26

Synthesis of Compound 55

2.57 g of Compound 55 (yield: 62%) was synthesized in the same manner as used in Synthesis Example 23, except that diphenyl-[4-(4,4,5,5-tetramethyl-[1,3,2]dioxaborolan-2-yl)-phenyl]-amine was used instead of Intermediate 50-A in synthesis of Intermediate 50-3, and diphenyl-[6-(4,4,5,5-tetramethyl-[1,3,2]dioxaborolan-2-yl)-naphthalen-2-yl]-amine was used instead of Intermediate 50-B in synthesis of intermediate 50-4. The obtained compound was identified by LC-MS and NMR.

$C_{62}H_{43}N_3$: M$^+$ 829.15

1H NMR (CDCl$_3$, 400 MHz) δ 8.09-8.07 (d, 1H), 8.00-7.98 (d, 1H), 7.98-7.96 (d, 1H), 7.90-7.88 (m, 2H), 7.80-7.76 (m, 2H), 7.70-7.68 (m, 1H), 7.60-7.55 (m, 5H), 7.49-7.47 (m, 1H), 7.37-7.35 (m, 1H), 7.30-7.25 (m, 10H), 7.24-7.20 (m, 3H), 7.05-7.00 (m, 5H), 6.98-6.96 (m, 2H), 6.85-6.82 (m, 8H)

Synthesis Example 27

Synthesis of Compound 58

2.81 g of Compound 58 (yield: 68%) was synthesized in the same manner as used in Synthesis Example 23, except that (4-fluoro-phenyl)-phenyl-[4-(4,4,5,5-tetramethyl-[1,3,2]dioxaborolan-2-yl)-phenyl]-amine was used instead of Intermediate 50-A in synthesis of Intermediate 50-3, and [5-(4,4,5,5-tetramethyl-[1,3,2]dioxaborolan-2-yl)-pyridine-2-yl]-di-o-tolyl-amine was used instead of Intermediate 50-B in syntheses of Intermediate 50-4. The obtained compound was identified by LC-MS and NMR.

$C_{59}H_{43}FN_4$: M$^+$ 826.54

1H NMR (CDCl$_3$, 400 MHz) δ 8.50-8.48 (d, 1H), 8.14-8.04 (m, 3H), 7.95-7.93 (dd, 1H), 7.78-7.76 (dd, 1H), 7.70-7.66 (m, 4H), 7.60-7.58 (d, 1H), 7.55-7.53 (m, 1H), 7.50-7.45 (m, 8H), 7.42-7.38 (m, 6H), 7.29-7.25 (m, 3H), 7.23-7.20 (m, 2H), 7.18-7.14 (m, 2H), 7.12-7.10 (m, 2H), 6.98-6.96 (m, 2H), 1.93 (s, 6H)

Example 1

An anode was prepared by cutting a Corning 15 Ωcm$^2$ (1,200 Å) ITO glass substrate to a size of 50 mm×50 mm×0.7 mm, ultrasonically cleaning the glass substrate using isopropyl alcohol and pure water for 5 minutes each, and then irradiating UV light for 30 minutes and exposing to ozone to clean. Then, the anode was loaded into a vacuum deposition apparatus.

2-TNATA was deposited on the ITO layer to form an HIL having a thickness of 600 Å, and then, NPB was deposited on the HIL to form an HTL having a thickness of 300 Å.

Subsequently, 9,10-di-naphthalen-2-yl-anthracene (ADN, host) and Compound 2 (dopant) were co-deposited on the HTL at a weight ratio of 98:2 to form an EML having a thickness of 300 Å.

Thereafter, Alq$_3$ was deposited on the EML to form an ETL having a thickness of 300 Å, and LiF was deposited on the ETL to form an EIL having a thickness of 10 Å, and then, Al was deposited on the EIL to form a second electrode (cathode) having a thickness of 3,000 Å, thereby completing manufacture of an organic light-emitting device.

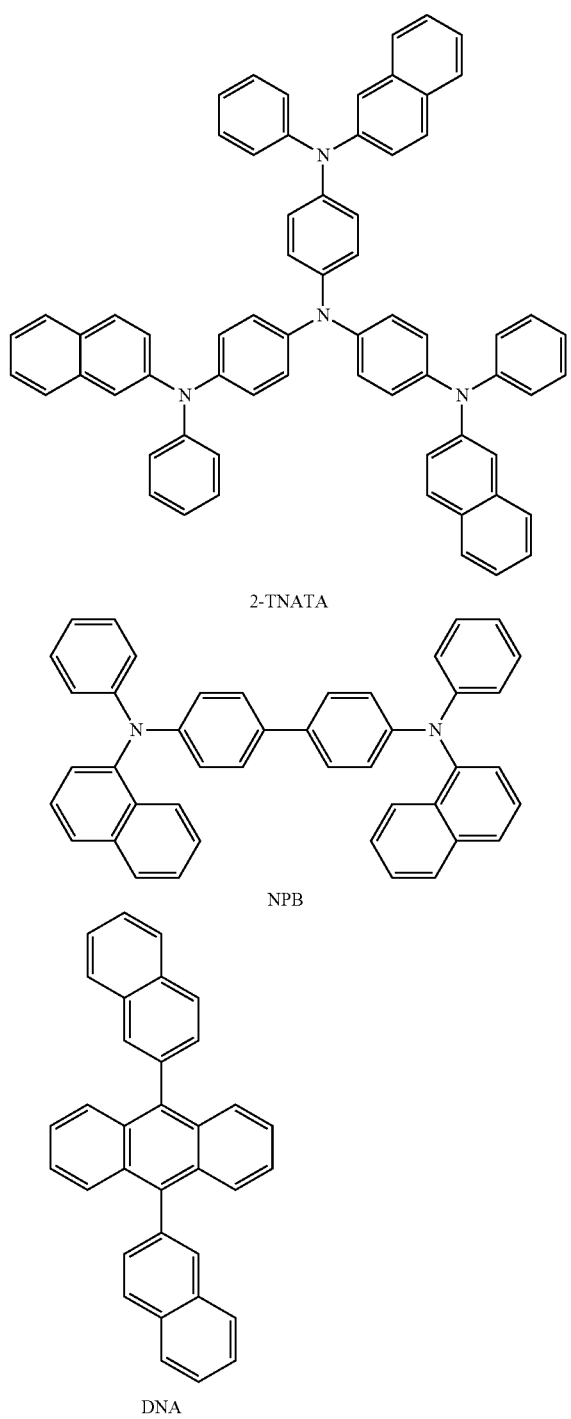

2-TNATA

NPB

DNA

Example 2

An organic light-emitting device was manufactured in the same manner as in Example 1, except that Compound 3 was used instead of Compound 2 in forming the EML.

Example 3

An organic light-emitting device was manufactured in the same manner as in Example 1, except that Compound 8 was used instead of Compound 2 in forming the EML.

Example 4

An organic light-emitting device was manufactured in the same manner as in Example 1, except that Compound 14 was used instead of Compound 2 in forming the EML.

Example 5

An organic light-emitting device was manufactured in the same manner as in Example 1, except that Compound 23 was used instead of Compound 2 in forming the EML.

Example 6

An organic light-emitting device was manufactured in the same manner as in Example 1, except that Compound 30 was used instead of Compound 2 in forming the EML.

Example 7

An organic light-emitting device was manufactured in the same manner as in Example 1, except that Compound 42 was used instead of Compound 2 in forming the EML.

Example 8

An organic light-emitting device was manufactured in the same manner as in Example 1, except that Compound 46 was used instead of Compound 2 in forming the EML.

Example 9

An organic light-emitting device was manufactured in the same manner as in Example 1, except that Compound 50 was used instead of Compound 2 in forming the EML.

Example 10

An organic light-emitting device was manufactured in the same manner as in Example 1, except that Compound 51 was used instead of Compound 2 in forming the EML.

Example 11

An organic light-emitting device was manufactured in the same manner as in Example 1, except that Compound 2 was used instead of 2-TNATA in forming the HIL, and Compound A was used instead of Compound 2 in forming the EML.

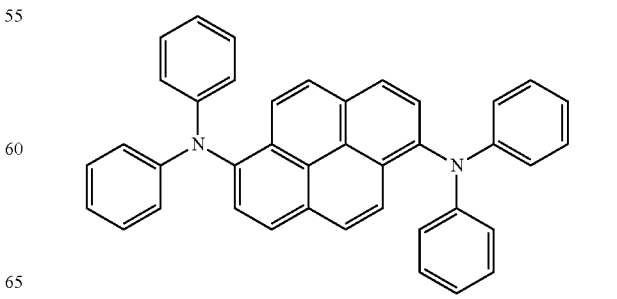

<Compound A>

Example 12

An organic light-emitting device was manufactured in the same manner as in Example 11, except that Compound 50 was used instead of Compound 2 in forming the HIL.

Comparative Example 1

An organic light-emitting device was manufactured in the same manner as in Example 1, except that Compound A was used instead of Compound 2 in forming the EML.

Comparative Example 2

An organic light-emitting device was manufactured in the same manner as in Example 1, except that Compound B was used instead of Compound 2 in forming the EML.

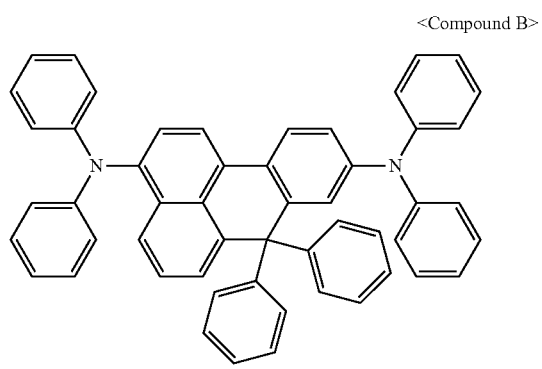 [SMILES: c1ccc(N(c2ccccc2)c2ccc3c(c2)C(c2ccccc2)(c2ccccc2)c2cccc4c(N(c5ccccc5)c5ccccc5)ccc-3c24)cc1]

<Compound B>

Comparative Example 3

An organic light-emitting device was manufactured in the same manner as in Example 1, except that Compound C was used instead of Compound 2 in forming the EML.

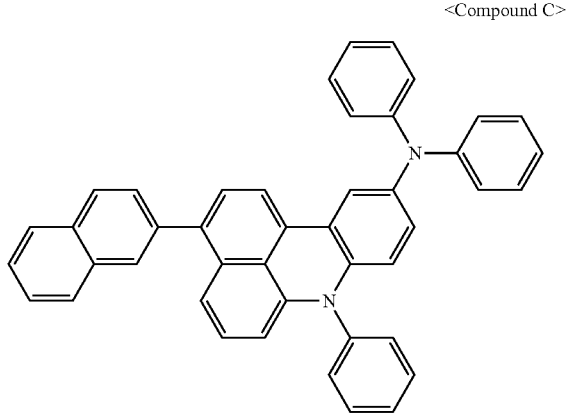 [SMILES: c1ccc(N(c2ccccc2)c2ccc3c(c2)-c2ccc(-c4ccc5ccccc5c4)c4cccc(c24)N3c2ccccc2)cc1]

<Compound C>

Evaluation Example 1

Driving voltage, current density, brightness, luminescence color, efficiency, and half-life lifetime (@50 mA/cm$^2$) of the organic light-emitting devices of Examples 1 to 12 and Comparative Examples 1 to 3 were evaluated by using PR650 Spectroscan Source Measurement Unit (available from PhotoResearch Company). The results thereof are shown in Table 1, below.

TABLE 1

| | HTL | Dopant | Driving voltage (V) | Current density (mA/cm$^2$) | Brightness (cd/m$^2$) | Efficiency (cd/A) | Luminescence color | Half-life lifetime (hr) |
|---|---|---|---|---|---|---|---|---|
| Example 1 | 2-TNATA | Compound 2 | 6.09 | 50 | 3250 | 6.50 | Blue | 358 |
| Example 2 | 2-TNATA | Compound 3 | 6.15 | 50 | 3205 | 6.41 | Blue | 372 |
| Example 3 | 2-TNATA | Compound 8 | 6.20 | 50 | 3515 | 7.03 | Blue | 341 |
| Example 4 | 2-TNATA | Compound 14 | 6.25 | 50 | 3210 | 6.42 | Blue | 343 |
| Example 5 | 2-TNATA | Compound 23 | 6.30 | 50 | 3390 | 6.78 | Blue | 344 |
| Example 6 | 2-TNATA | Compound 30 | 6.12 | 50 | 3375 | 6.75 | Blue | 358 |
| Example 7 | 2-TNATA | Compound 42 | 6.28 | 50 | 3510 | 7.02 | Blue | 379 |
| Example 8 | 2-TNATA | Compound 46 | 6.17 | 50 | 3260 | 6.52 | Blue | 330 |
| Example 9 | 2-TNATA | Compound 50 | 6.30 | 50 | 3200 | 6.40 | Blue | 375 |
| Example 10 | 2-TNATA | Compound 51 | 6.32 | 50 | 3190 | 6.38 | Blue | 388 |
| Example 11 | Compound 2 | Compound A | 5.82 | 50 | 9130 | 5.78 | Blue | 324 |
| Example 12 | Compound 50 | Compound A | 5.93 | 50 | 3190 | 5.94 | Blue | 309 |
| Comparative Example 1 | 2-TNATA | Compound A | 7.01 | 50 | 2645 | 5.29 | Blue | 258 |
| Comparative Example 2 | 2-TNATA | Compound B | 7.35 | 50 | 2065 | 4.13 | Blue | 245 |
| Comparative Example 3 | NPB | Compound C | 7.20 | 50 | 2515 | 5.03 | Blue | 240 |

From Table 1, it may be seen that the orgasmic light-emitting devices of Examples 1 to 12 had better driving voltage, brightness, efficiency, color purity, and lifetime characteristics than the organic light-emitting devices of Comparative Examples 1 to 3.

By way of summation and review, an OLED may have a structure including, e.g., a substrate, and an anode, a hole transport layer (HTL), an emission layer (EML), an electron transport layer (ETL), and a cathode, which are sequentially stacked on the substrate. The HTL, the EML, and the ETL may be organic thin films formed of organic compounds. An operating principle of an OLED having the above-described structure may be as follows When a voltage is applied between the anode and the cathode, holes injected from the anode may move to the EML via the HTL, and electrons injected from the cathode may move to the EML via the ETL. The holes and electrons (carriers) may recombine in the organic EML to generate excitons. When the excitons drop from an excited state to a ground state, light may be emitted.

As described above, according to an embodiment, an organic light-emitting device including the condensed-cyclic compound may have a low driving voltage, high brightness, high efficiency, and a long lifespan.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A condensed-cyclic compound represented by Formula 1:

<Formula 1>

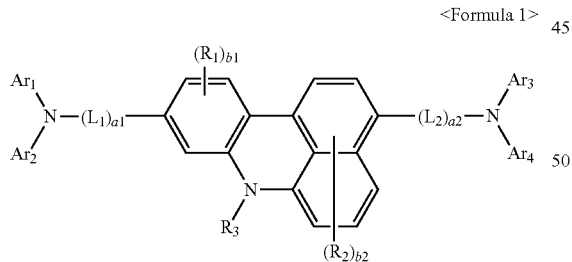

wherein $L_1$ and $L_2$ are each independently a substituted or unsubstituted $C_3$-$C_{10}$ cycloalkylene group, a substituted or unsubstituted $C_2$-$C_{10}$ heterocycloalkylene group, a substituted or unsubstituted $C_3$-$C_{10}$ cycloalkenylene group, a substituted or unsubstituted $C_2$-$C_{10}$ heterocycloalkenylene group, a substituted or unsubstituted $C_6$-$C_{60}$ arylene group, or a substituted or unsubstituted $C_2$-$C_{60}$ heteroarylene group;

a1 and a2 are each independently an integer of 0 to 3;

$Ar_1$ to $Ar_4$ are each independently a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, or a substituted or unsubstituted $C_2$-$C_{60}$ heteroaryl group;

$R_1$ to $R_3$ are each independently a hydrogen atom, a deuterium atom, a halogen atom, a hydroxyl group, a cyano group, a nitro group, an amino group, an amidino group, a hydrazine group, a hydrazone group, a carboxylic acid group or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ heterocycloalkyl group, a substituted or unsubstituted $C_3$-$C_{10}$ cycloalkenyl group, a substituted or unsubstituted $C_3$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_2$-$C_{60}$ heteroaryl group, $-Si(Q_1)(Q_2)(Q_3)$, or $-N(Q_4)(Q_5)$, wherein $Q_1$ to $Q_5$ are each independently a hydrogen atom, a $C_1$-$C_{60}$ alkyl group, a $C_1$-$C_{60}$ alkoxy group, a $C_6$-$C_{60}$ aryl group, or a $C_2$-$C_{60}$ heteroaryl group;

b1 is an integer of 1 to 3;

b2 is an integer of 1 to 5;

at least one substituent of the substituted $C_3$-$C_{10}$ cycloalkylene group, substituted $C_2$-$C_{10}$ heterocycloalkylene group, substituted $C_3$-$C_{10}$ cycloalkenylene group, substituted $C_2$-$C_{10}$ heterocycloalkenylene group, substituted $C_6$-$C_{60}$ arylene group, substituted $C_2$-$C_{60}$ heteroarylene group, substituted $C_3$-$C_{10}$ cycloalkyl group, substituted $C_2$-$C_{10}$ heterocycloalkyl group, substituted $C_3$-$C_{10}$ cycloalkenyl group, substituted $C_2$-$C_{10}$ heterocycloalkenyl group, substituted $C_6$-$C_{60}$ aryl group, substituted $C_2$-$C_{60}$ heteroaryl group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_6$-$C_{60}$ aryloxy group, and substituted $C_6$-$C_{60}$ arylthio group is:

a deuterium atom, a halogen atom, a hydroxyl group, a cyano group, a nitro group, an amino group, an amidino group, a hydrazine group, a hydrazone group, a carboxylic acid group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with at least one of a deuterium atom, a halogen atom, a hydroxyl group, a cyano group, a nitro group, an amino group, an amidino group, a hydrazine group, a hydrazone group, a carboxylic acid group or a salt thereof, a sulfonic acid or a salt thereof, or a phosphoric acid or a salt thereof;

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, or a $C_2$-$C_{60}$ heteroaryl group;

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, or a $C_2$-$C_{60}$ heteroaryl group, each substituted with at least one of a deuterium atom, a halogen atom, a hydroxyl group, a cyano group, a nitro group, an amino group, an amidino group, a hydrazine group, a hydrazone group, a carboxylic acid group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, or a $C_2$-$C_{60}$ heteroaryl group; or —Si($Q_{11}$)($Q_{12}$)($Q_{13}$) and —N($Q_{14}$)($Q_{15}$), wherein $Q_{11}$ to $Q_{15}$ are each independently a hydrogen atom, a $C_1$-$C_{60}$ alkyl group, a $C_1$-$C_{60}$ alkoxy group, a $C_6$-$C_{60}$ aryl group, or a $C_2$-$C_{60}$ heteroaryl group.

2. The condensed-cyclic compound as claimed in claim 1, wherein:

a1 or a2 is an integer of 1 to 3, and $L_1$ and $L_2$ are each independently a substituted or unsubstituted phenylene group, a substituted or unsubstituted pentalenylene group, a substituted or unsubstituted indenylene group, a substituted or unsubstituted naphthylene group, a substituted or unsubstituted azulenylene group, a substituted or unsubstituted heptalenylene group, a substituted or unsubstituted indacenylene group, a substituted or unsubstituted acenaphthylene group, a substituted or unsubstituted fluorenylene group, a substituted or unsubstituted spiro-fluorenylene group, a substituted or unsubstituted phenalenylene group, a substituted or unsubstituted phenanthrenylene group, a substituted or unsubstituted anthracenylene group, a substituted or unsubstituted fluoranthenylene group, a substituted or unsubstituted triphenylenylene group, a substituted or unsubstituted pyrenylene group, a substituted or unsubstituted chrysenylene group, a substituted or unsubstituted naphthacenylene group, a substituted or unsubstituted picenylene group, a substituted or unsubstituted perylenylene group, a substituted or unsubstituted pentaphenylene group, a substituted or unsubstituted hexacenylene group, a substituted or unsubstituted pyrrolylene group, a substituted or unsubstituted imidazolylene group, a substituted or unsubstituted pyrazolylene group, a substituted or unsubstituted pyridinylene group, a substituted or unsubstituted pyrazinylene group, a substituted or unsubstituted pyrimidinylene group, a substituted or unsubstituted pyridazinylene group, a substituted or unsubstituted isoindolylene group, a substituted or unsubstituted indolylene group, a substituted or unsubstituted indazolylene group, a substituted or unsubstituted purinylene group, a substituted or unsubstituted quinolinylene group, a substituted or unsubstituted benzoquinolinylene group, a substituted or unsubstituted phthalazinylene group, a substituted or unsubstituted naphthyridinylene group, a substituted or unsubstituted quinoxalinylene group, a substituted or unsubstituted quinazolinylene group, a substituted or unsubstituted cinnolinylene group, a substituted or unsubstituted carbazolylene group, a substituted or unsubstituted phenanthridinylene group, a substituted or unsubstituted acridinylene group, a substituted or unsubstituted phenanthrolinylene group, a substituted or unsubstituted phenazinylene group, a substituted or unsubstituted benzooxazolylene group, a substituted or unsubstituted benzoimidazolylene group, a substituted or unsubstituted furanylene group, a substituted or unsubstituted benzofuranylene group, a substituted or unsubstituted thiophenylene group, a substituted or unsubstituted benzothiophenylene group, a substituted or unsubstituted thiazolylene group, a substituted or unsubstituted isothiazolylene group, a substituted or unsubstituted benzothiazolylene group, a substituted or unsubstituted isoxazolylene group, a substituted or unsubstituted oxazolylene group, a substituted or unsubstituted triazolylene group, a substituted or unsubstituted tetrazolylene group, a substituted or unsubstituted oxadiazolylene group, a substituted or unsubstituted triazinylene group, a substituted or unsubstituted benzooxazolylene group, a substituted or unsubstituted dibenzofuranylene group, a substituted or unsubstituted dibenzothiophenylene group, a substituted or unsubstituted benzocarbazolylene group, or a substituted or unsubstituted dibenzosilolylene group, wherein at least one substituent of the substituted phenylene group, substituted pentalenylene group, substituted indenylene group, substituted naphthylene group, substituted azulenylene group, substituted heptalenylene group, substituted indacenylene group, substituted acenaphthylene group, substituted fluorenylene group, substituted spiro-fluorenylene group, substituted phenalenylene group, substituted phenanthrenylene group, substituted anthracenylene group, substituted fluoranthenylene group, substituted triphenylenylene group, substituted pyrenylene group, substituted chrysenylene group, substituted naphthacenylene group, substituted picenylene group, substituted perylenylene group, substituted pentaphenylene group, substituted hexacenylene group, substituted pyrrolylene group, substituted imidazolylene group, substituted pyrazolylene group, substituted pyridinylene group, substituted pyrazinylene group, substituted pyrimidinylene group, substituted pyridazinylene group, substituted isoindolylene group, substituted indolylene group, substituted indazolylene group, substituted purinylene group, substituted quinolinylene group, substituted benzoquinolinylene group, substituted phthalazinylene group, substituted naphthyridinylene group, substituted quinoxalinylene group, substituted quinazolinylene group, substituted cinnolinylene group, substituted carbazolylene group, substituted phenanthridinylene group, substituted acridinylene group, unsubstituted phenanthrolinylene group, substituted phenazinylene group, substituted benzooxazolylene group, substituted benzoimidazolylene group substituted furanylene group, substituted benzofuranylene group, substituted thiophenylene group, substituted benzothiophenylene group, substituted thiazolylene group, substituted isothiazolylene group, substituted benzothiazolylene group, substituted isoxazolylene group, substituted oxazolylene group, substituted triazolylene group, substituted tetrazolylene group, substituted oxadiazolylene group, substituted triazinylene group, substituted benzooxazolylene group, substituted dibenzofuranylene group, substituted dibenzothiophenylene group, substituted benzocarbazolylene group, and substituted dibenzosilolylene group is:

a deuterium atom, a halogen atom, a hydroxyl group, a cyano group, a nitro group, an amino group, an amidino group, a hydrazine group, a hydrazone group, a carboxylic acid group or a salt thereof, a sulfonic acid or a salt thereof, a phosphoric acid or a salt thereof, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with at least one of a deuterium atom, a halogen atom, a hydroxyl group, a cyano group, a nitro group, an amino group, an amidino group, a hydrazine group, a hydrazone group, a carboxylic acid group or a salt thereof, a sulfonic acid or a salt thereof, or a phosphoric acid or a salt thereof;

a $C_6$-$C_{20}$ aryl group or a $C_2$-$C_{20}$ heteroaryl group; or a $C_6$-$C_{20}$ aryl group or a $C_2$-$C_{20}$ heteroaryl group, each substituted with at least one of a deuterium atom, a halogen atom, a hydroxyl group, a cyano group, a nitro group, an amino group, an amidino group, a hydrazine group, a hydrazone group, a carboxylic acid group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a fluorenyl group, a dimethylfluorenyl group, a phenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group.

3. The condensed-cyclic compound as claimed in claim 1, wherein:

a1 or a2 is an integer of 1 to 3, and $L_1$ and $L_2$ are each independently represented by one of the following Formulae 2-1 to 2-28:

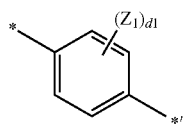

Formula 2-1

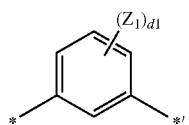

Formula 2-2

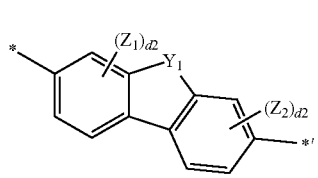

Formula 2-3

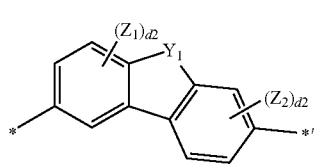

Formula 2-4

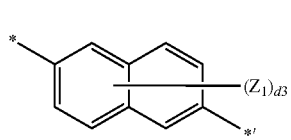

Formula 2-5

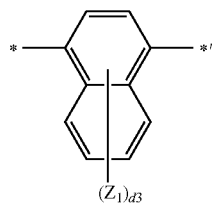

Formula 2-6

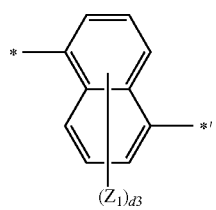

Formula 2-7

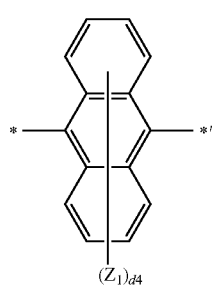

Formula 2-8

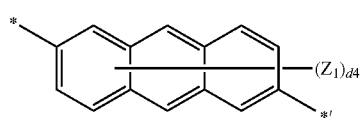

Formula 2-9

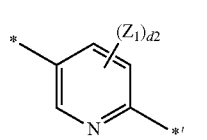

Formula 2-10

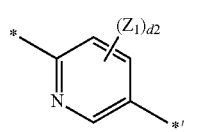

Formula 2-11

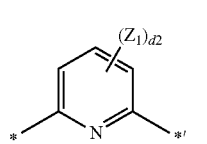

Formula 2-12

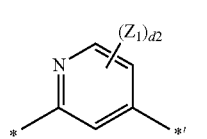

Formula 2-13

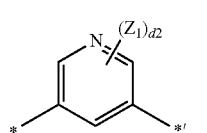

Formula 2-14

-continued

Formula 2-15 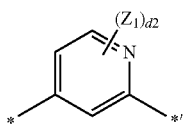

Formula 2-16 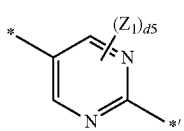

Formula 2-17 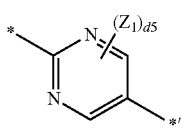

Formula 2-18 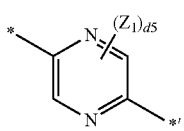

Formula 2-19 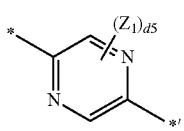

Formula 2-20 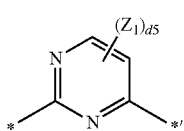

Formula 2-21 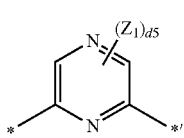

Formula 2-22 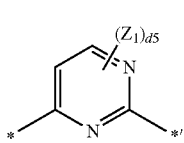

Formula 2-23 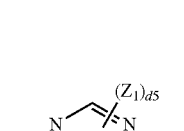

Formula 2-24 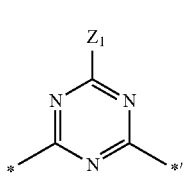

Formula 2-25 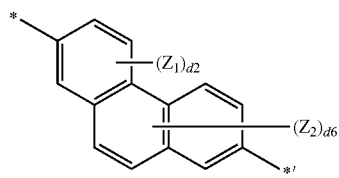

Formula 2-26 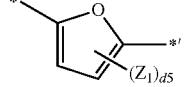

Formula 2-27 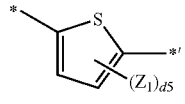

Formula 2-28 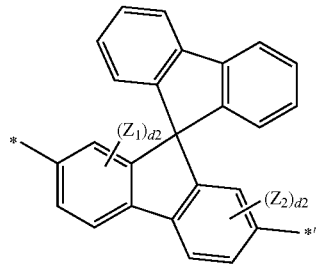

wherein $Y_1$ is O, S, $C(Z_3)(Z_4)$, $N(Z_5)$, or $Si(Z_6)(Z_7)$;

$Z_1$ to $Z_7$ are each independently:

a hydrogen atom, a deuterium atom, a halogen atom, a hydroxyl group, a cyano group, a nitro group, an amino group, an amidino group, a hydrazine group, a hydrazone group, a carboxylic acid group or a salt thereof, a sulfonic acid or a salt thereof, a phosphoric acid or a salt thereof, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with at least one of a deuterium atom, a halogen atom, a hydroxyl group, a cyano group, a nitro group, an amino group, an amidino group, a hydrazine group, a hydrazone group, a carboxylic acid group or a salt thereof, a sulfonic acid or a salt thereof, or a phosphoric acid or a salt thereof;

a $C_6$-$C_{20}$ aryl group or a $C_2$-$C_{20}$ heteroaryl group; or a $C_6$-$C_{20}$ aryl group or a $C_2$-$C_{20}$ heteroaryl group, each substituted with at least one of a deuterium atom, a halogen atom, a hydroxyl group, a cyano group, a nitro group, an amino group, an amidino group, a hydrazine group, a hydrazone group, a carboxylic acid group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a fluorenyl group, a dimethylfluorenyl group, a phenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group;

d1 is an integer of 1 to 4;
d2 is an integer of 1 to 3;
d3 is an integer of 1 to 6;
d4 is an integer of 1 to 8;

d5 is an integer of 1 or 2;
d6 is an integer of 1 to 5; and
* and *' are each independently a binding site with a neighboring atom.

4. The condensed-cyclic compound as claimed in claim 3, wherein $Z_1$ to $Z_7$ are each independently a hydrogen atom, a deuterium atom, a halogen atom, a hydroxyl group, a cyano group, a nitro group, an amino group, an amidino group, a hydrazine group, a hydrazone group, a carboxylic acid group or a salt thereof, a sulfonic acid or a salt thereof, a phosphoric acid or a salt thereof, a methyl group, an ethyl group, a propyl group, a butyl group, a pentyl group, a hexyl group, a heptyl group, or an octyl group.

5. The condensed-cyclic compound as claimed in claim 1, wherein:
   a1 or a2 is an integer of 1 to 3, and
   $L_1$ and $L_2$ are each independently represented by one of Formulae 3-1 to 3-21:

Formula 3-1
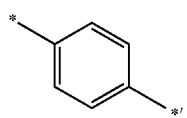

Formula 3-2
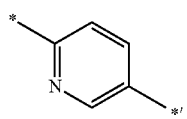

Formula 3-3
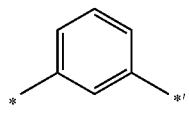

Formula 3-4
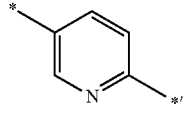

Formula 3-5
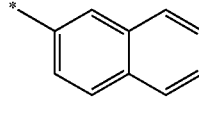

Formula 3-6
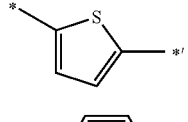

Formula 3-7
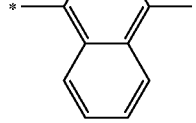

Formula 3-8
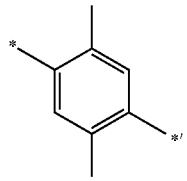

-continued

Formula 3-9
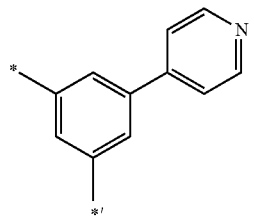

Formula 3-10
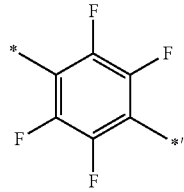

Formula 3-11
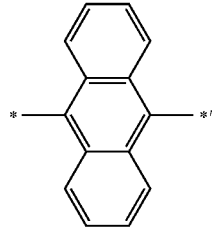

Formula 3-12
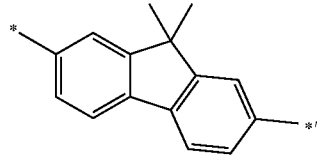

Formula 3-13
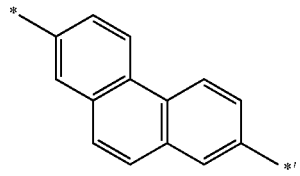

Formula 3-14
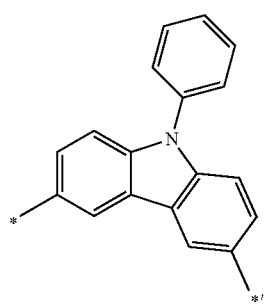

Formula 3-15
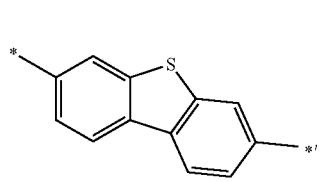

-continued

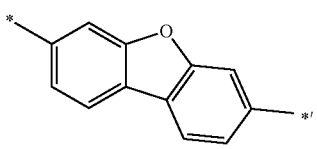
Formula 3-16

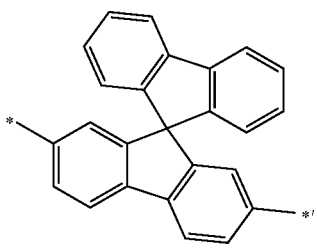
Formula 2-17

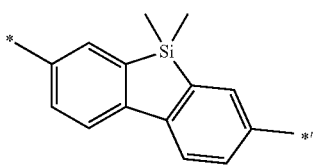
Formula 3-18

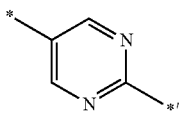
Formula 3-19

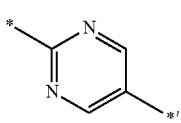
Formula 3-20

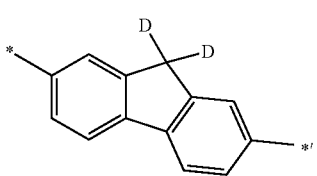
Formula 3-21 wherein * and *' are each independently a binding site with a neighboring atom.

6. The condensed-cyclic compound as claimed in claim 1, wherein
a1 is 0, and a2 is 0;
a1 is 0, and a2 is 1;
a1 is 0, and a2 is 2;
a1 is 0, and a2 is 3;
a1 is 1, and a2 is 0;
a1 is 1, and a2 is 1;
a1 is 1, and a2 is 2;
a1 is 1, and a2 is 3;
a1 is 2, and a2 is 0;
a1 is 2, and a2 is 1; or
a1 is 2, and a2 is 2.

7. The condensed-cyclic compound as claimed in claim 1, wherein $Ar_1$ to $Ar_4$ are each independently a substituted or unsubstituted phenyl group, a substituted or unsubstituted pentalenyl group, a substituted or unsubstituted indenyl group, a substituted or unsubstituted naphthyl group, a substituted or unsubstituted azulenyl group, a substituted or unsubstituted heptalenyl group, a substituted or unsubstituted indacenyl group, a substituted or unsubstituted ace- naphthyl group, a substituted or unsubstituted fluorenyl group, a substituted or unsubstituted spiro-fluorenyl group, a substituted or unsubstituted phenalenyl group, a substituted or unsubstituted phenanthrenyl group, a substituted or unsubstituted anthracenyl group, a substituted or unsubstituted fluoranthenyl group, a substituted or unsubstituted triphenylenyl group, a substituted or unsubstituted pyrenyl group, a substituted or unsubstituted chrysenyl group, a substituted or unsubstituted naphthacenyl group, a substituted or unsubstituted picenyl group, a substituted or unsubstituted perylenyl group, a substituted or unsubstituted pentaphenyl group, a substituted or unsubstituted hexacenyl group, a substituted or unsubstituted pyrrolyl group, a substituted or unsubstituted imidazolyl group, a substituted or unsubstituted pyrazolyl group, a substituted or unsubstituted pyridinyl group, a substituted or unsubstituted pyrazinyl group, a substituted or unsubstituted pyrimidinyl group, a substituted or unsubstituted pyridazinyl group, a substituted or unsubstituted isoindolyl group, a substituted or unsubstituted indolyl group, a substituted or unsubstituted indazolyl group, a substituted or unsubstituted purinyl group, a substituted or unsubstituted quinolinyl group, a substituted or unsubstituted benzoquinolinyl group, a substituted or unsubstituted phthalazinyl group, a substituted or unsubstituted naphthyridinyl group, a substituted or unsubstituted quinoxalinyl group, a substituted or unsubstituted quinazolinyl group, a substituted or unsubstituted cinnolinyl group, a substituted or unsubstituted carbazolyl group, a substituted or unsubstituted phenanthridinyl group, a substituted or unsubstituted acridinyl group, a substituted or unsubstituted phenanthrolinyl group, a substituted or unsubstituted phenazinyl group, a substituted or unsubstituted benzooxazolyl group, a substituted or unsubstituted benzoimidazolyl group, a substituted or unsubstituted furanyl group, a substituted or unsubstituted benzofuranyl group, a substituted or unsubstituted thiophenyl group, a substituted or unsubstituted benzothiophenyl group, a substituted or unsubstituted thiazolyl group, a substituted or unsubstituted isothiazolyl group, a substituted or unsubstituted benzothiazolyl group, a substituted or unsubstituted isoxazolyl group, a substituted or unsubstituted oxazolyl group, a substituted or unsubstituted triazolyl group, a substituted or unsubstituted tetrazolyl group, a substituted or unsubstituted oxadiazolyl group, a substituted or unsubstituted triazinyl group, a substituted or unsubstituted benzooxazolyl group, a substituted or unsubstituted dibenzofuranyl group, a substituted or unsubstituted dibenzothiophenyl group, a substituted or unsubstituted benzocarbazolyl group, or a substituted or unsubstituted dibenzosilolyl group;
at least one substituent of the substituted phenyl group, substituted pentalenyl group, substituted indenyl group, substituted naphthyl group, substituted azulenyl group, substituted heptalenyl group, substituted indacenyl group, substituted acenaphthyl group, substituted fluorenyl group, substituted spiro-fluorenyl group, substituted phenalenyl group, substituted phenanthrenyl group, substituted anthracenyl group, substituted fluoranthenyl group, substituted triphenylenyl group, substituted pyrenyl group, substituted chrysenyl group, substituted naphthacenyl group, substituted picenyl group, substituted perylenyl group, substituted pentaphenyl group, substituted hexacenyl group, substituted pyrrolyl group, substituted imidazolyl group, substituted pyrazolyl group, substituted pyridinyl group, substituted pyrazinyl group, substituted pyrimidinyl group, substituted pyridazinyl group, substituted isoindolyl group, substituted indolyl group, substituted indazolyl group, substituted purinyl group, substituted quinolinyl group, substituted benzoquinolinyl group, substituted phthalazinyl group, substituted naphthyridinyl group, substituted quinoxalinyl group, substituted quinazolinylene group, substituted cinnolinylene group, substituted carbazolylene group, substituted phenanthridinyl group, substituted acridinyl group, unsubstituted phenanthrolinyl group, substituted phenazinyl group, substituted benzooxazolyl group, substituted benzoimidazolyl group substituted furanyl group, substituted benzofuranyl group, substituted thiophenyl group, substituted benzothiophenyl group, substituted thiazolyl group, substituted isothiazolyl group, substituted benzothiazolyl group, substituted isooxazolyl group, substituted oxazolyl group, substituted triazolyl group, substituted tetrazolyl group, substituted oxadiazolyl group, substituted triazinyl group, substituted benzooxazolyl group, substituted dibenzofuranyl group, substituted dibenzothiophenyl group, substituted benzocarbazolyl group, and substituted dibenzosilolyl group is:

a deuterium atom, a halogen atom, a hydroxyl group, a cyano group, a nitro group, an amino group, an amidino group, a hydrazine group, a hydrazone group, a carboxylic acid group or a salt thereof, a sulfonic acid or a salt thereof, a phosphoric acid or a salt thereof, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with at least one of a deuterium atom, a halogen atom, a hydroxyl group, a cyano group, a nitro group, an amino group, an amidino group, a hydrazine group, a hydrazone group, a carboxylic acid group or a salt thereof, a sulfonic acid or a salt thereof, or a phosphoric acid or a salt thereof;

a $C_6$-$C_{20}$ aryl group or a $C_2$-$C_{20}$ heteroaryl group; or a $C_6$-$C_{20}$ aryl group or a $C_2$-$C_{20}$ heteroaryl group, each substituted with at least one of a deuterium atom, a halogen atom, a hydroxyl group, a cyano group, a nitro group, an amino group, an amidino group, a hydrazine group, a hydrazone group, a carboxylic acid group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a fluorenyl group, a dimethylfluorenyl group, a phenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group.

8. The condensed-cyclic compound as claimed in claim 1, wherein $Ar_1$ to $Ar_4$ are each independently represented by one of Formulae 5-1 to 5-14:

Formula 5-1

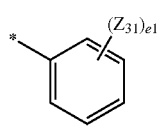

Formula 5-2

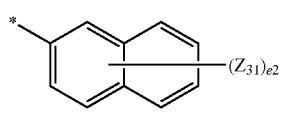

Formula 5-3

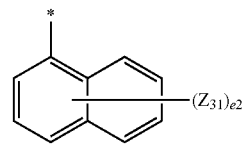

Formula 5-4

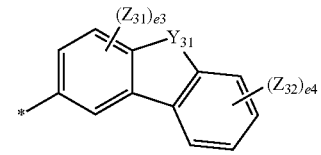

Formula 5-5

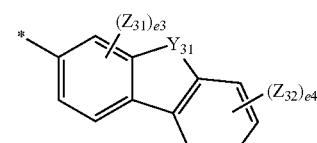

Formula 5-6

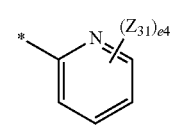

Formula 5-7

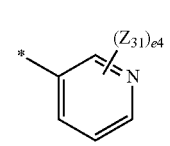

Formula 5-8

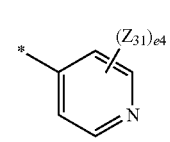

Formula 5-9

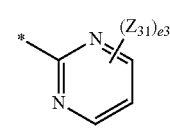

Formula 5-10

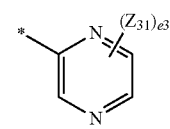

Formula 5-11

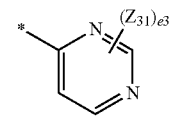

Formula 5-12

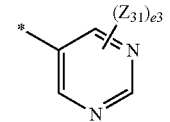

Formula 5-13

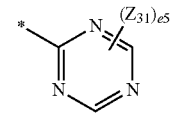

Formula 5-14

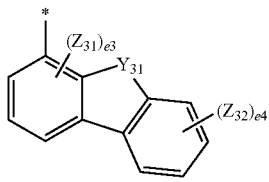

wherein Y$_{31}$ is O, S, C(Z$_{33}$)(Z$_{34}$), or N(Z$_{35}$);

Z$_{31}$ to Z$_{35}$ are each independently:

a hydrogen atom, a deuterium atom, a halogen atom, a hydroxyl group, a cyano group, a nitro group, an amino group, an amidino group, a hydrazine group, a hydrazone group, a carboxylic acid group or a salt thereof, a sulfonic acid or a salt thereof, a phosphoric acid or a salt thereof, a C$_1$-C$_{20}$ alkyl group, or a C$_1$-C$_{20}$ alkoxy group;

a C$_1$-C$_{20}$ alkyl group or a C$_1$-C$_{20}$ alkoxy group, each substituted with at least one of a deuterium atom, a halogen atom, a hydroxyl group, a cyano group, a nitro group, an amino group, an amidino group, a hydrazine group, a hydrazone group, a carboxylic acid group or a salt thereof, a sulfonic acid or a salt thereof, or a phosphoric acid or a salt thereof;

a C$_6$-C$_{20}$ aryl group or a C$_2$-C$_{20}$ heteroaryl group;

a C$_6$-C$_{20}$ aryl group or a C$_2$-C$_{20}$ heteroaryl group, each substituted with at least one of a deuterium atom, a halogen atom, a hydroxyl group, a cyano group, a nitro group, an amino group, an amidino group, a hydrazine group, a hydrazone group, a carboxylic acid group or a salt thereof, a sulfonic acid or a salt thereof, a phosphoric acid or a salt thereof, a C$_1$-C$_{60}$ alkyl group, a C$_2$-C$_{60}$ alkenyl group, a C$_2$-C$_{60}$ alkynyl group, a C$_1$-C$_{60}$ alkoxy group, a phenyl group, a naphthyl group, an anthracenyl group, a fluorenyl group, a dimethylfluorenyl group, a phenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group; or Si(Q$_{11}$)(Q$_{12}$)(Q$_{13}$), wherein Q$_{11}$ to Q$_{13}$ are each independently a C$_1$-C$_{20}$ alkyl group, a phenyl group, a naphthyl group, or an anthracenyl group, e1 is an integer of 1 to 5;
e2 is an integer of 1 to 7;
e3 is an integer of 1 to 3;
e4 is an integer of 1 to 4;
e5 is an integer of 1 or 2; and
* is a binding site with a neighboring atom.

9. The condensed-cyclic compound as claimed in claim 8, wherein Z$_{31}$ to Z$_{35}$ are each independently:

a hydrogen atom, a deuterium atom, a halogen atom, a hydroxyl group, a cyano group, a nitro group, an amino group, an amidino group, a hydrazine group, a hydrazone group, a carboxylic acid group or a salt thereof, a sulfonic acid or a salt thereof, a phosphoric acid or a salt thereof, a methyl group, an ethyl group, a propyl group, a butyl group, a pentyl group, a hexyl group, a heptyl group, an octyl group, a methoxy group, an ethoxy group, a propoxy group, a butoxy group, or a pentoxy group;

a methyl group, an ethyl group, a propyl group, a butyl group, a pentyl group, a hexyl group, a heptyl group, an octyl group, a methoxy group, an ethoxy group, a propoxy group, a butoxy group, or a pentoxy group, each substituted with at least one of a deuterium atom, a halogen atom, a hydroxyl group, a cyano group, a nitro group, an amino group, an amidino group, a hydrazine group, a hydrazone group, a carboxylic acid group or a salt thereof, a sulfonic acid or a salt thereof, or a phosphoric acid or a salt thereof;

a phenyl group, a naphthyl group, an anthracenyl group, a phenanthrenyl group, a pyridinyl group, a pyrimidinyl group, a pyridazinyl group, a triazinyl group, a quinolinyl group, or an isoquinolinyl group; or Si(Q$_{11}$)(Q$_{12}$)(Q$_{13}$), wherein Q$_{11}$ to Q$_{13}$ are each independently a C$_1$-C$_{20}$ alkyl group, a phenyl group, a naphthyl group, or an anthracenyl group.

10. The condensed-cyclic compound as claimed in claim 1, wherein Ar$_1$ to Ar$_4$ are each independently represented by one of Formulae 6-1 to 6-24:

Formula 6-1

Formula 6-2

Formula 6-3

Formula 6-4

Formula 6-5

Formula 6-6

Formula 6-7

Formula 6-8

Formula 6-9

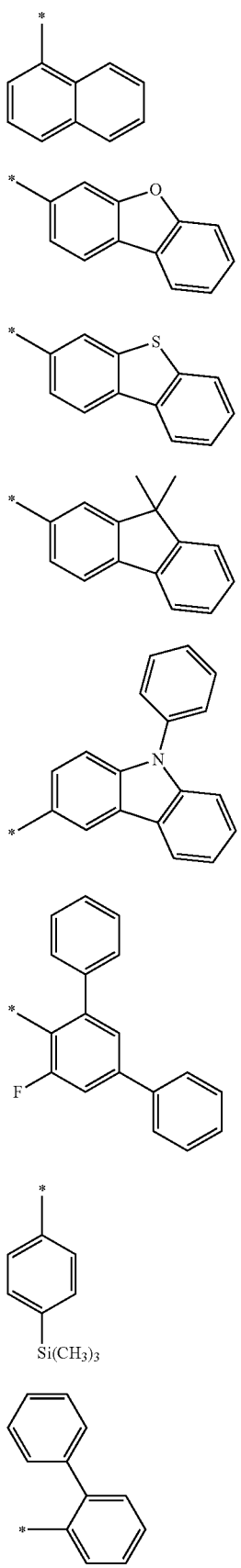
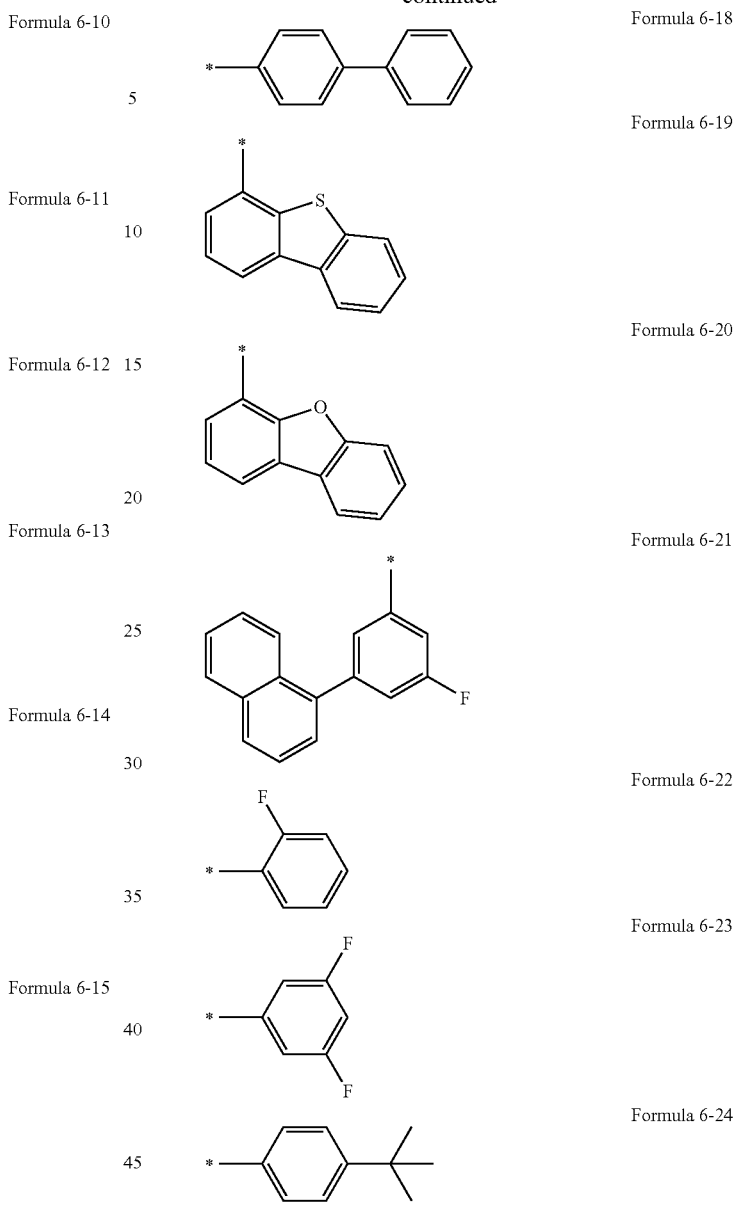

wherein * is a binding site with a neighboring atom.

11. The condensed-cyclic compound as claimed in claim 1, wherein:

$Ar_1=Ar_2=Ar_3=Ar_4$;

$Ar_1 \neq Ar_2$, $Ar_1=Ar_3$, and $Ar_2=Ar_4$;

$Ar_1 \neq Ar_2$, $Ar_1=Ar_3$, and $Ar_2 \neq Ar_4$; or $Ar_1 \neq Ar_2 \neq Ar_3 \neq Ar_4$.

12. The condensed-cyclic compound as claimed in claim 1, wherein $R_3$ is:

a $C_1$-$C_{20}$ alkyl group or a $C_1$-$C_{20}$ alkoxy group;

a $C_1$-$C_{20}$ alkyl group or a $C_1$-$C_{20}$ alkoxy group, each substituted with at least one of a deuterium atom, a halogen atom, a hydroxyl group, a cyano group, a nitro group, an amino group, an amidino group, a hydrazine group, a hydrazone group, a carboxylic acid group or a salt thereof, a sulfonic acid or a salt thereof, or a phosphoric acid or a salt thereof;

a phenyl group, a naphthyl group, an anthracenyl group, a fluorenyl group, a pyridinyl group, a pyrimidinyl group, a quinolinyl group, an isoquinolinyl group, or a triazinyl group; or a phenyl group, a naphthyl group, an anthracenyl group, a fluorenyl group, a pyridinyl group, a pyrimidinyl group, a quinolinyl group, an isoquinolinyl group, or a triazinyl group, each substituted with at least one of a deuterium atom, a halogen atom, a hydroxyl group, a cyano group, a nitro group, an amino group, an amidino group, a hydrazine group, a hydrazone group, a carboxylic acid group or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an anthracenyl group, a fluorenyl group, a pyridinyl group, a pyrimidinyl group, a quinolinyl group, an isoquinolinyl group, or a triazinyl group.

13. The condensed-cyclic compound as claimed in claim 1, wherein $R_1$ and $R_2$ are each independently a hydrogen atom, a deuterium atom, a halogen atom, a hydroxyl group, a cyano group, a nitro group, an amino group, an amidino group, a hydrazine group, a hydrazone group, a carboxylic acid group or a salt thereof, a sulfonic acid or a salt thereof, a phosphoric acid or a salt thereof, a $C_1$-$C_{20}$ alkyl group, a phenyl group, a naphthyl group, or an anthracenyl group.

14. The condensed-cyclic compound as claimed in claim 1, wherein the condensed-cyclic compound represented by Formula 1 is represented by one of Formulae 1A to 1D:

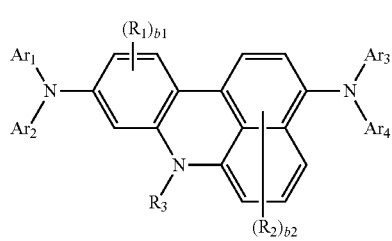
<Formula 1A>

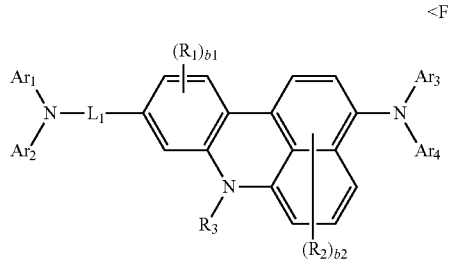
<Formula 1B>

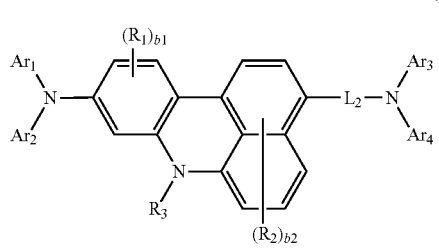
<Formula 1C>

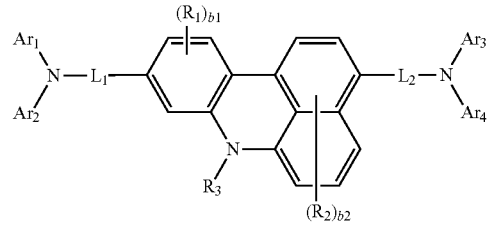
<Formula 1D> wherein $L_1$ and $L_2$ are each independently represented by one of Formulae 2-1 to 2-28, below, $Ar_1$ to $Ar_4$ are each independently represented by one of Formulae 5-1 to 5-14, below, $R_1$ and $R_2$ are each independently a hydrogen atom, a deuterium atom, a halogen atom, a hydroxyl group, a cyano group, a nitro group, an amino group, an amidino group, a hydrazine group, a hydrazone group, a carboxylic acid group or a salt thereof, a sulfonic acid or a salt thereof, a phosphoric acid or a salt thereof, a $C_1$-$C_{20}$ alkyl group, a phenyl group, a naphthyl group, or an anthracenyl group;

$R_3$ is selected from:

a $C_1$-$C_{20}$ alkyl group or a $C_1$-$C_{20}$ alkoxy group;

a $C_1$-$C_{20}$ alkyl group or a $C_1$-$C_{20}$ alkoxy group, each substituted with at least one of a deuterium atom, a halogen atom, a hydroxyl group, a cyano group, a nitro group, an amino group, an amidino group, a hydrazine group, a hydrazone group, a carboxylic acid group or a salt thereof, a sulfonic acid or a salt thereof, or a phosphoric acid or a salt thereof;

a phenyl group, a naphthyl group, an anthracenyl group, a fluorenyl group, a pyridinyl group, a pyrimidinyl group, a quinolinyl group, an isoquinolinyl group, or a triazinyl group; or a phenyl group, a naphthyl group, an anthracenyl group, a fluorenyl group, a pyridinyl group, a pyrimidinyl group, a quinolinyl group, an isoquinolinyl group, or a triazinyl group, each substituted with at least one of a deuterium atom, a halogen atom, a hydroxyl group, a cyano group, a nitro group, an amino group, an amidino group, a hydrazine group, a hydrazone group, a carboxylic acid group or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an anthracenyl group, a fluorenyl group, a pyridinyl group, a pyrimidinyl group, a quinolinyl group, an isoquinolinyl group, or a triazinyl group;

b1 and b2 are each independently an integer of 1 or 2:

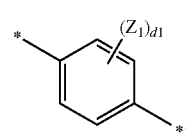
Formula 2-1

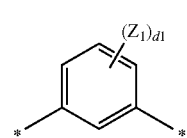
Formula 2-2

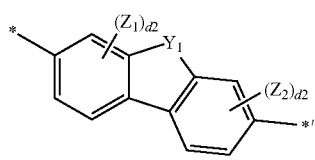
Formula 2-3
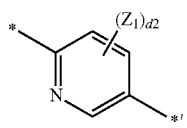
Formula 2-11
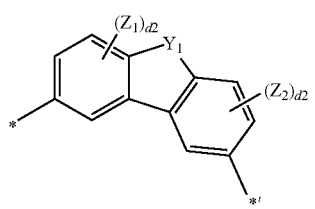
Formula 2-4
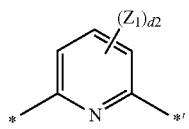
Formula 2-12
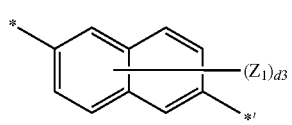
Formula 2-5
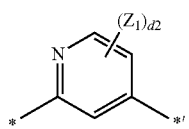
Formula 2-13
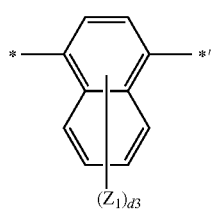
Formula 2-6
Formula 2-14
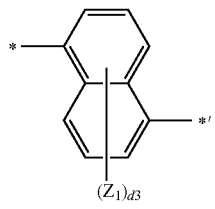
Formula 2-7
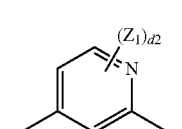
Formula 2-15
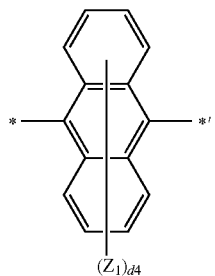
Formula 2-8
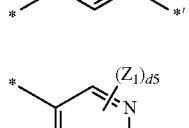
Formula 2-16
Formula 2-17
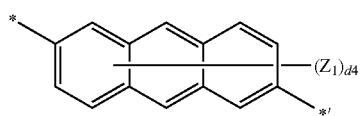
Formula 2-9
Formula 2-18
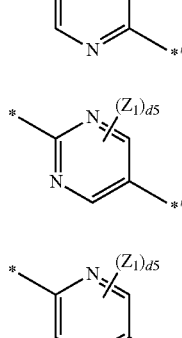
Formula 2-19
Formula 2-20
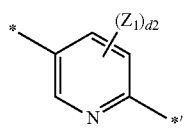
Formula 2-10
Formula 2-21

-continued

Formula 2-22

Formula 2-23

Formula 2-24

Formula 2-25

Formula 2-26

Formula 2-27

Formula 2-28

Formula 5-1

Formula 5-2

Formula 5-3

Formula 5-4

Formula 5-5

Formula 5-6

Formula 5-7

Formula 5-8

Formula 5-9

Formula 5-10

Formula 5-11 wherein $Y_1$ is O, S, $C(Z_3)(Z_4)$, $N(Z_5)$, or $Si(Z_6)(Z_7)$;

$Z_1$ to $Z_7$ are each independently one of a hydrogen atom, a deuterium atom, a halogen atom, a hydroxyl group, a cyano group, a nitro group, an amino group, an amidino group, a hydrazine group, a hydrazone group, a carboxylic acid group or a salt thereof, a sulfonic acid or a salt thereof, a phosphoric acid or a salt thereof, a methyl group, an ethyl group, a propyl group, a butyl group, a pentyl group, a hexyl group, a heptyl group, or an octyl group;

d1 is an integer of 1 to 4;
d2 is an integer of 1 to 3;
d3 is an integer of 1 to 6;
d4 is an integer of 1 to 8;
d5 is an integer of 1 or 2;
d6 is an integer of 1 to 5;
* and *' are each independently a binding site with a neighboring atom:

-continued

Formula 5-12

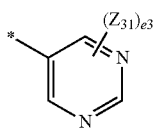

Formula 5-13

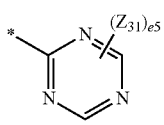

Formula 5-14

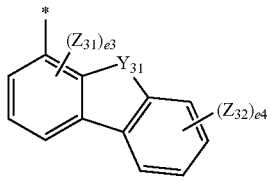

wherein $Y_{31}$ is O, S, $C(Z_{33})(Z_{34})$, or $N(Z_{35})$;
$Z_{31}$ to $Z_{35}$ are each independently:
a hydrogen atom, a deuterium atom, a halogen atom, a hydroxyl group, a cyano group, a nitro group, an amino group, an amidino group, a hydrazine group, a hydrazone group, a carboxylic acid group or a salt thereof, a sulfonic acid or a salt thereof, a phosphoric acid or a salt thereof, a methyl group, an ethyl group, a propyl group, a butyl group, a pentyl group, a hexyl group, a heptyl group, an octyl group, a methoxy group, an ethoxy group, a propoxy group, a butoxy group, or a pentoxy group;
a methyl group, an ethyl group, a propyl group, a butyl group, a pentyl group, a hexyl group, a heptyl group, an octyl group, a methoxy group, an ethoxy group, a propoxy group, a butoxy group, or a pentoxy group, each substituted with at least one of a deuterium atom, a halogen atom, a hydroxyl group, a cyano group, a nitro group, an amino group, an amidino group, a hydrazine group, a hydrazone group, a carboxylic acid group or a salt thereof, a sulfonic acid or a salt thereof, or a phosphoric acid or a salt thereof,
a phenyl group, a naphthyl group, an anthracenyl group, a phenanthrenyl group, a pyridinyl group, a pyrimidinyl group, a pyrazinyl group, a triazinyl group, a quinolinyl group, or an isoquinolinyl group; or
$Si(Q_{11})(Q_{12})(Q_{13})$, wherein $Q_{11}$ to $Q_{13}$ are each independently a $C_1$-$C_{20}$ alkyl group, a phenyl group, a naphthyl group, or an anthracenyl group;
e1 is an integer of 1 to 5;
e2 is an integer of 1 to 7;
e3 is an integer of 1 to 3;
e4 is an integer of 1 to 4;
e5 is an integer of 1 or 2;
* is a binding site with a neighboring atom.

15. The condensed-cyclic compound as claimed in claim 1, wherein the compound represented by Formula 1 is represented by one of the following Compounds 1 to 60:

1

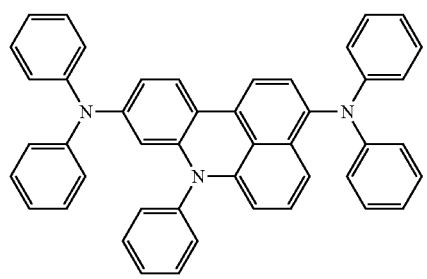

2

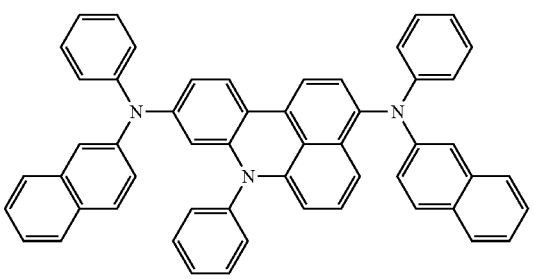

3

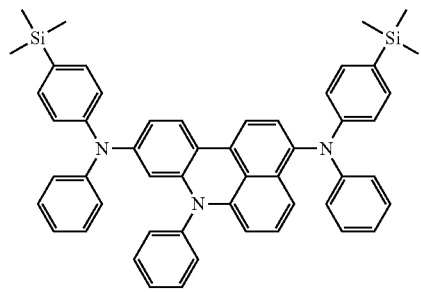

4

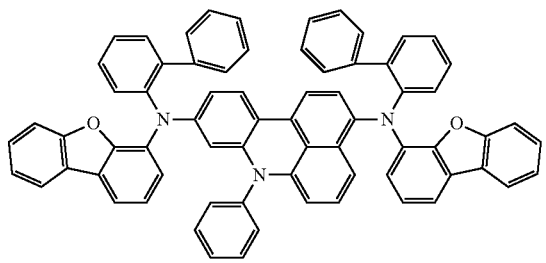

5

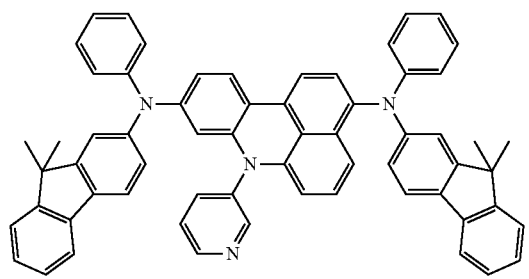

6

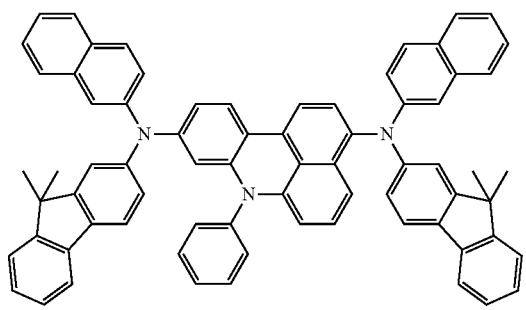

7
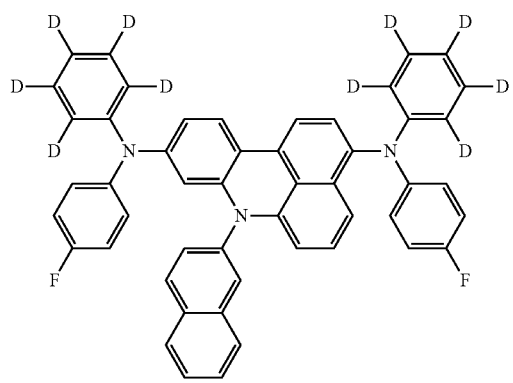
8
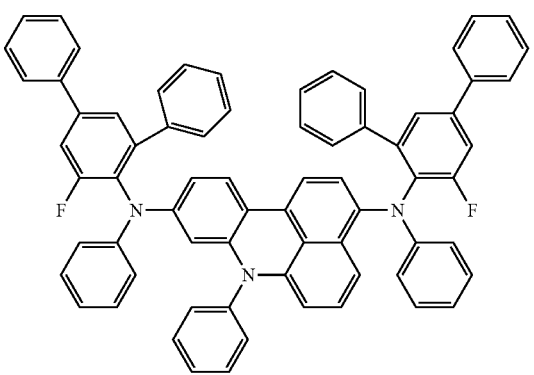
9
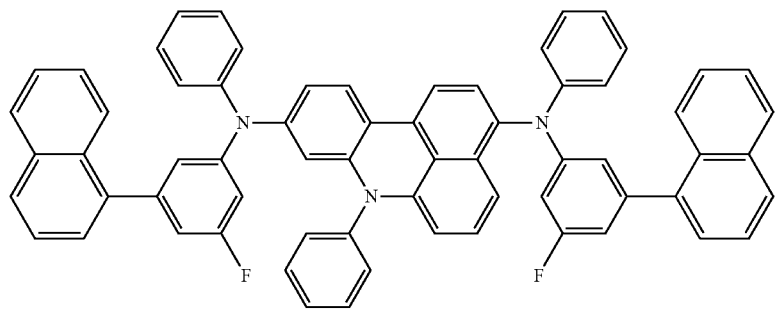
10
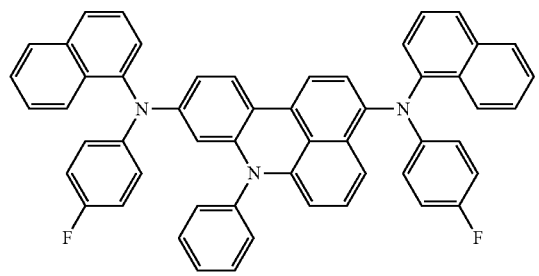
11
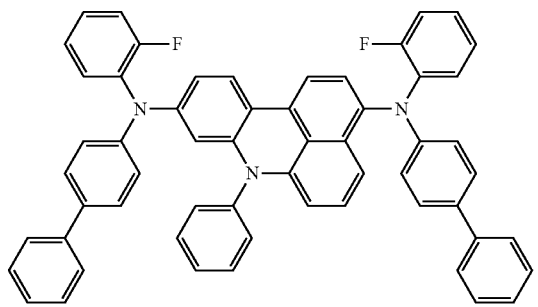
12
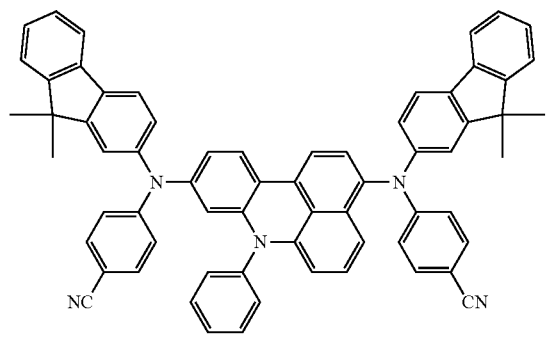
13
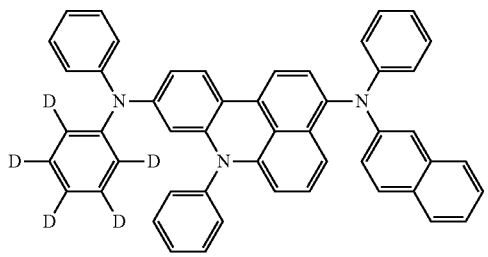

-continued
14
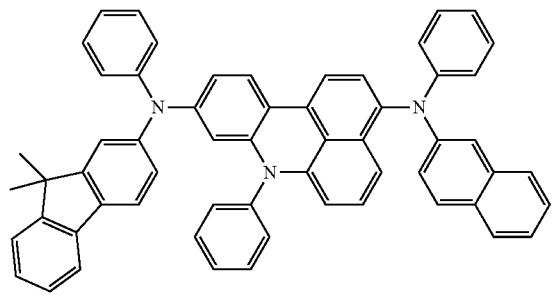
15
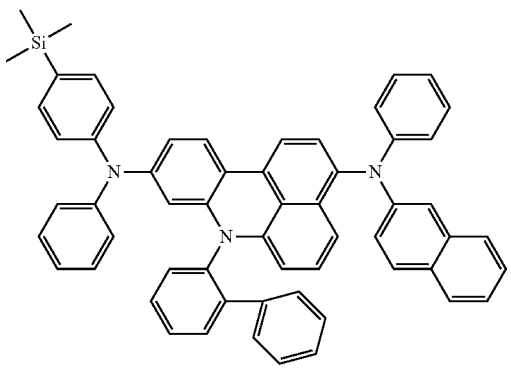
16
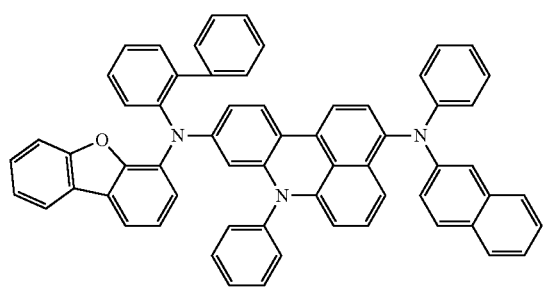
17
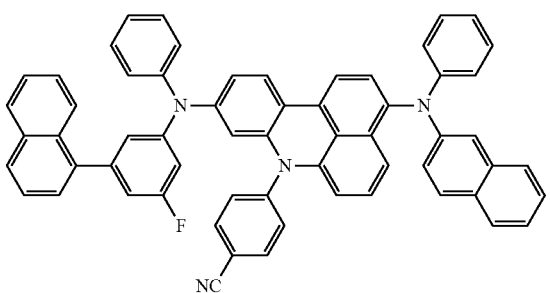
18
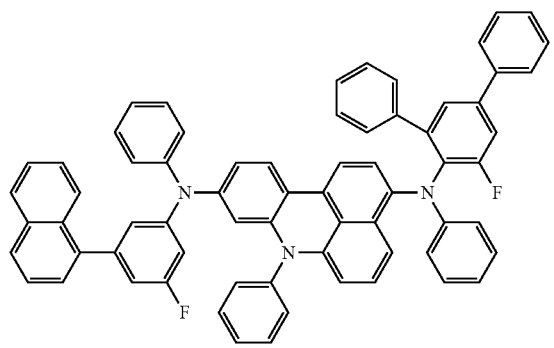
19
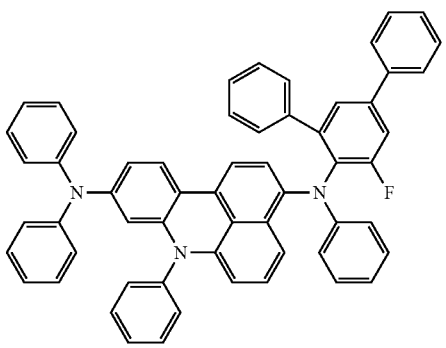
20
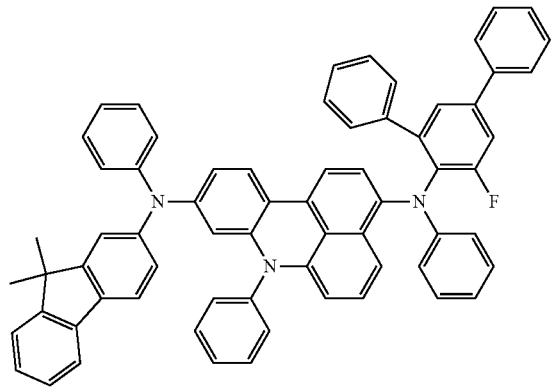
21
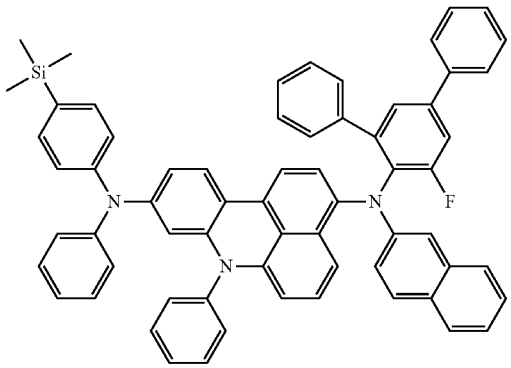

-continued
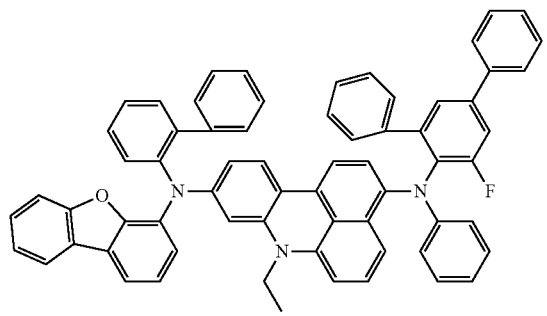
22
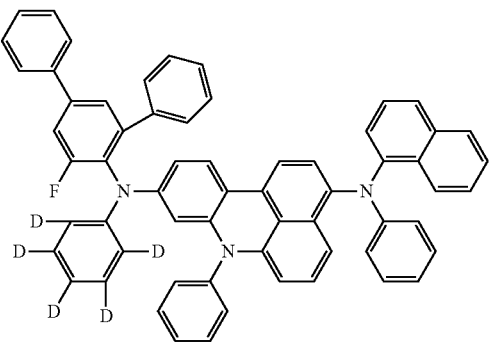
23
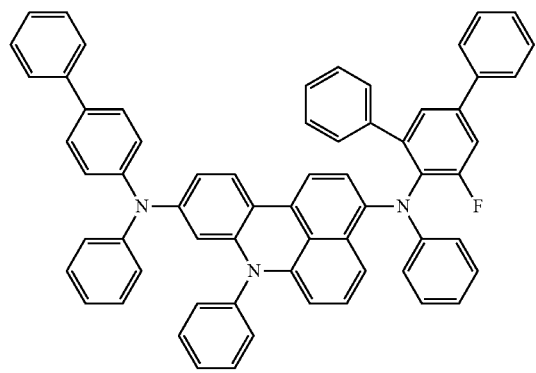
24
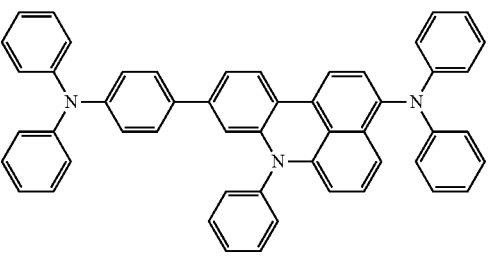
25
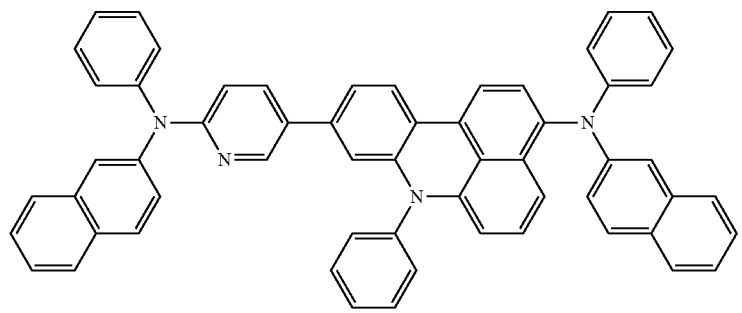
26
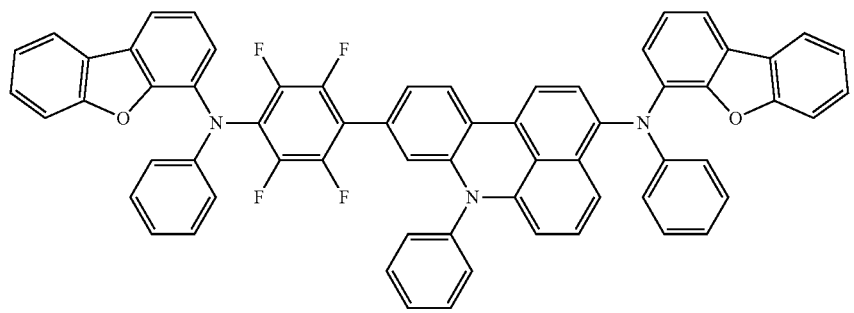
27

-continued
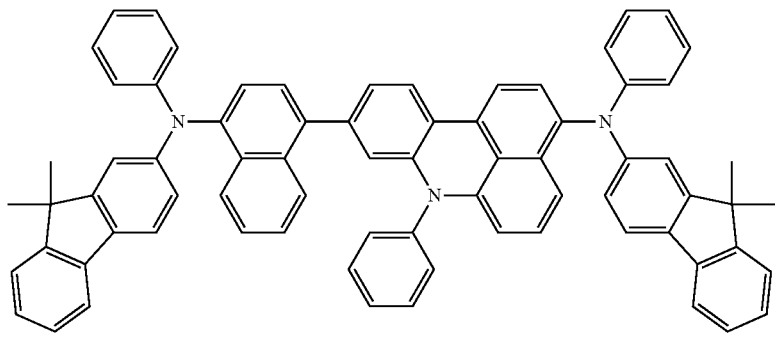
28
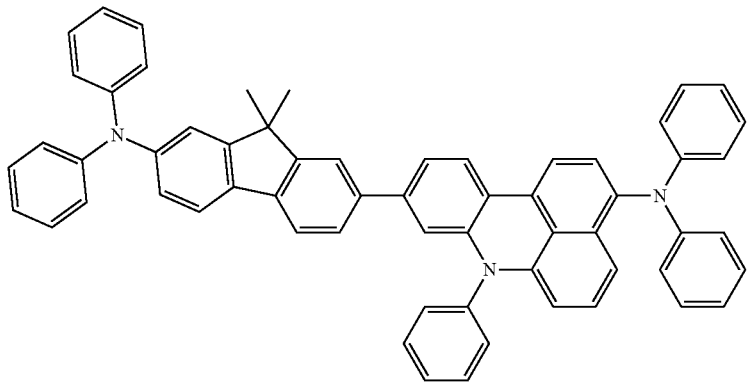
29
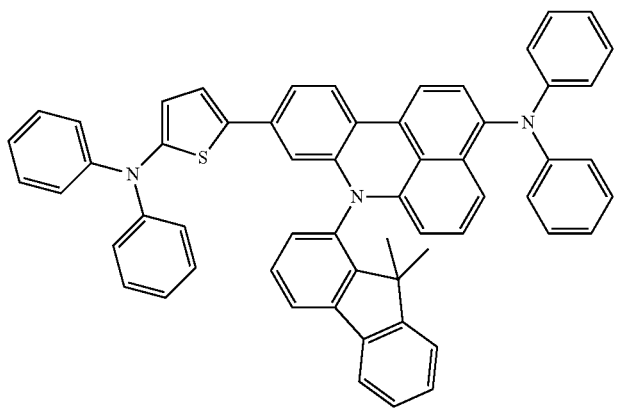
30
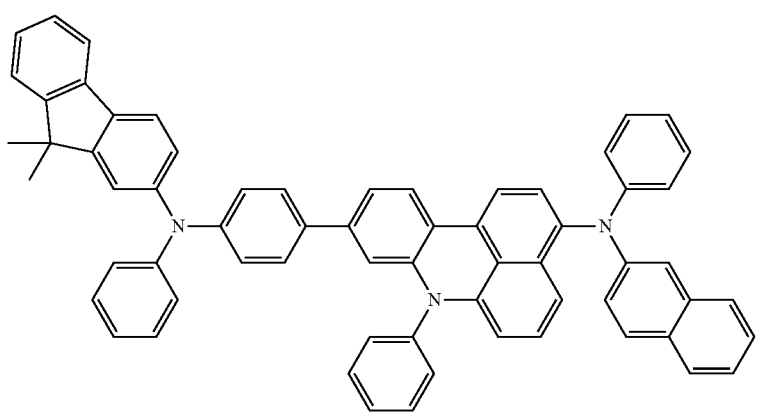
31

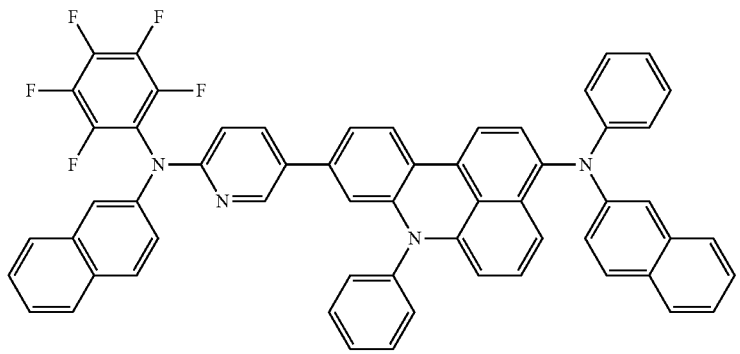
32
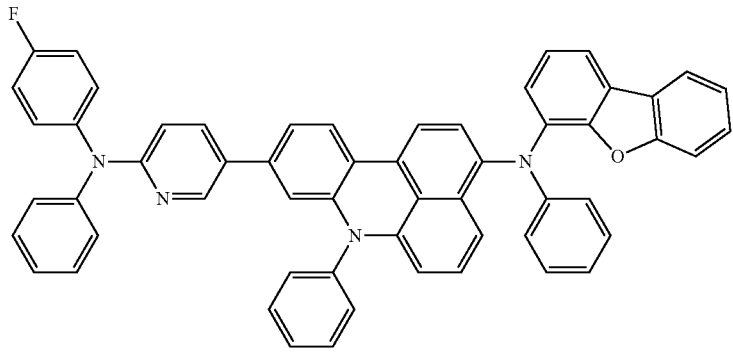
33
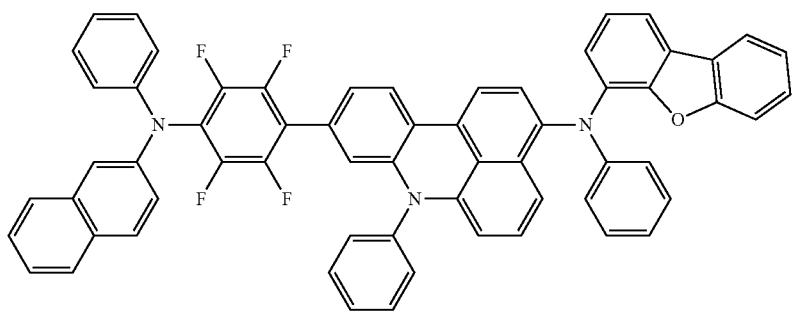
34
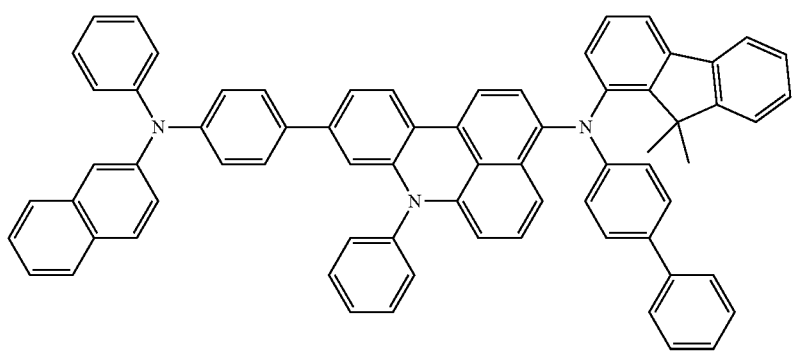
35

-continued
36
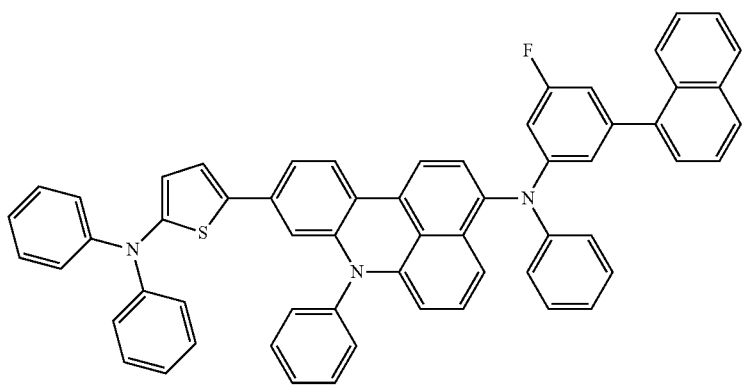
37
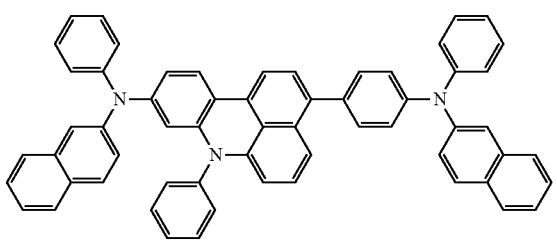
38
39
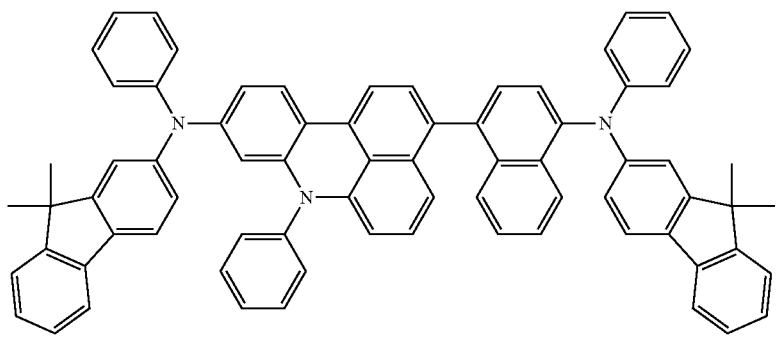
40
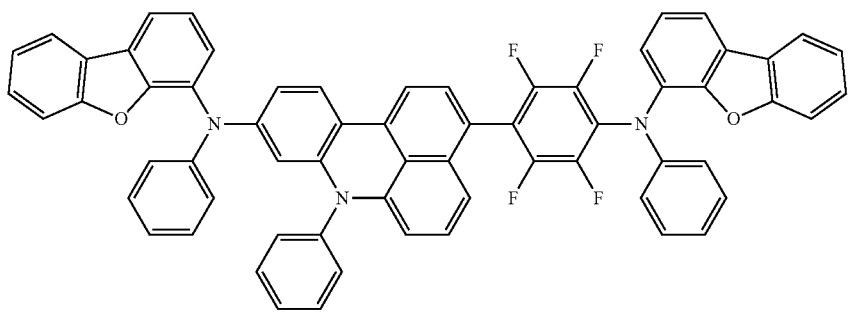
41
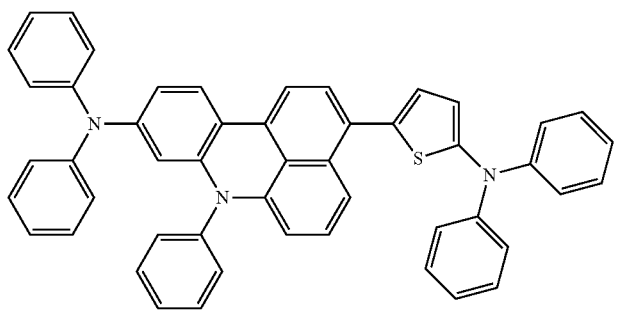

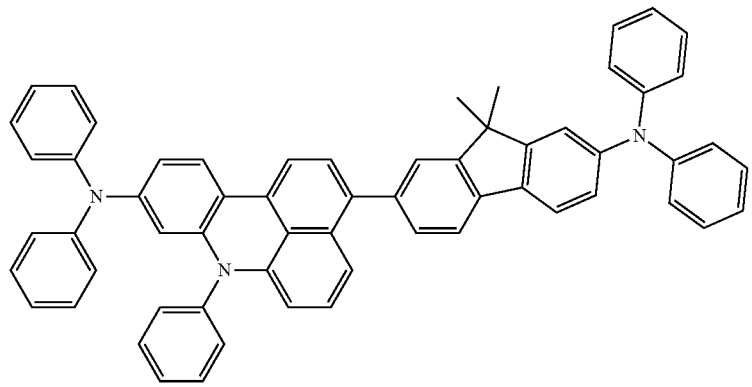
42
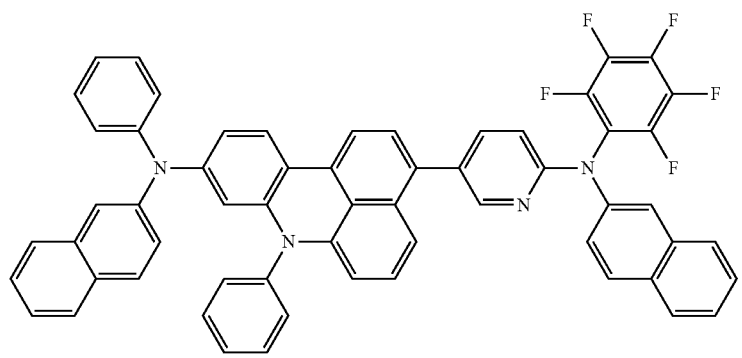
43
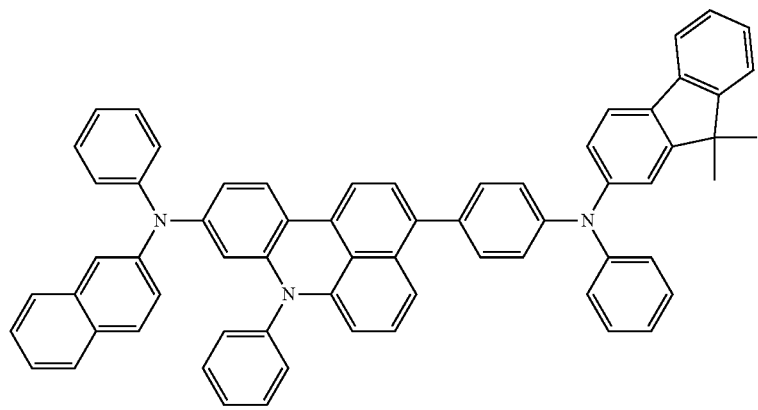
44
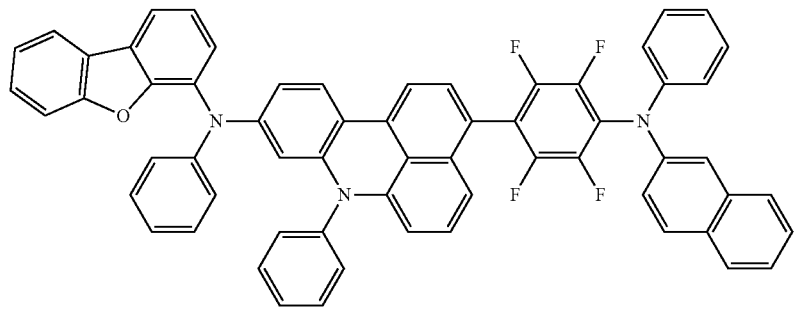
45

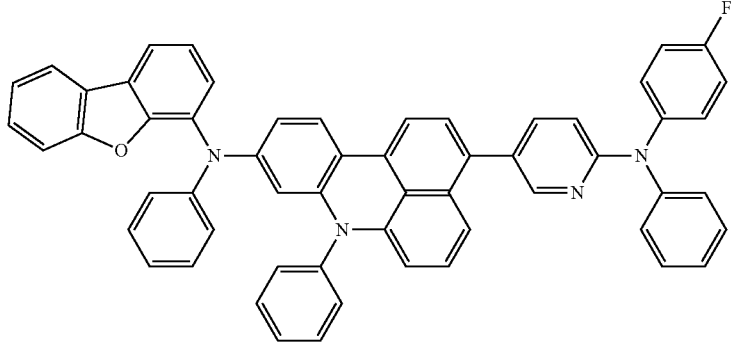
46
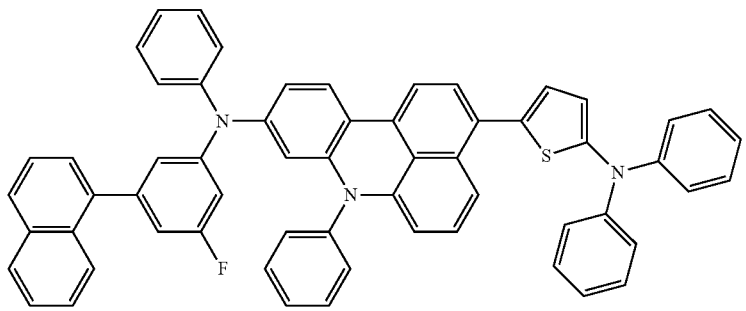
47
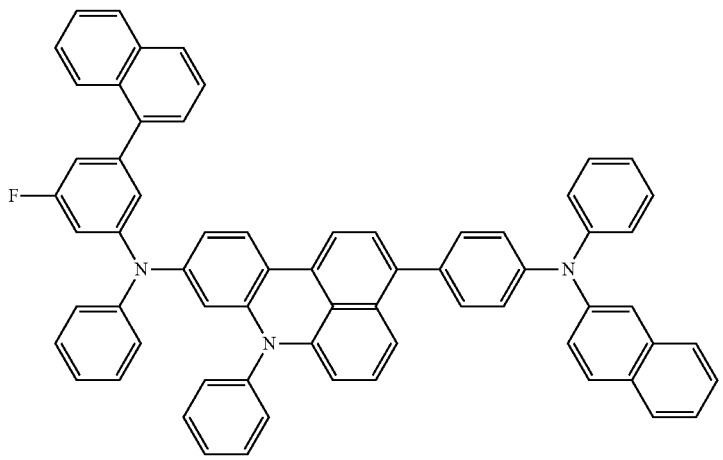
48
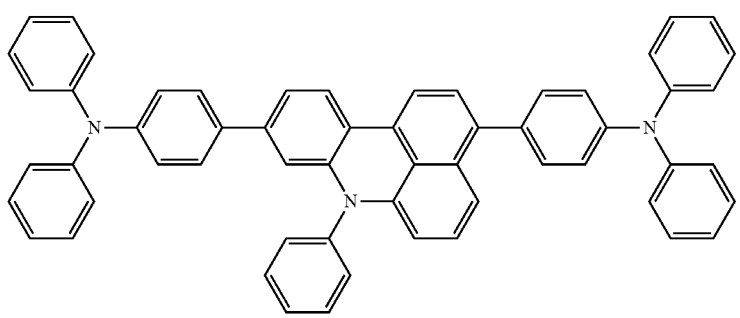
49

-continued
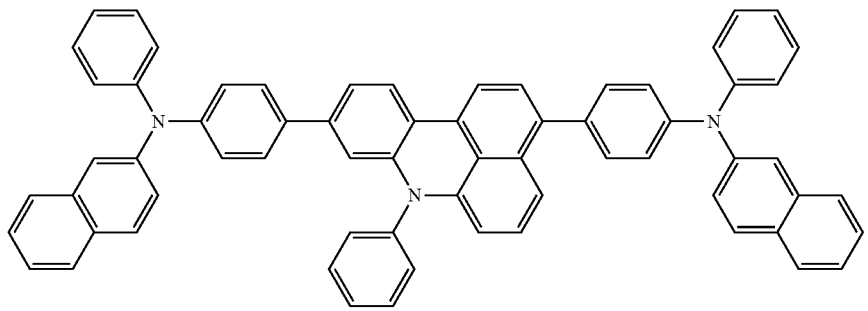
50
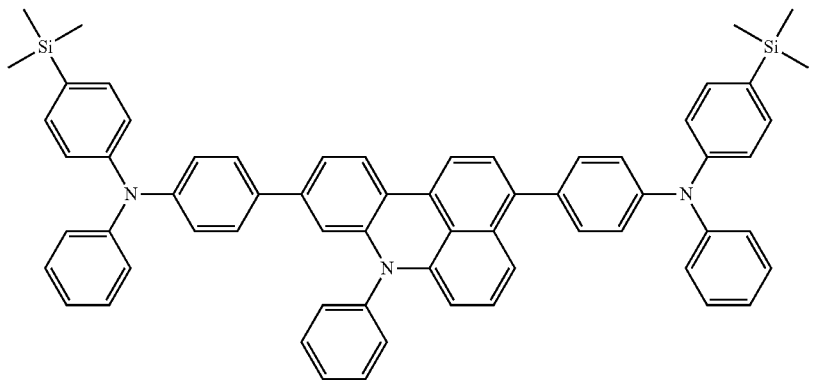
51
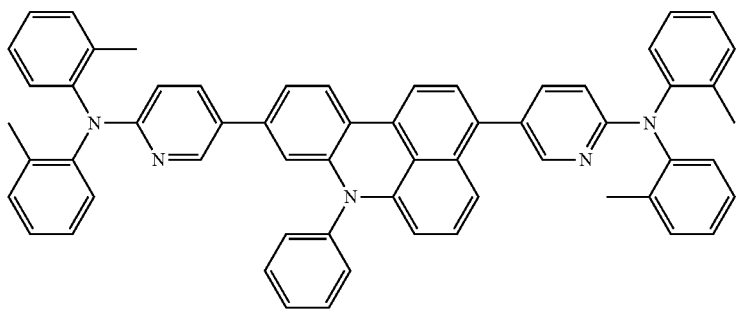
52
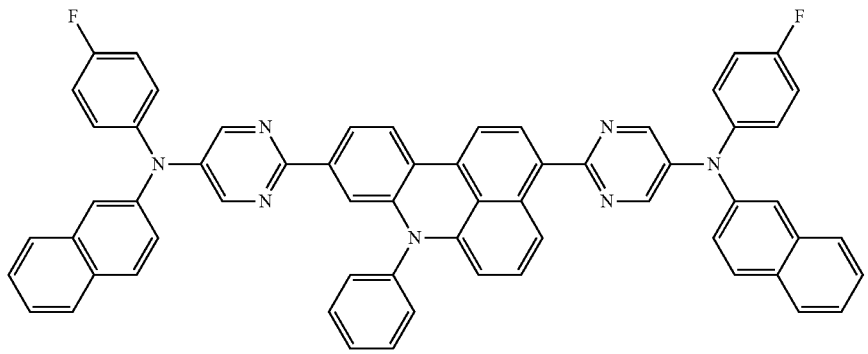
53
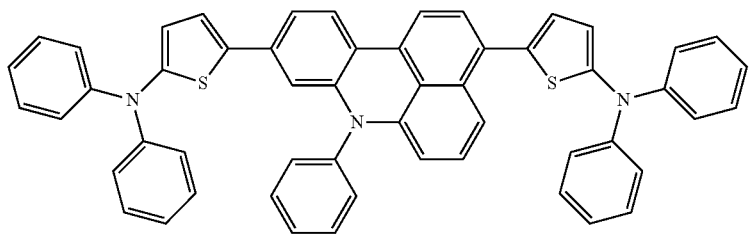
54

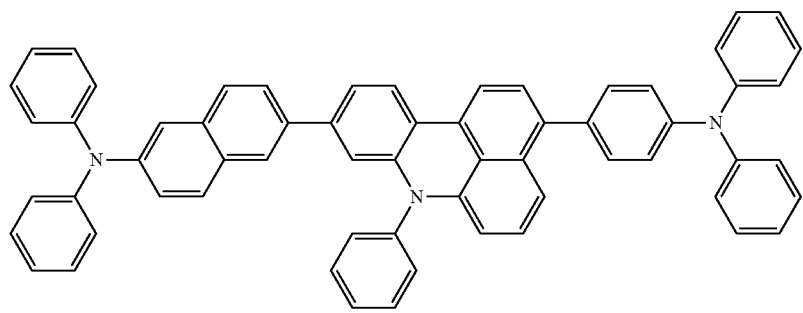
55
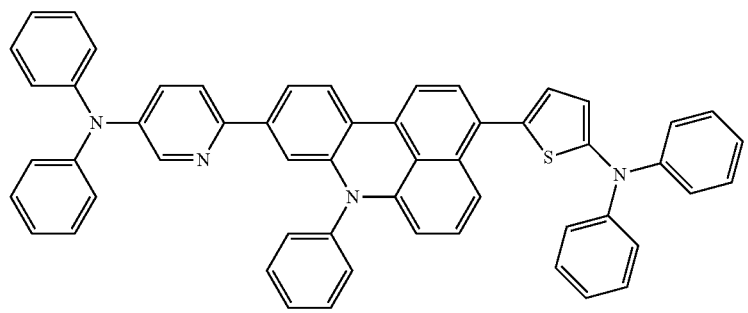
56
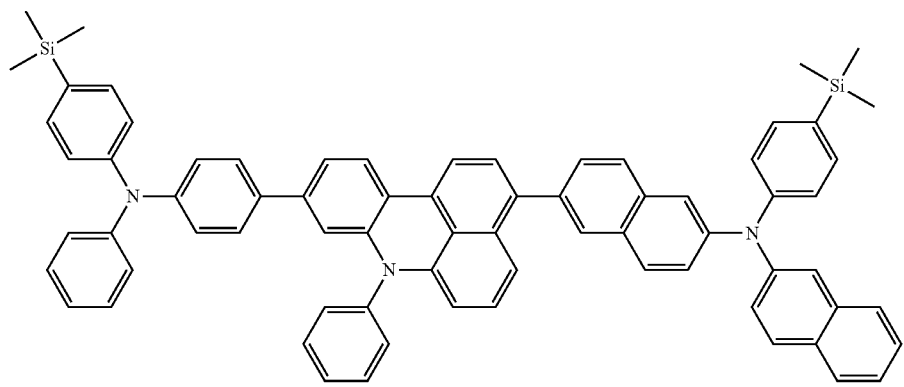
57
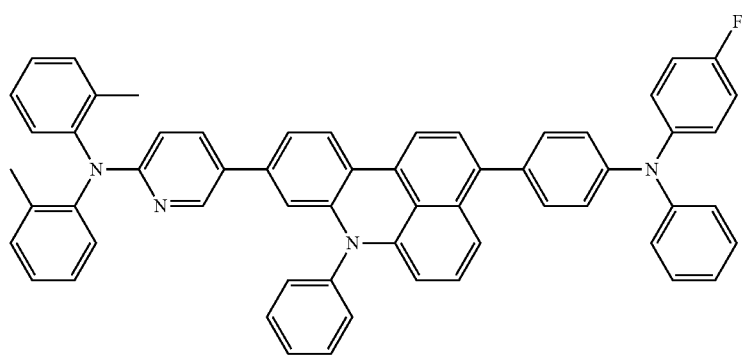
58

-continued

59

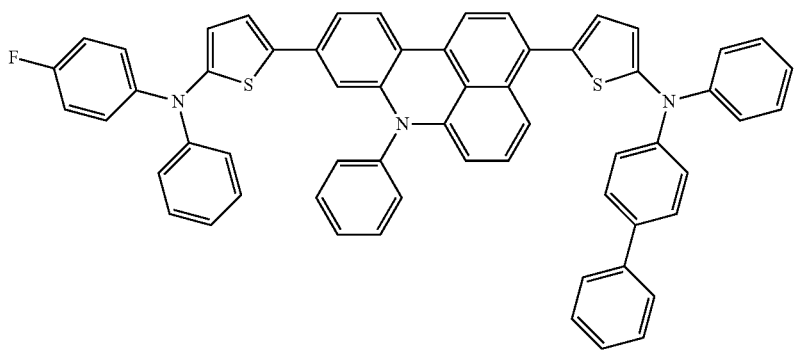

60

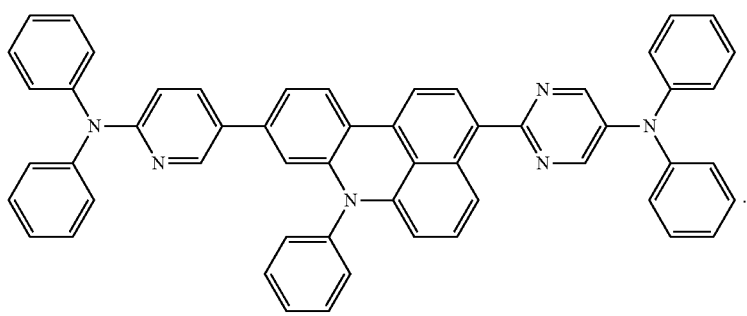

16. An organic light-emitting device, comprising:
   a first electrode;
   a second electrode facing the first electrode; and
   an organic layer that between the first electrode and the second electrode, the organic layer including an emission layer,
   wherein the organic layer further includes:
      a hole transporting region between the first electrode and the emission layer, and
      an electron transporting region between the emission layer and the second electrode, and
   wherein the organic layer includes the compound as claimed in claim 1.

17. The organic light-emitting device as claimed in claim 16, wherein:
   the hole transporting region includes at least one of a hole injection layer, a hole transport layer, a functional layer having both hole injecting and hole transporting capabilities, a buffer layer, or an electron blocking layer, and
   the electron transporting region includes at least one of a hole blocking layer, an electron transport layer, or an electron injection layer.

18. The organic light-emitting device as claimed in claim 16, wherein:
   the condensed-cyclic compound is in the emission layer,
   the condensed-cyclic compound in the emission layer is a dopant, and
   the emission layer further includes a host.

19. The organic light-emitting device as claimed in claim 16, wherein the condensed-cyclic compound is in the hole transporting region.

20. The organic light-emitting device as claimed in claim 16, wherein the hole transporting region includes at least one of a compound represented by Formula 300 or a compound represented by Formula 301:

<Formula 300>

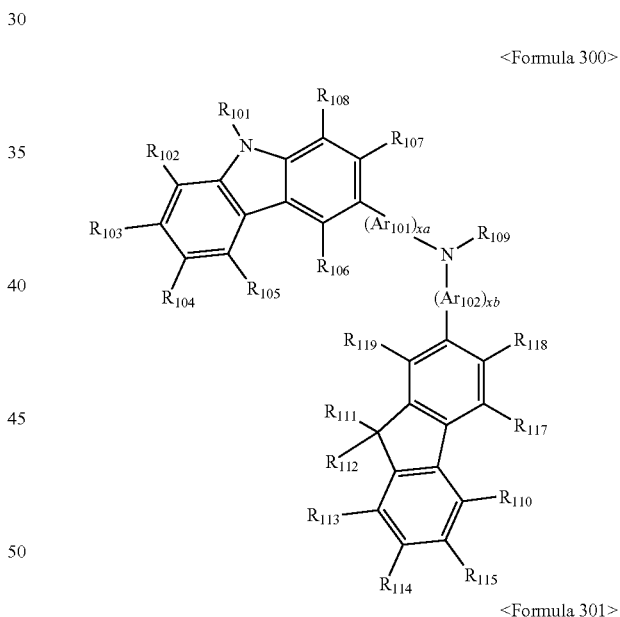

<Formula 301>

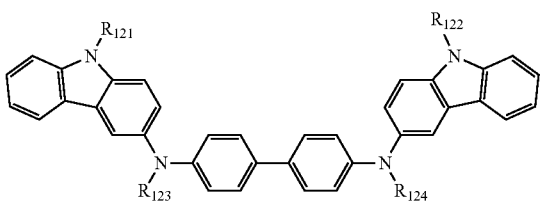

wherein $Ar_{101}$ and $Ar_{102}$ are each independently:
a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group; or a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group, each substituted with at least one of a deuterium atom, a halogen atom, a hydroxyl group, a cyano group, a nitro group, an amino group, an amidino group, a hydrazine group, a hydrazone group, a carboxylic acid group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, or a $C_2$-$C_{60}$ heteroaryl group;

wherein xa and xb are each independently an integer of 0, 1, or 2;

wherein $R_{101}$ to $R_{108}$, $R_{111}$ to $R_{119}$, and $R_{121}$ to $R_{124}$ are each independently:

a hydrogen atom, a deuterium atom, a halogen atom, a hydroxyl group, a cyano group, a nitro group, an amino group, an amidino group, a hydrazine group, a hydrazone group, a carboxylic acid group or a salt thereof, a sulfonic acid or a salt thereof, a phosphoric acid or a salt thereof, a $C_1$-$C_{10}$ alkyl group, or a $C_1$-$C_{10}$ alkoxy group;

a $C_1$-$C_{10}$ alkyl group or a $C_1$-$C_{10}$ alkoxy group, each substituted with at least one of deuterium atom, a halogen atom, a hydroxyl group, a cyano group, a nitro group, an amino group, an amidino group, a hydrazine group, a hydrazone group, a carboxylic acid group or a salt thereof, a sulfonic acid or a salt thereof, or a phosphoric acid or a salt thereof;

a phenyl group, a naphthyl group, an anthracenyl group, a fluorenyl group, and a pyrenyl group; or a phenyl group, a naphthyl group, an anthracenyl group, a fluorenyl group, or a pyrenyl group, each substituted with at least one of a deuterium atom, a halogen atom, a hydroxyl group, a cyano group, a nitro group, an amino group, an amidino group, a hydrazine group, a hydrazone group, a carboxylic acid group or a salt thereof, a sulfonic acid or a salt thereof, a phosphoric acid or a salt thereof, a $C_1$-$C_{10}$ alkyl group, or a $C_1$-$C_{10}$ alkoxy group;

wherein $R_{109}$ is:

a phenyl group, a naphthyl group, an anthracenyl group, a biphenyl group, or a pyridyl group; or a phenyl group, a naphthyl group, an anthracenyl group, a biphenyl group, or a pyridyl group, each substituted with at least one of a deuterium atom, a halogen atom, a hydroxyl group, a cyano group, a nitro group, an amino group, an amidino group, a hydrazine group, a hydrazone group, a carboxylic acid group or a salt thereof, a sulfonic acid or a salt thereof, a phosphoric acid or a salt thereof, a C1-C20 alkyl group, or a C1-C20 alkoxy group.

* * * * *